(12) United States Patent
Nishi et al.

(10) Patent No.: US 6,597,430 B1
(45) Date of Patent: Jul. 22, 2003

(54) EXPOSURE METHOD, ILLUMINATING DEVICE, AND EXPOSURE SYSTEM

(75) Inventors: Kenji Nishi, Yokohama (JP); Osamu Tanitsu, Kumagaya (JP); Kyoji Nakamura, Samukawa (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/979,042

(22) PCT Filed: Mar. 17, 2000

(86) PCT No.: PCT/JP00/01642

§ 371 (c)(1),
(2), (4) Date: Dec. 31, 2001

(87) PCT Pub. No.: WO00/70660

PCT Pub. Date: Nov. 23, 2000

(30) Foreign Application Priority Data

May 18, 1998 (JP) .......................................... 11-137840
Nov. 15, 1999 (JP) .......................................... 11-324748
Dec. 16, 1999 (JP) .......................................... 11-358204

(51) Int. Cl.[7] .......................... G03B 27/42; G03B 27/54
(52) U.S. Cl. .......................................... 355/53; 355/67
(58) Field of Search .............................. 355/53, 67, 70, 355/71

(56) References Cited

U.S. PATENT DOCUMENTS

| | | | | |
|---|---|---|---|---|
| 3,913,872 A | * | 10/1975 | Weber | ......................... 362/554 |
| 4,023,903 A | * | 5/1977 | Scheib | ......................... 355/71 |
| 5,048,926 A | | 9/1991 | Tanimoto | |
| 5,636,003 A | | 6/1997 | Tanitsu et al. | |
| 5,852,693 A | | 12/1998 | Jeong | |
| RE37,309 E | | 8/2001 | Nakashima et al. | ........... 355/53 |
| 6,389,045 B1 | * | 5/2002 | Mann et al. | ................... 372/25 |

FOREIGN PATENT DOCUMENTS

| JP | A 63-73221 | 4/1988 |
|---|---|---|
| JP | A 1-198759 | 8/1989 |
| JP | A 1-220825 | 9/1989 |
| JP | A 3-295222 | 12/1991 |
| JP | A 6-196389 | 7/1994 |
| JP | A 9-180993 | 7/1997 |

* cited by examiner

Primary Examiner—Rodney Fuller
(74) Attorney, Agent, or Firm—Oliff & Berridge, PLC

(57) ABSTRACT

An exposure method is provided, in which a speckle pattern (interference fringe) formed on a pattern of a transfer objective can be reduced without complicating an illumination optical system so much, without increasing the size of the illumination optical system so much, and without prolonging the exposure time, even when an exposure light beam having high coherence is used. A laser beam (LB) as an exposure light beam from an exposure light source (9) is introduced into a ring-shaped delay optical system (22), for example, via a modified illumination mechanism (19) and a light-collecting lens (21). A plurality of light fluxes, which have passed through the interior of the delay optical system (22) a variety of numbers of times depending on angular apertures in accordance with internal reflection, are superimposed and extracted as a laser beam (LB3). The laser beam (LB3) illuminates a reticle (R), for example, via a fly's eye lens (25) and a condenser lens (7).

38 Claims, 17 Drawing Sheets

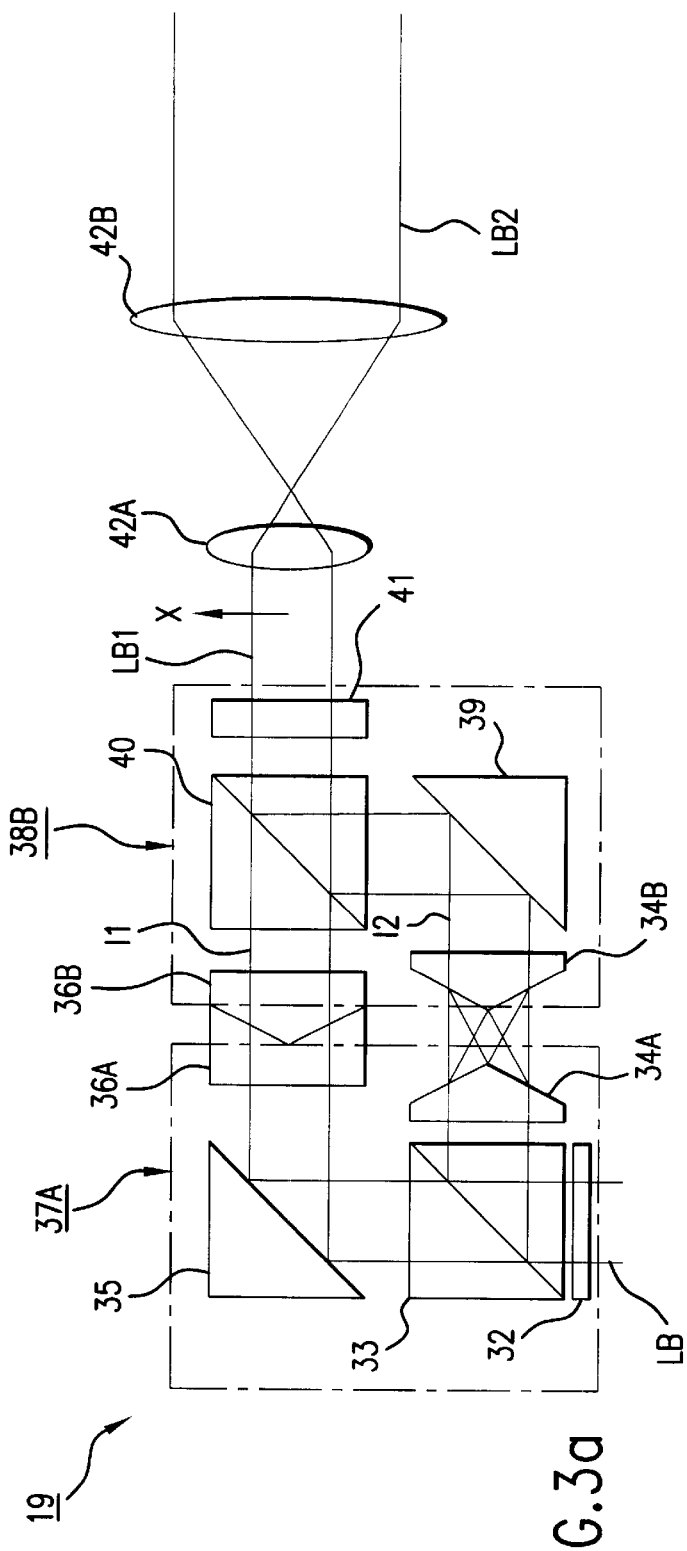
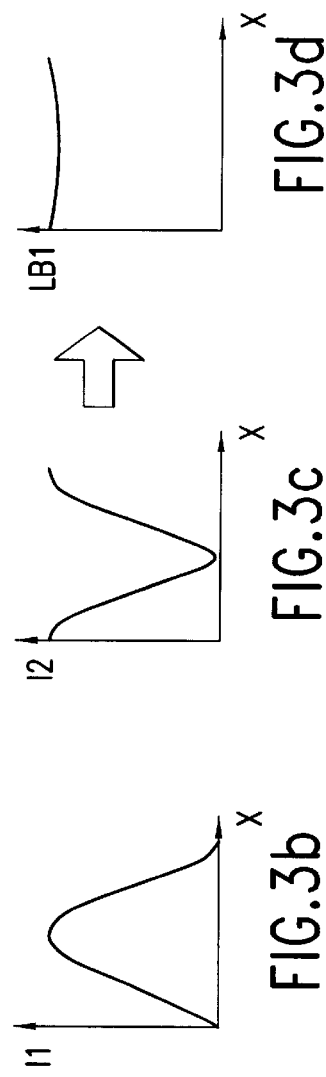

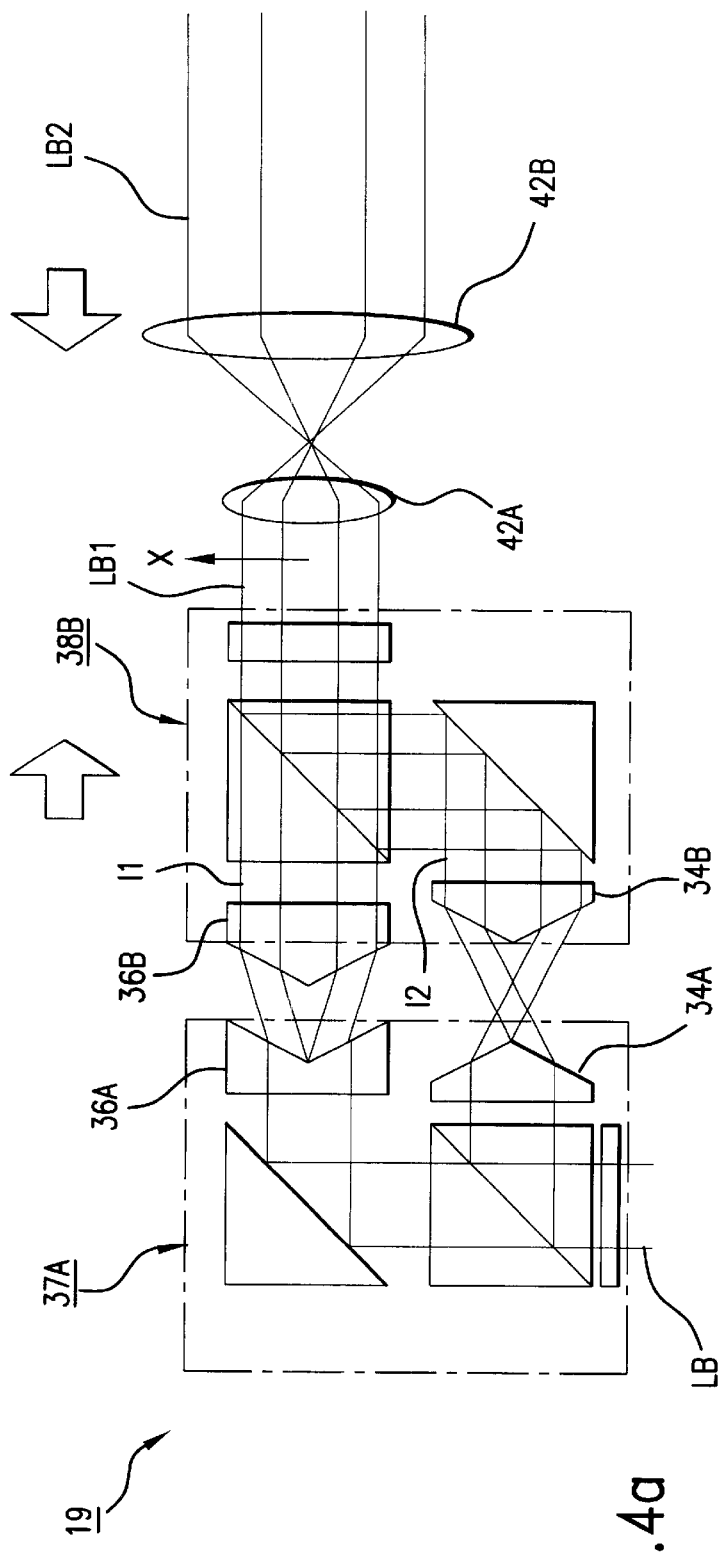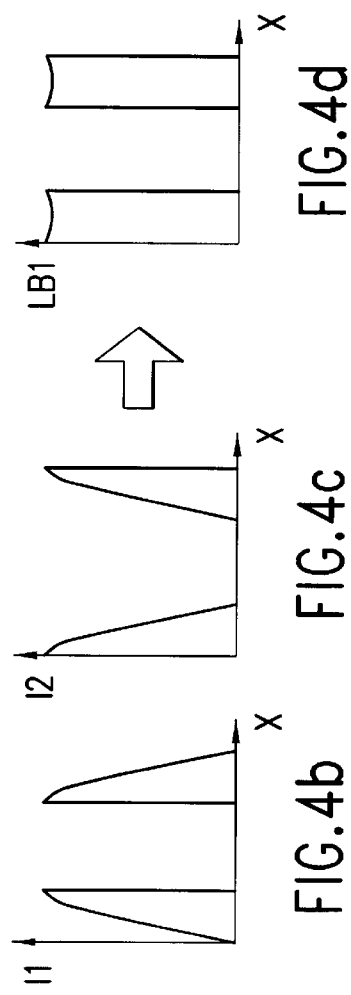
FIG.4a
FIG.4b
FIG.4c
FIG.4d

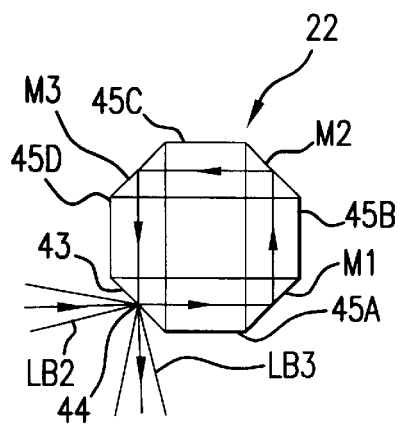
FIG.6a
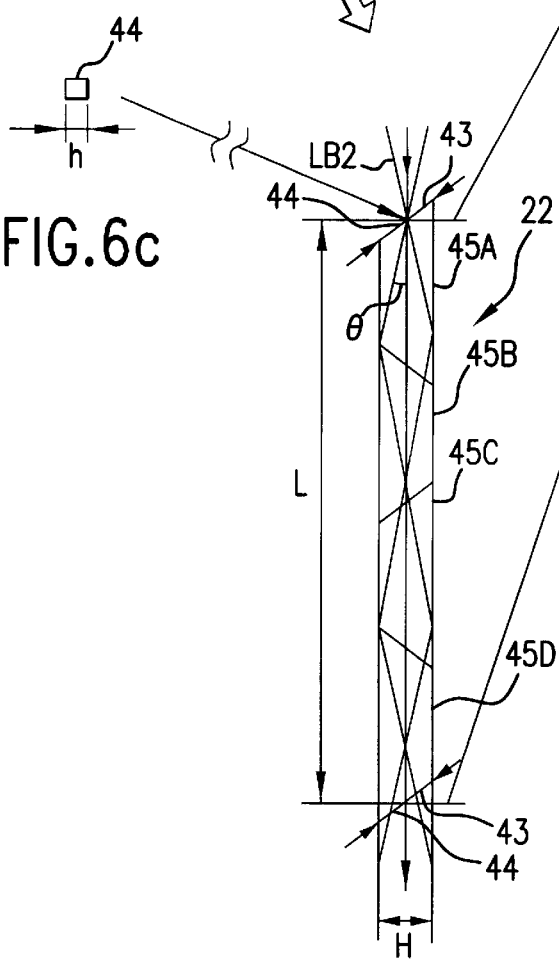
FIG.6c
FIG.6b
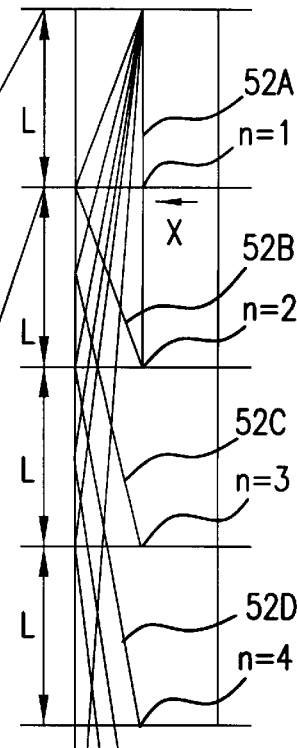
FIG.6d

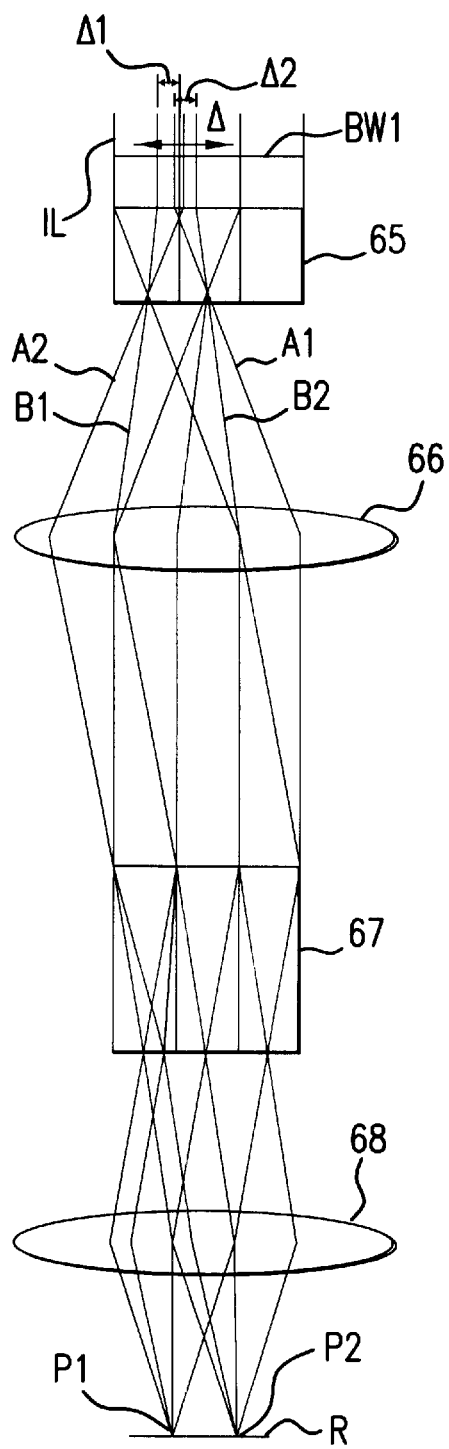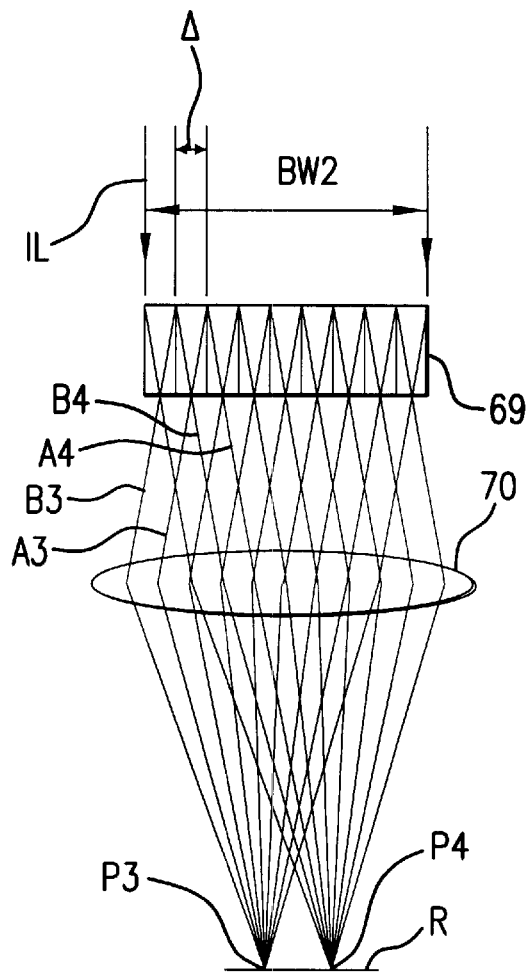
FIG.17a PRIOR ART
FIG.17b PRIOR ART

EXPOSURE METHOD, ILLUMINATING DEVICE, AND EXPOSURE SYSTEM

TECHNICAL FIELD

The present invention relates to an exposure method to be used when a mask pattern is transferred onto a substrate such as a wafer in a lithography step for producing a device which includes, for example, a semiconductor element, a liquid crystal display element, a plasma display, and a thin film magnetic head. In particular, the present invention is suitable for an exposure apparatus based on the use of an illuminating apparatus which is provided with an optical system for realizing a uniform illuminance distribution on an illumination objective.

BACKGROUND ART

A variety of exposure apparatuses are known, including, for example, projection exposure apparatuses of the full-field exposure type or the scanning exposure type (for example, based on the step-and-scan system), and exposure apparatuses based on the proximity system to be used, for example, when semiconductor elements are produced. Such an exposure apparatus is provided with an illumination optical system for illuminating a pattern on a reticle with a uniform illuminance distribution by using an illumination light beam (exposure light beam) for exposure in order that the minute pattern on the reticle as a mask is highly accurately transferred onto a wafer (or a glass plate or the like) applied with resist, as a substrate.

An optical integrator such as a fly's eye lens has been hitherto used as an optical member for uniformizing the illuminance distribution. An illumination optical system, which is provided with two-stage fly's eye lenses (double fly's eyes) in order to enhance the uniformity of the illuminance distribution, is disclosed, for example, in Japanese Patent Application Laid-Open No. 6-196389 and U.S. Pat. No. 5,636,003 corresponding thereto.

FIG. 17(a) shows main components of a conventional illumination optical system provided with two-stage fly's eye lenses. With reference to FIG. 17(a), an illumination light beam IL having a width BW1, which is radiated from an unillustrated exposure light source, comes into a first fly's eye lens 65. Illumination light beams, which come from a plurality of light source images formed on a light-outgoing plane of the first fly's eye lens 65, come into a second fly's eye lens 67 via a light-collecting lens system 66. An illumination light beam, which comes from the second fly's eye lens 67, illuminates a reticle R via a condenser lens system 68.

On the other hand, FIG. 17(b) shows main components of a conventional illumination optical system which has a one-stage fly's eye lens (single fly's eye). With reference to FIG. 17(b), an illumination light beam IL, which has a width BW2, comes into a fly's eye lens 69. Illumination light beams, which come from respective light source images formed on light-outgoing planes of respective lens elements of the fly's eye lens 69, illuminate a reticle R in a superimposed manner via a condenser lens system 70.

In the case of the double fly's eye system of the former, the number of the light source images formed in a predetermined direction on the light-outgoing plane of the fly's eye lens 67 is represented by N1·N2 provided that N1 and N2 represent the numbers of arrangement of lens elements of the fly's eye lenses 65, 67 in the predetermined direction. On the other hand, in the case of the single fly's eye system of the latter, it is necessary that the fly's eye lens 69 is subdivided so that the number of arrangement of the fly's eye lens 69 is about N1·N2 in a predetermined direction in order to obtain the same degree of the uniformity of the illuminance distribution as that of the double fly's eye system in the predetermined direction.

The exposure light beam has a narrow wavelength width, and it has relatively high coherence (coherency). Therefore, if the exposure light beam is used as it is, then interference fringes which are called speckles are generated on the illumination area of the reticle, and it is feared that any unevenness of the exposure amount is caused thereby. In view of this fact, in order to reduce the temporal coherence of the exposure light beam (or shorten the coherence time) and reduce the interference fringes, Japanese Patent Publication No. 7-104500 (Japanese Patent No. 2071956) discloses a delay optical system in which the exposure light beam is divided into two by using a beam splitter, and two-divided light fluxes are superimposed again after giving a predetermined difference in optical path to them. On the other hand, Japanese Patent No. 2590510 discloses an exposure apparatus in which the temporal coherence is reduced by radiating an exposure light beam onto a beam splitter surface of a delay optical system having a polygonal cross section in which one surface is the beam splitter surface and the remaining surfaces are reflecting surfaces (or total reflection surfaces).

As described above, the conventional exposure apparatus uses the illumination optical system which is provided with the one-stage optical integrator or the two-stage optical integrators. Further, the technique to avoid the occurrence of speckles has been developed. In such circumstances, the exposure wavelength is shortened in an advanced manner in recent years in order to obtain a higher resolution. At present, the KrF excimer laser light beam (wavelength: 248 nm) is dominantly used. In future, investigation will be made to use the vacuum ultraviolet light beam such as the ArF excimer laser light beam (wavelength: 193 nm) and the $F_2$ laser light beam (wavelength: 157 nm). Such a laser beam has high coherence as compared with the conventional bright line. When the laser beam having the short wavelength as described above is allowed to pass through a projection optical system composed of a refractive system, then the usable saltpeter material is limited, for example, to quartz glass and fluorite, and it is difficult to extinguish the color. Therefore, the wavelength of the laser beam is usually narrow-banded, for example, to have an order of the half value width of about 0.1 to 1 pm. The coherence of the laser beam narrow-banded as described above is further enhanced, resulting in high contrast of the interference fringes (speckles). Therefore, it is necessary to use a more highly-advanced technique in order to avoid the occurrence of interference fringes.

Recently, the areal size per one chip of the semiconductor element is increased. Further, it is also effective to increase the numerical aperture of the projection optical system in order to obtain a higher resolution. However, it gradually becomes difficult to design and produce a projection optical system with which high image formation performance is successfully obtained over an entire exposure area that is large and wide. In view of the above, the attention is attracted to a scanning exposure type projection exposure apparatus in which exposure is performed by synchronously moving a reticle and a wafer with respect to a projection optical system in a state in which an exposure light beam is radiated into a slender slit-shaped illumination area on the reticle. In this case, the narrower the width of the illumination area in the scanning direction (hereinafter referred to as "slit width") is, the wider the width of the exposure field is, when a projection optical system having an identical size is used. As a result, it is possible to perform the exposure for a chip pattern having a large areal size. However, when the pulse light beam such as the excimer laser light beam is used, it is necessary that the number of exposure pulses for each point on the wafer is not less than a predetermined minimum number of pulses, taking the dispersion or irregularity of the pulse energy into consideration. When the movement velocity of the stage is increased in order to enhance the throughput in a state in which the slit width is made narrow, the number of exposure pulses is consequently decreased. However, it is possible to increase the frequency of the pulse light emission in the case of the recent excimer laser light source. The problem of the number of exposure pulses has been progressively dissolved.

However, when the slit width is narrowed, if a fly's eye lens is used as the optical integrator, then it is necessary to use finely subdivided lens elements in the scanning direction to such an extent corresponding to the narrowed slit width. When the arrangement pitch of a plurality of lens elements is made fine as described above, the interference fringes tend to occur in the illumination area of the reticle, because the coherence of the light fluxes passing through the adjacent lens elements is enhanced.

That is, in the case of the double fly's eye system shown in FIG. 17(a), the width of each lens element of the fly's eye lens 65 at the first stage can be wider than $\Delta$ provided that $\Delta$ represents the coherence length in the lateral direction of the illumination light beam IL. In this case, it is assumed that the light fluxes A1, A2, which come into positions in the vicinity of the interface between certain adjacent lens elements of the fly's eye lens 65, come into the different points P1, P2 on the reticle R respectively. It is also assumed that the light fluxes B1, B2, which come into positions separated from the boundary between the lens elements by spacing distances $\Delta 1$, $\Delta 2$ (assuming that $\Delta 1+\Delta 2=\Delta$ is satisfied) respectively, also come into the points P1, P2 respectively via the fly's eye lens 67. Interference occurs at the points P1, P2, respectively and interference fringes are formed on the reticle R.

Similarly, in the case of the single fly's eye system shown in FIG. 17(b), it is assumed that the light fluxes A3, A4, which come into a certain boundary between the lens elements, come into the different points P3, P4 on the reticle R respectively, and the light fluxes B3, B4, which come into a boundary adjacent thereto, also come into the points P3, P4 respectively, provided that the lens element of the fly's eye lens 69 has the width which is formed to be narrow in the same degree as that of the coherence length $\Delta$ in the lateral direction of the illumination light beam IL. Also in this case, interference occurs at the points P3, P4, respectively and interference fringes are formed on the reticle R.

That is, it is necessary to use the optical integrator in order to realize the uniform illuminance distribution on the reticle of the laser beam in which the illuminance distribution has a shape of Gaussian distribution. However, if the reticle is illuminated in a superimposed manner by using the optical integrator, the interference fringes tend to appear. An exposure apparatus has been also developed, in which a rod-type integrator (rod lens) is used as the optical integrator. However, the conventional rod-type integrator involves such an inconvenience that the interference fringes tend to appear in the same manner as in the fly's eye lens.

In view of the above, in order to decrease the temporal coherence and decrease the interference fringes, it is also possible to use the delay optical system or the delay optical element as described above in combination. However, the conventional delay optical system and the delay optical element have such a tendency that the size is increased and the weight is increased, for the recent exposure light beam composed of the laser beam which is narrow-banded and which has the high coherence. If the delay optical system or the delay optical element is allowed to have a function to uniformize the illuminance distribution as well, it is possible to simplify the arrangement of the illumination optical system.

In order to mitigate the uneven illuminance caused by the interference fringes without using the delay optical system or the delay optical element, for example, the following method has been hitherto used as well. That is, a vibration mirror is arranged in front of the fly's eye lens, and the laser beam, which comes into the fly's eye lens, is vibrated to move the interference fringes on the reticle. By doing so, the uneven illuminance is reduced by means of the integrating effect. In this case, the control is made so that the interference fringes are gradually moved every time when the pulse light emission is performed, because the excimer laser or the like resides in the pulse light beam. However, in the case of the method based on the use of the vibration mirror as described above, it is necessary to ensure a certain degree of exposure time. For this reason, an inconvenience arises as follows. That is, if it is intended to obtain necessary uniformity of the exposure amount distribution, then the exposure time is prolonged, and the throughput is lowered.

Taking the foregoing points into consideration, a first object of the present invention is to provide an exposure method in which a substantially uniform illuminance distribution is obtained on a pattern of a transfer objective without complicating an illumination optical system so much, without increasing the size of the illumination optical system so much, and without prolonging the illumination time (exposure time), even when an illumination light beam (exposure beam or illumination beam) having high coherence is used.

A second object of the present invention is to provide an illuminating apparatus which can be used when the exposure method as described above is carried out.

A third object of the present invention is to provide an exposure apparatus which makes it possible to perform exposure with a high throughput and with small unevenness of exposure amount by using the illuminating apparatus as described above.

A fourth object of the present invention is to provide an exposure method which makes it possible to improve uniformity of totalized exposure amount distribution on an exposure objective substrate after scanning exposure without increasing the size of an illumination optical system so much, when the scanning exposure is performed by using a pulse light beam (exposure beam or illumination beam) having high coherence.

A fifth object of the present invention is to provide an illuminating apparatus or an exposure apparatus which can be used when the exposure method as described above is carried out.

DISCLOSURE OF THE INVENTION

A first exposure method according to the present invention resides in an exposure method for illuminating a first object (R) with an exposure light beam to transfer a pattern on the first object onto a second object (W), the exposure method comprising adjusting the exposure light beam into light fluxes having a predetermined angular aperture distribution, and allowing the adjusted light fluxes to pass through a substantially closed loop-shaped optical path so that a plurality of light fluxes, which have passed through the loop-shaped optical path a variety of numbers of times depending on angular apertures respectively, are superimposed and guided to the first object.

According to the present invention as described above, when the exposure light beam, which has the predetermined angular aperture or open angle distribution, is supplied to the loop-shaped optical path, the components of the exposure light beam, which have different angular apertures or open angles (angles of incidence), are advanced while repeating reflections at the outer circumferential surfaces of the optical path depending on the angular apertures respectively. In this operation, for example, when a window, which is smaller than the cross section of the optical path, is formed at an intermediate position of the optical path beforehand, the components, which pass through the window, are radiated toward the first object. On the other hand, the components, which are spread widely beyond the window, pass through the optical path again, and the components, which pass through the window, are finally radiated toward the first object. As a result, the components, which have passed through the loop-shaped optical path once, twice, three times or more depending on the angular apertures respectively, are superimposed and radiated from the window.

When the optical path length, which is required for the light flux to pass through the loop-shaped optical path once, is set to be longer than the coherence length that is determined depending on the coherence time, the coherence between the plurality of components is greatly lowered owing to the delay effect. That is, the temporal coherence of the exposure light beam radiated from the window is lowered owing to the delay effect depending on the angular apertures of the respective components, and the spatial coherence thereof is also lowered. Further, the information on the angular aperture (angle of incidence) upon the incidence is maintained by the reflection at the outer circumference. Further, the illuminance distribution is uniformized as well by the repeated reflection at the outer circumference. In other words, the light flux is divided (subjected to wave front division) depending on the size of the cross section of the loop-shaped optical path and the size of the window for radiation. Therefore, the delay effect and the uniformizing effect of the illuminance distribution are obtained owing to the loop-shaped optical path. Accordingly, even when the exposure light beam has a Gaussian distribution with high coherence, then the interference fringes (speckles) on the pattern of the transfer objective are reduced on condition that the illumination optical system is simplified, and it is possible to obtain a substantially uniform illuminance distribution.

In another aspect, a first illuminating apparatus of the present invention resides in an illuminating apparatus for illuminating a pattern on an illumination objective (R) with an illumination light beam from a light source (15), the illuminating apparatus comprising an optical member (22) including a window (44) which receives the illumination light beam from the light source, wherein a plurality of light fluxes, which are obtained by allowing light fluxes incoming from the window to pass through the optical member (22) a variety of numbers of times depending on angular apertures respectively, are superimposed and radiated toward the illumination objective. According to the present invention as described above, the optical member (22) forms a loop-shaped optical path to act as a delay optical element for the illumination light beam and an element for uniformizing the illuminance distribution. Therefore, it is possible to use the first exposure method according to the present invention.

In this arrangement, it is desirable that an angular aperture-adjusting optical system (21) for adjusting the illumination light beam from the light source into light fluxes having a predetermined angular aperture distribution is arranged between the light source and the optical member; and a multiple light source-forming optical system (25) for forming a plurality of light source images from the illumination light beam from the optical member, and a condenser optical system (7) for radiating light fluxes from the plurality of light source images onto the illumination objective in a superimposed manner are arranged between the optical member and the illumination objective.

It is desirable that the window (44) is arranged at a position which is eccentric from a central axis of the optical member (22). It is preferable that the window also serves as a window for radiating the illumination light beam. Examples of the optical member include those obtained by arranging, in a ring-shaped configuration, outer surface reflection members (for example, mirrors) or prism-shaped or columnar transmitting members (for example, rod members).

When the window is eccentric from the central axis of the optical member, the incoming illumination light beam arrives at the reflecting surfaces under different conditions in the upward, downward, rightward, and leftward directions. As a result, the delay condition (for example, the number of times of passage through the loop), which is determined depending on the angular aperture, is mutually different in the upward, downward, rightward, and leftward directions. The delay condition for the illumination light beam advancing in an oblique direction is a condition obtained by averaging the delay conditions in the upward and downward directions and in the rightward and leftward directions in the vicinity thereof. As a result, one optical member can be used as a large number of delay optical systems having different delay conditions. The temporal coherence is further lowered.

Besides the window is eccentric from the central axis of the optical member as described above, it is also preferable that the direction of the illumination light beam supplied to the window is allowed to have a predetermined inclination with respect to the central axis.

In still another aspect, a first exposure apparatus according to the present invention resides in an exposure apparatus for transferring a pattern on a first object onto a second object, wherein the pattern on the first object is illuminated with an illumination light beam from the illuminating apparatus of the present invention.

In still another aspect, a second exposure apparatus according to the present invention resides in an exposure apparatus provided with an illumination system for illuminating a first object (R) with an exposure light beam in which a second object (W) is exposed with the exposure light beam via the first object; the exposure apparatus comprising an optical member (22) which includes a transmitting section (22a to 22h) for internally reflecting the exposure light beam in the illumination system and changing a traveling direction thereof; wherein the optical member is formed with an aperture (44) which is smaller than a cross-sectional area of the transmitting section in order to radiate the exposure light beam. When the exposure apparatuses as described above are used, then interference fringes are scarcely formed on the first object, and the exposure amount distribution is uniformized. Accordingly, it is possible to improve the line width uniformity of the pattern to be transferred onto the second object.

In still another aspect, a second exposure method according to the present invention resides in an exposure method for illuminating a first object (R) with an exposure light beam to expose a second object (W) with the exposure light beam having passed through a pattern on the first object; the exposure method comprising introducing the exposure light beam into a plane (76G) which is substantially conjugate with a pattern plane of the first object via an open light-feeding optical path (56) which is surrounded by reflecting surfaces and which has at least one bent section (58A), and introducing, into the first object, the exposure light beam having passed through the plane.

According to the present invention as described above, a plurality of light source images (secondary light sources) are formed as virtual images in accordance with the reflection at external surfaces of the light-feeding optical path in the same manner as in a rod-type integrator. In this procedure, the coherence is lowered for the adjacent light source images, because they are inverted in relation to the reflecting surfaces. As a result, the contrast is lowered for interference fringes (speckles) generated on the first object. The formation of the plurality of light source images can be considered as wave front division of the exposure light beam as well. When the angular aperture of the exposure light beam (coherence factor of the illumination system) is increased, or when the light-feeding optical path is lengthened, then the number of formed light source images (number of wave front division) is increased, the integration effect is enhanced, and the coherence is decreased as well. Therefore, it is possible to improve the uniformity of the illuminance distribution on the pattern of the first object. However, when the light-feeding optical path is merely lengthened, the illumination optical system inevitably has a large size. However, in the present invention, the light-feeding optical path is bent. Therefore, the illumination optical system can be miniaturized.

In this arrangement, for example, when a laser beam, in which the oscillation wavelength width is narrow-banded to have an order of about 0.1 to 1 pm, is used, it is desirable that the light-feeding optical path is provided with at least three bent sections, in order that the light-feeding optical path is sufficiently long to obtain a sufficiently uniform illuminance distribution on the pattern of the first object, and the illumination optical system is allowed to have a small size.

It is desirable that a width of the light-feeding optical path (56) on a light-outgoing side (57B) is wider than a width of the light-feeding optical path (56) on a light-incoming side (57A) in a bending direction brought about by the bent section (58A). One method for increasing the number of wave front division as described above is to increase the angular aperture of the exposure light beam. However, if the angular aperture is increased in a state in which the cross-sectional area of the light-feeding optical path is constant, the light amount loss is increased at the bent section. On the contrary, when the width d2 on the light-outgoing side is made wider than the width d1 on the light-incoming side of the light-feeding optical path, it is possible to decrease the light amount loss at the bent section.

In still another aspect, a third exposure method according to the present invention resides in an exposure method for illuminating a first object (R) with a pulse-emitted exposure light beam and synchronously moving the first object and a second object (W) to perform scanning exposure for the second object with the exposure light beam having passed through a pattern on the first object; the exposure method comprising previously measuring a repeating pitch (Q1) of an intensity distribution of the exposure light beam on the second object in a scanning direction for the second object; and setting a distance (Q2) of movement of the second object in the scanning direction during one cycle of pulse light emission of the exposure light beam to be a non-integral multiple of the measured pitch.

In the present invention as described above, even if any unevenness (interference fringe or the like) of the intensity distribution having the pitch Q1 is generated on the second object in the scanning direction for the second object by the exposure light beam in an amount of one pulse, the exposure light beam is subjected to the pulse light emission every time when the second object is moved in the scanning direction by the distance Q2 ($\neq$n·Q1, n is an integer of not less than 1). Accordingly, the distribution of the totalized exposure amount on the second object is gradually uniformized owing to the averaging effect.

In still another aspect, a second illuminating apparatus according to the present invention resides in an illuminating apparatus for illuminating a pattern on an illumination objective (R) with an illumination light beam from a light source (9); the illuminating apparatus comprising a multiple light source-forming optical system (56) which includes a plurality of transmitting sections (57A to 57G) surrounded by reflecting surfaces respectively for allowing the illumination light beam to pass through an interior thereof, and one or a plurality of reflecting section or sections (58A to 58F) for bending an optical path for the illumination light beam at a boundary between the plurality of transmitting sections, in which the illumination light beam is incorporated at one transmitting section (57A) of the plurality of transmitting sections, and the illumination light beam is radiated from another transmitting section (57G) onto a plane (76G) that is substantially conjugate with a pattern plane of the first object; and a condenser optical system (31, 7) which collects, onto the pattern, the illumination light beam having passed through the substantially conjugate plane.

In still another aspect, a third exposure apparatus according to the present invention resides in an exposure apparatus comprising the second illuminating apparatus of the present invention which illuminates a first object (R) as an illumination objective with an illumination light beam from the illuminating apparatus; wherein a second object (W) is exposed with the illumination light beam having passed through a pattern on the first object.

In still another aspect, a fourth exposure apparatus according to the present invention resides in an exposure apparatus having an illumination system for illuminating a first object (R) with an exposure light beam, for exposing a second object (W) with the exposure light beam via the first object; the exposure apparatus comprising an optical member (56) which includes a transmitting section (57A, 58A, 57B) for internally reflecting the exposure light beam in the illumination system; wherein the transmitting section of the optical member is bent at least at one position, and a width (width d2) of the transmitting section after being bent is larger than a width (width d1) of the transmitting section before being bent.

In still another aspect, a fifth exposure apparatus according to the present invention resides in an exposure apparatus for illuminating a first object with an exposure light beam from a pulse light source (9) and synchronously moving the first object and a second object by the aid of a stage system (1, 4, 5) to perform scanning exposure for the second object with the exposure light beam having passed through a pattern on the first object; the exposure apparatus comprising a storage unit (13a) which stores a repeating pitch of an intensity distribution of the exposure light beam on the second object in a scanning direction for the second object; and a control system (13) which controls a light emission frequency of the pulse light source and a scanning velocity of the second object effected by the stage system depending on the stored pitch.

The second exposure method and the third exposure method can be carried out by using the second illuminating apparatus and the third and fourth exposure apparatuses and the fifth exposure apparatus of the present invention respectively.

It is desirable for the fifth exposure apparatus to provide a photoelectric detector (2) for measuring the intensity distribution on the stage for driving the second object.

In still another aspect, a method for producing a device according to the present invention comprises the step of transferring a device pattern (R) onto a workpiece (W) by using the exposure method of the present invention as described above. When the present invention is applied, the unevenness of the exposure amount is reduced. Therefore, it is possible to produce a device having a highly advanced function.

BRIEF DESCRIPTION OF THE DRAWINGS

FIG. 3 illustrates an arrangement and function of a modified illumination mechanism 19 shown in FIG. 2.

FIG. 4 illustrates a case in which the modified illumination mechanism 19 shown in FIG. 3 is used to perform annular illumination.

FIG. 6 illustrates an arrangement and function of a delay optical system 22 shown in FIG. 2.

FIG. 17(a) shows a conventional illumination system based on the double fly's eye system, and FIG. 17(b) shows a conventional illumination system based on the single fly's eye system.

BEST MODE FOR CARRYING OUT THE INVENTION

A preferred first embodiment of the present invention will be explained below with reference to FIGS. 1 to 9. In this embodiment, the present invention is applied when exposure is performed with a projection exposure apparatus based on the step-and-scan system.

Figure 1:
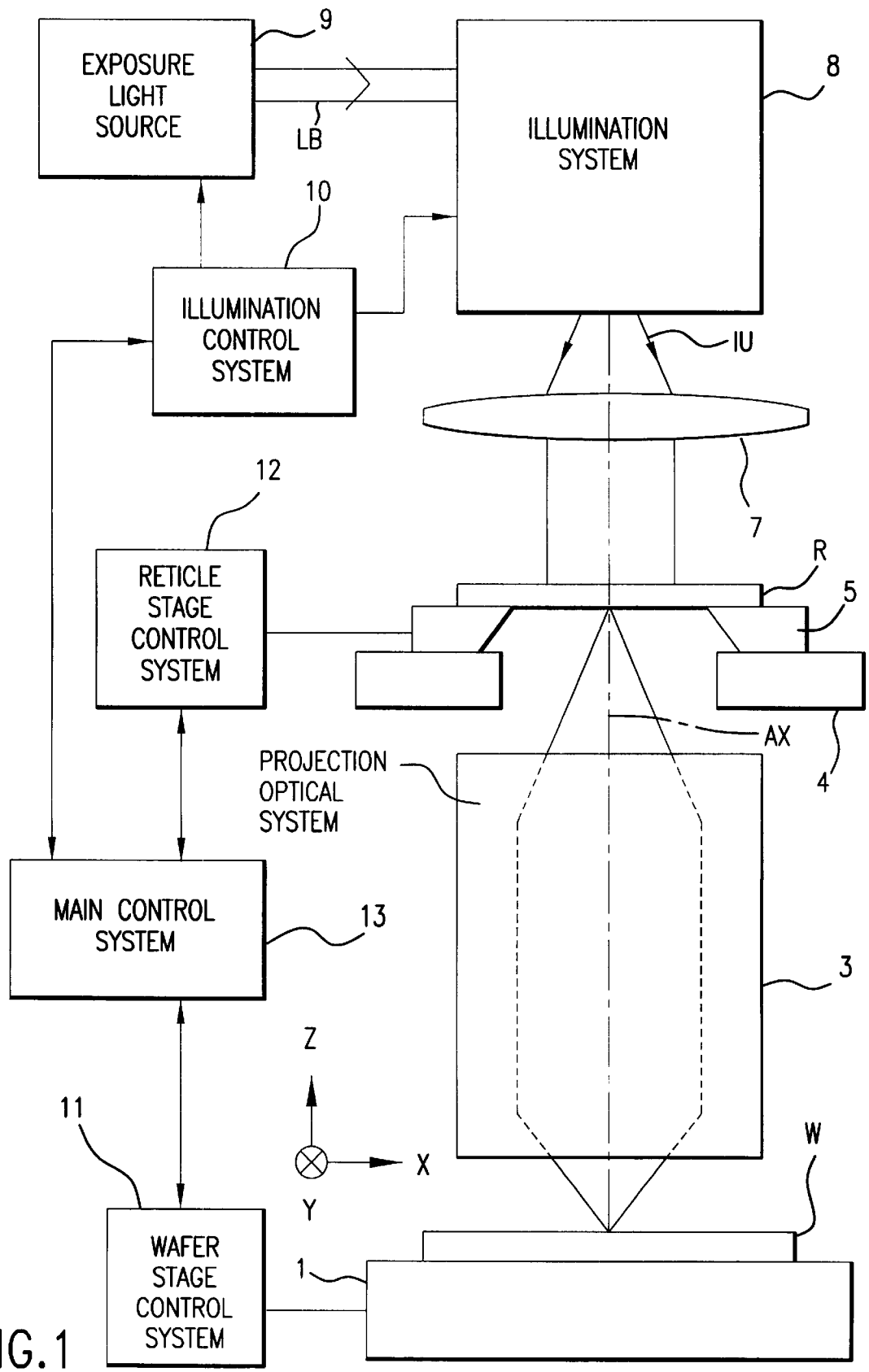
FIG. 1 shows a schematic arrangement illustrating a projection exposure apparatus according to a first embodiment of the present invention.

FIG. 1 shows a schematic arrangement of the projection exposure apparatus of this embodiment. With reference to FIG. 1, a laser beam LB, which has a narrow-banded wavelength as an illumination light beam for exposure (exposure light beam) pulse-emitted from an exposure light source 9, comes into an illumination system 8. A KrF excimer laser light source (oscillation frequency: 248 nm), in which the oscillation wavelength width is narrow-banded, for example, into about 0.1 to 1 pm, is used as the exposure light source 9 in this embodiment. However, other than the above, the present invention is also applicable to a case to use an exposure light source for generating, for example, a laser beam having high coherence such as ArF excimer laser (wavelength: 193 nm) and $F_2$ laser (wavelength: 157 nm) as well as a high harmonic wave generator for YAG laser. Further, for example, an X-ray source can be also used for the exposure light source 9. The light sources as described above are pulse light sources. However, the present invention is also applicable to a case to use a light source which continuously emits light.

The illumination system 8 is provided with an optical system for converting the cross-sectional configuration of the incoming light flux into a desired shape as described later on, an optical member for reducing the temporal coherence, a fly's eye lens to serves as an optical integrator (uniformizer or homogenizer), and a field diaphragm (reticle blind). The incoming laser beam LB is converted by the illumination system 8 into an illumination light beam IU which has a predetermined numerical aperture and which has a uniformized illuminance distribution. The illumination light beam IU passes through a condenser lens system 7, and a pattern plane of a reticle R is illuminated with a slender illumination area having a rectangular configuration. Under the illumination light beam IU, an image of a pattern on the reticle R as a first object or a mask is projected via a projection optical system 3 at a projection magnification β (β is, for example, ¼, ⅕, or ⅙) onto a rectangular exposure area on a wafer W applied with resist as a second object or a substrate. The wafer W is, for example, a disk-shaped substrate for producing a semiconductor device such as semiconductor (silicon or the like) or SOI (silicon on insulator). Explanation will be made below assuming that the X axis extends in parallel to the plane of paper of FIG. 1 in the plane perpendicular to the optical axis AX of the projection optical system 3, and the Y axis extends perpendicularly to the plane of paper of FIG. 1. The scanning direction during the scanning exposure for the reticle R and the wafer W in this embodiment is the Y direction.

In this arrangement, the reticle R is held on a reticle stage 5. The reticle stage 5 is continuously movable in the Y direction on a reticle base 4, for example, in accordance with the linear motor system, and it is finely movable to correct, for example, any synchronization error in the X direction, the Y direction, and the rotational direction. The X coordinate, the Y coordinate, and the angle of rotation of the reticle stage 5 are measured highly accurately by means of laser interferometers provided for a reticle stage control system 12. The reticle stage control system 12 drives the reticle stage 5 on the basis of an obtained result of the measurement and control information supplied from a main control system 13.

On the other hand, the wafer W is held on a wafer stage 1 by the aid of an unillustrated wafer holder. The wafer stage 1 is continuously movable in the Y direction on an unillustrated surface plate, for example, in accordance with the linear motor system, and it is movable in a stepping manner in the X direction and the Y direction. The wafer stage 1 controls the focus position (position in the Z direction) and the angle of inclination of the wafer W in accordance with the servo system on the basis of a result of detection obtained by an unillustrated autofocus sensor so that the surface of the exposure area of the wafer W coincides with the image plane of the projection optical system 3. The X coordinate, the Y coordinate, and the angle of rotation of the wafer stage 1 are measured highly accurately by means of laser interferometers provided for a wafer stage control system 11. The wafer stage control system 11 drives the wafer stage 1 on the basis of an obtained result of the measurement and control information supplied from the main control system 13. An illumination control system 10 is connected to the main control system 13. The illumination control system 10 controls, for example, the light emission timing and the light emission output of the exposure light source 9, and it controls the operation of predetermined members in the illumination system 8 (as described in detail later on). Accordingly, the illumination control system 10 sets the illumination condition (for example, switching between the ordinary illumination and the modified illumination and setting of the σ value as the coherence factor of the illumination light beam).

During the scanning exposure, the illumination condition is set by the illumination control system 10 under the control of the main control system 13. After the pulse light emission is started by the exposure light source 9, the reticle R is moved at a velocity VR in the +Y direction (or in the −Y direction) by the aid of the reticle stage 5, in synchronization with which the wafer W is moved at a velocity β·VR (β represents the projection magnification from the reticle R to the wafer W) in the −Y direction (or in the +Y direction) by the aid of the wafer stage 1. Accordingly, one shot area on the wafer W is exposed with the light beam. The reason whey the scanning direction of the reticle R is opposite to that of the wafer W is that the projection optical system 3 performs the inversion projection. After that, the operation, in which the wafer W is moved in a stepping manner so that the next shot area comes to a position just before the exposure area to perform the synchronized scanning, is repeated in accordance with the step-and-scan system. Thus, the respective shot areas on the wafer W are exposed with the pattern image of the reticle R.

Next, explanation will be made in detail for the arrangement of the exposure light source 9 and the illumination system 8 of this embodiment.

Figure 2:
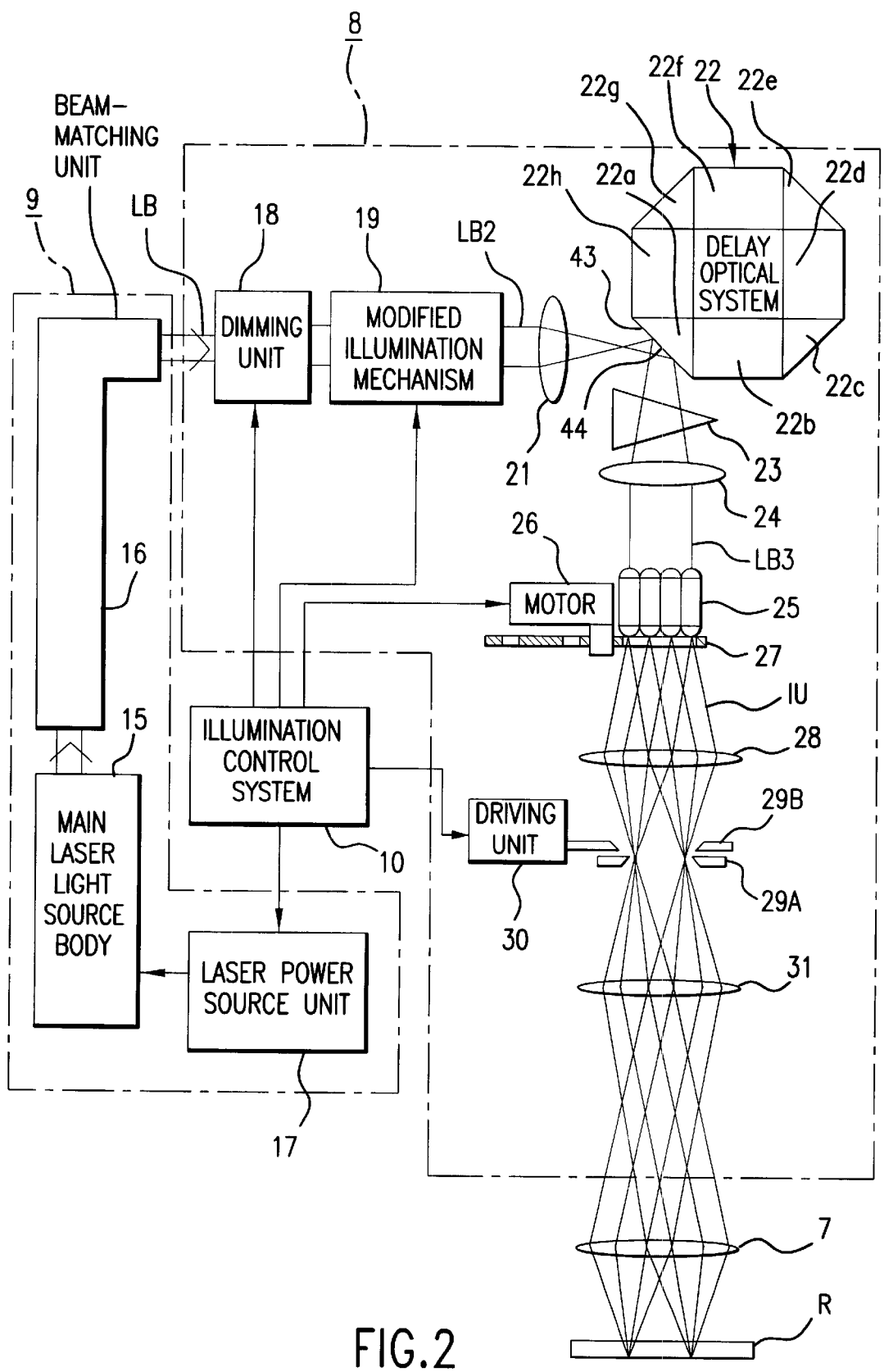
FIG. 2 shows an arrangement illustrating an illumination system 8 shown in FIG. 1.

FIG. 2 shows the arrangement of the exposure light source 9 and the illumination system 8 shown in FIG. 1. With reference to FIG. 2, the exposure light source 9 comprises a main laser light source body 15 for generating the linearly polarized laser beam LB, a beam-matching unit (BMU) 16 for transmitting the laser beam LB to the illumination system 8, and a laser power source unit 17 for driving the main laser light source body 15. The laser power source unit 17 effects, for example, the control of the pulse light emission timing of the laser beam LB at the main laser light source body 15, the fine adjustment for the oscillation frequency, and the fine adjustment for the light emission power (average pulse energy) under the control of the illumination control system 10.

In the illumination system 8, the laser beam LB is dimmed to have a predetermined illuminance (=average pulse energy per unit area x oscillation frequency) by the aid of a dimming unit 18. When the pulse emission type laser beam LB (illumination light beam IU) is used as the exposure light beam or the illumination light beam as in this embodiment, it is necessary that the number of exposure pulses N (N is an integer) for each point on the wafer is not less than a predetermined minimum number of pulses $N_{min}$ which is determined depending on the dispersion of the pulse energy, in order to allow the totalized exposure amount at each point on the wafer to be included within an allowable range with respect to a proper value. Further, assuming that E [J/mm²] represents the resist sensitivity (proper exposure amount) on the wafer W and P [J/mm²] represents the average pulse energy on the wafer W, it is necessary that the following relationship holds within a predetermined allowable range by using the number of exposure pulses N.

$$E = N \cdot P \tag{1}$$

Assuming that V [mm/s] represents the scanning velocity of the wafer stage 1, D represents the width in the scanning direction (Y direction) of the slit-shaped exposure area on the wafer W (slit width on the wafer), and f [/s] represents the oscillation frequency of the laser beam LB, the number of exposure pulses N is represented by the following expression.

$$N = f \cdot (D/V) \geq N_{min} \tag{2}$$

The following expression is obtained by substituting the expression (1) with the expression (2).

$$E \cdot V = f \cdot P \cdot D \tag{3}$$

Accordingly, assuming that the slit width D is fixed, the main control system 13 firstly determines the values of the oscillation frequency f and the scanning velocity V so that $f \cdot (D/V) \geq N_{min}$ in the expression (2) holds. In response thereto, the illumination control system 10 sets the oscillation frequency f of the laser beam LB for the laser power source unit 17. Subsequently, the main control system 13 calculates the value of the average pulse energy P by substituting the expression (1) with the number of exposure pulses N and the resist sensitivity E. A result of the calculation is supplied as a target value to the illumination control system 10. In this procedure, the proportional constant is previously determined between the illuminance of the laser beam LB on the light-incoming plane of the dimming unit 18 and the illuminance of the illumination light beam IU on the wafer W for a case in which a standard aperture diaphragm is used for the illumination optical system. The proportional constant is stored in a storage unit in the illumination control system 10. The illumination control system 10 sets the dimming ratio (transmittance) for the dimming unit 18 so that the pulse energy P of the illumination light beam IU on the wafer is the target value described above, from the proportional constant, the present state of the aperture diaphragm, and the pulse energy of the laser beam LB. The final adjustment is performed highly accurately on the basis of an unillustrated integrator sensor.

The laser beam LB, which has passed through the dimming unit 18, is shaped by a modified illumination mechanism 19 so that the illuminance distribution in cross section is in a predetermined state (for example, circular, annular, and eccentric plural light sources) and the illuminance distribution is a substantially uniform distribution. A laser beam LB2, which has been shaped as described above, is once collected by a light-collecting lens 21, and then it behaves as light fluxes having predetermined angular apertures to come into an aperture 44 on a light-incoming/outgoing plane 43 of a delay optical system 22 which is composed of a quadrilateral frame-shaped transmitting member. The delay optical system 22 is formed by joining, into a quadrilateral frame-shaped configuration, four rectangular prisms 22a, 22c, 22e, 22g and four quadratic prism-shaped rod members 22b, 22d, 22f, 22h which are transmissive with respect to the laser beam LB respectively. Further, the outer circumferential surfaces of the delay optical system 22 are reflecting surfaces except for the aperture on the light-incoming/outgoing plane 43 (as described in detail later on).

The delay optical system 22 corresponds to the optical member of the present invention, the optical path in the delay optical system 22 corresponds to the substantially closed loop-shaped optical path of the present invention, and the aperture 44 corresponds to the window. The light fluxes, which have passed through the delay optical system 22 once, twice, three times . . . , are superimposed to be radiated as a laser beam LB3 from the aperture on the light-incoming/outgoing plane 43 in a direction substantially perpendicular to the incoming direction of the laser beam LB2. The areal size of the projection, which is obtained by projecting the aperture 44 onto the plane perpendicular to the central axis of the delay optical system 22, is set, for example, to be about 1/(10×10) with respect to the cross-sectional area of, for example, the quadratic prism-shaped rod member 22b of the delay optical system 22. Accordingly, the illuminance distribution is uniformized equivalently to a case in which light fluxes, which are obtained by dividing (effecting the wave front division for) the incoming laser beam LB2 into about 100 individuals, are superimposed again. Further, the temporal coherence is greatly lowered in the outgoing laser beam LB3 as compared with the incoming laser beam LB2.

The laser beam LB3, which is radiated from the delay optical system 22, is deflected by a wedge-shaped aberration-correcting prism 23 so that the laser beam LB3 travels along the optical axis of the illumination optical system. After that, the laser beam LB3 comes into a fly's eye lens 25 as an optical integrator (homogenizer) via a lens 24. The fly's eye lens 25 corresponds to the multiple light source-forming optical system of the present invention. Assuming that the fly's eye lens 25 is formed by bundling, for example, lens elements of about 10 rows×10 columns, the laser beam LB3 is divided (subjected to wave front division) into about 100 individuals by the fly's eye lens 25. Divided light fluxes are radiated as the illumination light beam IU in a superimposed manner. That is, the wave front division, which substantially corresponds to about 100×100 individuals, is performed by the delay optical system 22 and the fly's eye lens 25. Therefore, the illuminance distribution of the illumination light beam IU radiated from the fly's eye lens 25 is sufficiently uniformized.

A diaphragm-switching member 27, which is formed with a variety of aperture diaphragms for finally determining the illumination condition (for example, ordinary illumination, modified illumination, and illumination with small coherence factor (small σ value)) and the σ value, is rotatably arranged in the vicinity of the light-outgoing plane of the fly's eye lens 25, i.e., at the optical Fourier transformation plane (pupil plane) with respect to the pattern plane of the reticle R as the focus plane on the light-outgoing side of the fly's eye lens 25 or in the vicinity thereof. The illumination control system 10 rotates the diaphragm-switching member 27 by the aid of a driving motor 26 to arrange a predetermined aperture diaphragm at the light-outgoing plane of the fly's eye lens 25. Thus, the illumination condition and the σ value are set. The illumination light beam IU, which outgoes from the fly's eye lens 25 and which passes through the predetermined aperture diaphragm, passes through a relay lens 28, a movable blind 29B, a fixed blind 29A, and a relay lens 31, and it is radiated from the illumination system 8. After that, the illumination area on the reticle R is uniformly illuminated with the illumination light beam IU via a condenser lens 7.

In this arrangement, the fixed blind 29A is arranged in the vicinity of the conjugate plane with respect to the pattern plane of the reticle R. The slit-shaped illumination area on the reticle R is defined by an aperture of the fixed blind 29A. The movable blind 29B is arranged closely to the fixed blind 29A. The movable blind 29B plays a role to shield the aperture of the fixed blind 29A in order that any unnecessary pattern is transferred onto the wafer upon the start and the end of the scanning exposure for each of the shot areas on the wafer. The illumination control system 10 controls the operation of the movable blind 29B by the aid of a driving unit 30 in accordance with the synchronization information supplied from the main control system 13.

Although not shown, for example, a beam splitter is arranged between the diaphragm-switching member 27 and the relay lens 28. An integrator sensor is provided, which photoelectrically converts the illumination light beam incorporated by the aid of the beam splitter. A detection signal obtained by the integrator sensor is supplied to the illumination control system 10. The relationship between the detection signal of the integrator sensor and the illuminance of the illumination light beam IU on the wafer W is previously measured, and it is stored in the storage unit in the illumination control system 10. The illumination control system 10 controls, for example, the laser power source 17 and the dimming unit 18 so that the illuminance of the illumination light beam IU on the wafer W has a target value set by the main control system 13.

Next, an illustrative arrangement of the modified illumination mechanism 19 of this embodiment will be explained in detail with reference to FIGS. 3 and 4. FIG. 3(a) shows the modified illumination mechanism 19 included in the illumination system 8 shown in FIG. 2. With reference to FIG. 3(a), the laser beam LB, which is supplied in the linearly polarized state from the exposure light source 9 shown in FIG. 2 and which has passed through the dimming unit 18, is converted by a ¼ wavelength plate 32 into a circularly polarized light beam that comes into a polarizing beam splitter 33. A P-polarized first light flux of the incoming laser beam LB, which has transmitted through the polarizing beam splitter 33, passes along a mirror 35, and it successively passes through a concave conical optical member 36A in which the light-incoming plane is a flat surface and the light-outgoing plane is an externally concave conical surface and through a convex conical optical member 36B in which the light-incoming plane is an externally convex conical surface and the light-outgoing plane is a flat surface. After that, the P-polarized first light flux passes through a polarizing beam splitter 40. On the other hand, a S-polarized second light flux, which has reflected by the polarizing beam splitter 33, successively passes through a convex conical optical member 34A in which the light-incoming plane is a flat surface and the light-outgoing plane is an externally convex conical surface and through a convex conical optical member 34B in which the light-incoming plane is an externally convex conical surface and the light-outgoing plane is a flat surface. After that, the S-polarized second light flux passes along a mirror 39, and it is reflected by the polarizing beam splitter 40. The first light flux and the second light flux, which are coaxially combined by the polarizing beam splitter 40, pass through a ¼ wavelength plate 41, and they are converted into the laser beam LB1 which is the circularly polarized light beam. The laser beam LB1 comes into a beam expander 42A, 42B composed of lenses 42A, 42B. Convex or concave conical prisms (axicons) can be used as the conical optical members 34A, 34B, 36A, 36B.

In this arrangement, a fixed unit 37A is constructed by the ¼ wavelength plate 32, the polarizing beam splitter 33, the mirror 35, and the two conical optical members 34A, 36A. A movable unit 38B is constructed by the two conical optical members 34B, 36B, the mirror 39, the polarizing beam splitter 40, and the ¼ wavelength plate 41. The movable unit 38B is movable along the optical axis of the laser beam LB1 with respect to the fixed unit 37A by the aid of an unillustrated slide unit. The fixed unit 37A and the movable unit 38B constitute a beam-shaping system. The light-outgoing plane for the laser beam LB1 from the modified illumination mechanism 19 is optically conjugate with the light-incoming plane of the fly's eye lens 25 shown in FIG. 2. The first lens 42B of the beam expander 42A, 42B is arranged movably along the optical axis by the aid of an unillustrated slide unit. The expansion/contraction magnification for the cross-sectional configuration of the laser beam LB1 can be controlled by driving the lens 42B. The operation of the slide units is controlled by the illumination control system 10 shown in FIG. 2.

The operation of the fixed unit 37A, the movable unit 38B, and the beam expander 42A, 42B will now be explained with reference to FIGS. 3 and 4.

With reference to FIG. 3(a), the movable unit 38B is moved to a position which is closest to the fixed unit 37A. The concave light-outgoing plane of the conical optical member 36A makes tight contact with the convex light-incoming plane of the conical optical member 36B. Therefore, assuming that the intensity distribution in the cross section of the incoming laser beam LB is a Gaussian distribution, the intensity distribution, which is obtained in the cross section (X direction is the direction along the cross section) of the first light flux I1 passed through the conical optical members 36A, 36B as it is after being transmitted through the polarizing beam splitter 33, is a Gaussian distribution which is convex about the center of the optical axis as shown in FIG. 3(b). On the other hand, the spacing distance between the conical optical members 34A, 34B is set so that the central portion and the peripheral portion of the intensity distribution of the incoming second light flux I2 are inverted. The intensity distribution, which is obtained in the cross section of the second light flux I2 passed through the conical optical members 34A, 34B, is a distribution which is obtained by inverting the Gaussian distribution upside down as shown in FIG. 3(c). Therefore, the intensity distribution, which is obtained in the cross section of the laser beam LB1 obtained by combining the first light flux I1 and the second light flux I2 by the polarizing beam splitter 40, is approximately flat as shown in FIG. 3(d). The laser beam LB1 is converted by the beam expander 42A, 42B into the laser beam LB2 in which the cross-sectional configuration is magnified with a variable magnification. The laser beam LB2 shown in FIG. 3 is used for the ordinal illumination. However, if it is intended to perform the small σ value illumination in which the σ value as the coherence factor is decreased, it is enough that the spacing distance of the beam expander 42A, 42B is narrowed (magnification is decreased) to decrease the outer diameter of the laser beam LB2. That is, the σ value (angular aperture of the laser beam on the reticle) as the coherence factor can be changed continuously and arbitrarily by adjusting the spacing distance of the beam expander 42A, 42B.

Assuming that the intensity distribution in the cross section of the laser beam radiated from an excimer laser light source is a Gaussian distribution in a predetermined direction, the intensity distribution can be regarded to be approximately flat in a direction perpendicular thereto. Therefore, a "wedge-shaped" or cylindrical lens-shaped optical member, which has no refraction effect in a direction perpendicular to the plane of paper of FIG. 3, may be used in place of the conical optical members 34A, 34B, 36A, 36B of this embodiment.

On the other hand, FIG. 4(a) shows an arrangement in which the movable unit 38B is moved in the direction to make separation from the fixed unit 37A. In FIG. 4(a), the intensity distribution of the first light flux I1 passed through the conical optical members 36A, 36B is an annular Gaussian distribution in which the intensity is approximately zero in the vicinity of the optical axis as shown in FIG. 4(b). The intensity distribution of the second light flux I2 passed through the conical optical members 34A, 34B is such an anuular distribution that the Gaussian distribution is inverted upside down in which the intensity is approximately zero in the vicinity of the optical axis as shown in FIG. 4(c). Therefore, the intensity distribution of the laser beam LB1 obtained by combining the first light flux I1 and the second light flux I2 by the polarizing beam splitter 40 is a substantially flat annular distribution as described in FIG. 4(d). In this case, the outer diameter of the laser beam LB1 is enlarged as compared with the case shown in FIG. 3(a). Therefore, if it is intended to decrease the outer diameter of the laser beam LB1, the spacing distance of the beam expander 42A, 42B is narrowed to decrease the magnification of the laser beam LB2 to be finally radiated.

The laser beam LB2 shown in FIG. 4 is used when the annular illumination as an example of the modified illumination is performed. The condition for the annular illumination (for example, the outer diameter, the inner diameter, and the annular ratio of the secondary light source) can be changed continuously and arbitrarily by only adjusting the spacing distance between the movable unit 38B and the fixed unit 37A or by using the adjustment of the spacing distance between the movable unit 38B and the fixed unit 37A and the adjustment of the spacing distance of the beam expander 42A, 42B in combination.

Further, the laser beam LB2 shown in FIG. 4 can be also used when a plurality of (for example, four of) secondary light sources, which are eccentric from the optical axis on the pupil plane of the illumination optical system, for example, on the focal plane of the fly's eye lens 25 on the light-outgoing side, are used, i.e., when the modified illumination in the narrow sense is performed. Also when the plurality of eccentric secondary light source are used as described above, the final distribution of the secondary light sources is set by the corresponding aperture diaphragm included in the diaphragm-switching member 27. Therefore, no trouble occurs even when the distribution is annular at the stage at which the light is radiated from the modified illumination mechanism 19. When the annular distribution is prepared, an advantage is obtained such that the light amount loss is decreased at the stage of the aperture diaphragm. However, for example, in order to generate an illumination light beam which is uniformly distributed, for example, over eccentric four areas even at the stage at which the light is radiated from the modified illumination mechanism 19, optical members, in each of which the light-outgoing plane or the light-incoming plane is quadrangular pyramid-shaped (pyramid type), may be used in place of the conical optical members 34A, 34B, 36A, 36B. Accordingly, it is possible to further reduce the light amount loss.

In this case, an arrangement may be available, in which the conical optical member for forming the light intensity distribution shown in FIGS. 3(d) and 4(d) and the quadrangular pyramid-shaped optical member are exchangeable depending on the illumination condition. In addition to the arrangement shown in FIG. 3(a), for example, a diffracting optical element for the modified illumination may be arranged on the light-incoming side with respect to the polarizing beam splitter 33. An illumination light beam, which is distributed over four areas, may be generated at the stage at which the light comes into the modified illumination mechanism 19. In this case, it is desirable that the diffracting optical element for the modified illumination is exchanged with another optical element (for example, a diffracting optical element for distributing the illumination light beam over a circular area or an annular area) during the ordinary illumination and the annular illumination.

As described above, according to the modified illumination mechanism 19 of this embodiment, the flat circular illuminance distribution and the flat annular illuminance distribution can be switched by controlling the spacing distance of the two pairs of the conical optical members. Therefore, it is possible to effect the ordinary illumination and the modified illumination (including the annular illumination) while extremely decreasing the light amount loss. Further, it is possible to switch the σ value of the illumination optical system in the state in which there is little light amount loss, by switching the magnification of the laser beam LB2 by using the beam expander 42A, 42B.

In the arrangement shown in FIG. 3(a), the beam expander 42A, 42B is arranged on the light-outgoing side of the modified illumination mechanism 19 to adjust (especially enlarge) the light flux diameter (magnification) of the laser beam LB1. Therefore, the following advantage is obtained. That is, it is enough that the respective optical elements for constructing the modified illumination mechanism 19 are small, and it is possible to realize the small size as a whole. The light flux diameter of the laser beam LB1 may be also reduced by providing, for example, a zoom optical system, in place of the beam expander 42A, 42B. A zoom optical system may be provided on the light-incoming side of the modified illumination mechanism 19 in place of or in addition to the beam expander 42A, 42B (or the zoom optical system described above) arranged on the light-outgoing side of the modified illumination mechanism 19 to continuously change the light flux diameter (magnification) of the laser beam LB coming into the modified illumination mechanism 19 (conical optical members 34A, 36A). In this case., it is possible to change the formation conditions, i.e., the outer diameter, the inner diameter, and the annular ratio (ratio between the outer diameter and the inner diameter) mutually independently, especially when the intensity distribution of the laser beam LB1 is prescribed to be annular in the cross section by using the adjustment of the zoom optical system and the adjustment of the spacing distance between the fixed unit 37A and the movable unit 38B in combination.

In this embodiment, the diaphragm-switching member 27 is provided to exchange the aperture diaphragm. However, it is not necessarily indispensable to provide the diaphragm-switching member 27, because the modified illumination mechanism 19 can be used to change the intensity distribution of the laser beam on the pupil plane of the illumination optical system. However, even in this case, it is desirable to arrange an aperture diaphragm for defining the maximum range for allowing the laser beam to successfully pass on the pupil plane of the illumination optical system, i.e., the numerical aperture of the illumination optical system to avoid any occurrence of flare or the like. When the mechanism for exchanging the conical optical members 34A, 34B, 36A, 36B with the quadrangular pyramid-shaped optical members described above is not provided, it is impossible to realize the modified illumination in the narrow sense for forming the plurality of secondary light sources which are eccentric from the optical axis of the illumination optical system. Accordingly, it is desirable that a shielding plate or a dimming plate (aperture diaphragm) for partially shielding or dimming the laser beam with the illuminance distribution defined to be annular by the modified illumination mechanism 19 can be arranged, for example, closely to the light-outgoing plane of the fly's eye lens 25 only when the modified illumination in the narrow sense is realized.

Figure 5:
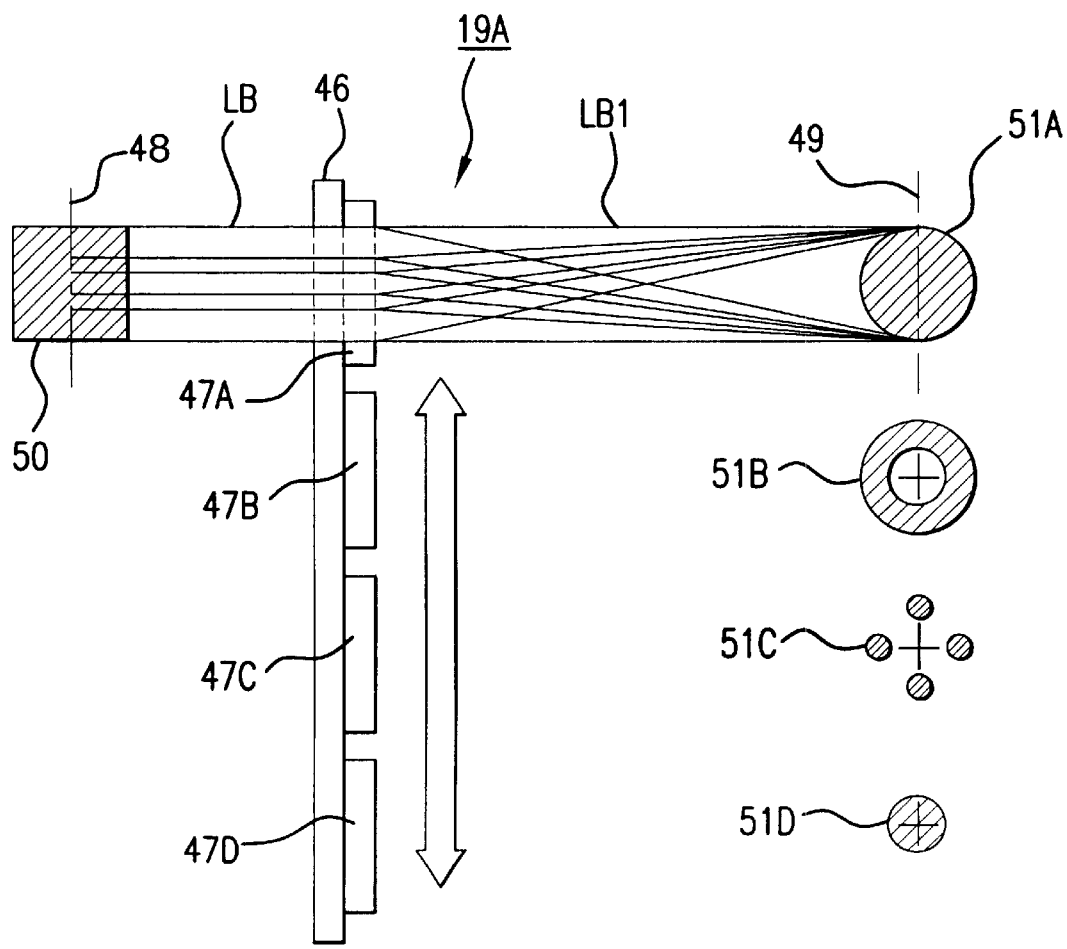
FIG. 5 shows another illustrative arrangement of the modified illumination mechanism.

A modified illumination mechanism 19A as shown in FIG. 5 can be also used in place of the modified illumination mechanism 19. With reference to FIG. 5, it is assumed that the illuminance distribution in the cross section perpendicular to the optical axis of the laser beam LB on a light-incoming plane 48 is approximately square as indicated by a hatched area 50. In this illustrative arrangement, a slide member 46 is arranged movably to traverse the optical path of the laser beam LB. Those installed on four apertures of the slide member 46 are a phase plate 47A for the ordinary illumination, a phase plate 47B for the annular illumination, a phase plate 47C for the modified illumination in the narrow sense based on the use of eccentric four secondary light sources, and a phase plate 47D for the small a value. Each of the phase plates 47A to 47D is constructed such that a large number of fine diffraction gratings of the phase type are formed in a predetermined arrangement on a substrate which is transmissive with respect to the laser beam LB.

It is assumed that the light-outgoing plane 49 shown in FIG. 5 is conjugate with the light-incoming plane of the fly's eye lens 25 shown in FIG. 2. When the slide member 46 is driven to install the phase plate 47A on the optical path of the laser beam LB, the illuminance distribution in the plane perpendicular to the optical axis on the light-outgoing plane 49 of the laser beam LB1 transmitted through the phase plate 47A is circular as indicated by a hatched area 51A. When the phase plates 47B, 47C, 47D are installed on the optical path of the laser beam LB respectively, the illuminance distributions of the laser beam LB1 on the light-outgoing plane 49 reside in an annular area, eccentric four areas, and a small circular area as indicated by areas 51B to 51D respectively. The arrangement of the diffraction grating in each of the phase plates 47A to 47D is set so that the illuminance distribution is approximately uniform in each of the areas 51A to 51D. Accordingly, the ordinary illumination and the modified illumination can be switched to one another without causing any substantial loss of the light amount of the incoming laser beam LB.

In addition to the arrangement shown in FIG. 5, for example, the pair of conical prisms (axicons) described above may be arranged so that the annular area and the eccentric four areas are movable in the radial direction about the center of the optical axis of the illumination system.

Each of the phase plates 47A to 47D described above is constructed such that a plurality of minute phase patterns or minute transmittance patterns are arranged on a substrate which is substantially transparent with respect to the exposure light beam. Those usable as the material for the substrate include, for example, fluorite ($CaF_2$) and synthetic quartz doped with fluorine. As described above, in this embodiment, the phase plate 47A to 47D is used for the diffracting optical element (Diffracted Optical Element, hereinafter referred to as "DOE"). However, any one other than the phase plate may be used as DOE provided that the light is diffracted depending on the difference, for example, in phase, transmittance, or refractive index. When DOE is used, the following effect is obtained, because it is possible to decrease the number of optical parts. That is, the arrangement of the illumination optical system can be simplified, and the coherence of the exposure light beam can be reduced to improve the uniformity of the illuminance distribution on the reticle. Alternatively, for example, the following arrangement may be adopted. That is, when the full field exposure (static exposure) and the scanning exposure are switched to one another, the optical integrator is changed depending on the change of the illumination area on the reticle. DOE (for example, the phase plate) may be exchanged with another DOE when the change is performed. Further, DOE can be also used as an optical integrator (uniformizer or homogenizer). In this case, one stage or a plurality of stages of optical integrator or optical integrators may be constructed with only one or a plurality of DOE or DOE's. Alternatively, a plurality of stages of optical integrators may be constructed by combining one DOE and a fly's eye lens or a rod lens (internal reflection type integrator).

The laser beam LB1, which has passed through the modified illumination mechanism 19 shown in FIG. 3(a), is advanced via the beam expander 42A, 42B toward the delay optical system 22 shown in FIG. 2. The structure and the function of the delay optical system 22 will be explained in detail below with reference to FIGS. 6 and 7.

FIG. 6(a) shows a plan view illustrating the delay optical system 22 shown in FIG. 2. With reference to FIG. 6(a), the delay optical system 22 comprises prism-shaped rod members each of which has a width H of one side and which are transparent with respect to the incoming laser beam LB2, the rod members being arranged in a quadrilateral frame-shaped configuration. One of portions corresponding to apexes of the quadrangle is used as a light-incoming/outgoing plane 43 composed of a reflecting surface which intersects the optical axis of the laser beam LB by 45°. An aperture (window) 44, which is composed of a square transmitting section having a width h as viewed in the optical axis direction as shown in FIG. 6(c), is formed at a central portion of the light-incoming/outgoing plane 43 (the center thereof is approximately coincident with the optical axis). The portions corresponding to the other three apexes of the quadrangle are used as reflecting surfaces M1, M2, M3 which intersect the optical axis by 45° respectively. All of the other outer circumferential portions of the delay optical system 22 are formed as reflecting surfaces. It is enough that a reflecting film of a metal film such as chromium, or a multilayered reflecting film is formed on each of the reflecting surfaces. However, for example, the total reflection may be utilized for the side surfaces of the prism-shaped rod member. Similarly, the total reflection surface may be also utilized as mirror surfaces M1 to M3.

It is necessary that the optical member for constructing the delay optical system 22 has a good transmittance with respect to the laser beam LB2 (exposure light beam). Such an optical member is exemplified as follows. That is, when the laser beam LB2 is the KrF excimer laser (wavelength: 248 nm), it is possible to use, for example, fused quartz glass or synthetic quartz glass. When the laser beam LB2 is the ArF excimer laser (wavelength: 193 nm), it is possible to use, for example, synthetic quartz glass or fluorite ($CaF_2$). When the laser beam LB2 is the $F_2$ laser (wavelength: 157 nm), it is possible to use, for example, synthetic quartz glass doped with an impurity such as fluorine and fluorite or magnesium fluoride ($MgF_2$). When the laser beam LB2 has a wavelength of not more than about 150 nm, it is possible to use, for example, fluorite or magnesium fluoride. Even when the material having a high transmittance as described above is used for the delay optical system 22, it is feared that the heat is generated when the laser beam LB2 repeatedly passes through the inside of the material. Accordingly, it is desirable that a cooling mechanism for circulating a cooling medium, a heat-absorbing mechanism such as a Peltier element, or a heat-discharging mechanism such as a heat pipe is provided to vertically interpose the delay optical system 22 thereby so that the delay optical system 22 is cooled.

The delay optical system 22 has the quadrilateral frame-shaped configuration. However, the delay optical system 22 may have a triangular frame-shaped configuration, or it may have a hexagonal or higher polygonal frame-shaped configuration. Further, a member, which is obtained by forming a cylindrical optical member to have a ring-shaped configuration, may be used for the delay optical system 22. When such a ring-shaped member is used, the window for allowing the laser beam to come thereinto or outgo therefrom may be a reflecting section in a joined plane which is formed obliquely at an intermediate portion of the member. It is possible to decrease the amount of use of the optical member even when the delay optical system 22 is allowed to have a large size, by using the polygonal frame-shaped optical member or the ring-shaped optical member as the delay optical system 22 as described above. For example, even when the expensive material such as fluorite and magnesium fluoride is used as the optical material for the delay optical system 22, it is enough to use a small amount of the material for the delay optical system 22 of this embodiment. Therefore, it is possible to greatly reduce the production cost. Even when it is difficult to produce large-sized satisfactory crystals as in magnesium fluoride, an advantage is also obtained in that the delay optical system 22 of this embodiment can be produced with ease by joining, for example, a plurality of prism-shaped (or columnar) members.

The delay optical system 22 may be constructed by combining a plurality of mirrors to cover the optical path of the laser beam thereby without using any refractive member. In this arrangement, a high transmittance can be obtained such that the interior is purged with a so-called inert gas such as nitrogen gas and helium gas having a high transmittance with respect to the laser beam in the ultraviolet region, or the interior is evacuated to vacuum. Any of the front surface mirror and the back surface mirror may be used for the mirror to be used when the plurality of mirrors are combined to construct the delay optical system 22 as described above. Further, the delay optical system 22 may be constructed with a refractive member and a hollow section composed of a plurality of reflecting members (mirrors or the like). That is, a part or all of the delay optical system 22 may be hollow.

The laser beam LB2, which comes into the delay optical system 22, is collected. Therefore, the laser beam LB2 can be considered as an aggregate of a variety of light fluxes having angular apertures ranging from 0° (i.e., light flux parallel to the optical axis) to a predetermined maximum value. If the light-collecting point of the laser beam LB is located on the aperture 44 of the delay optical system 22 or at the inside of the delay optical system 22, it is feared that the optical material for constructing the delay optical system 22 may be damaged due to the concentration of the intense thermal energy. Accordingly, in order to protect the optical material, the light-collecting point of the laser beam LB2 is actually positioned in the gas (or in the vacuum in some cases) existing at the outside of the aperture 44. The light flux, which is widened or spread to some extent thereafter, comes into the aperture 44. However, for the convenience of explanation, FIGS. 6 and 7 are depicted assuming that the laser beam LB2 is collected on the aperture 44.

The laser beam LB2, which comes into the aperture 44 of the delay optical system 22, is successively reflected in a closed loop-shaped form by the mirrors M1, M2, M3, and the light beam LB2 is directed toward the light-incoming/outgoing plane 43. Only the light fluxes, which are accommodated in the aperture 44, are radiated through the aperture 44 to the outside. The remaining light fluxes are advanced again in the loop-shaped optical path in the delay optical system 22. The light fluxes, which are consequently accommodated in the aperture 44 during the process of passage twice, three times, . . . through the loop-shaped optical path, are also radiated through the aperture 44 to the outside. The light fluxes, which are obtained by superimposing the plurality of light fluxes radiated through the aperture 44, form the laser beam LB3. In this arrangement, the number of times of passage of each of the light fluxes for constructing the laser beam LB2 through the delay optical system 22 is determined depending on the angular aperture of each of the light fluxes. Therefore, explanation will be made below for the relationship between the angular aperture of the light flux and the number of times of passage of the light flux through the delay optical system 22. The "angular aperture" of the predetermined light flux in this embodiment represents the angle which is formed by the light flux with respect to the optical axis in the delay optical system 22.

The delay optical system 22 is equivalent to an arrangement obtained by successively connecting trapezoidal optical members 45A, 45B, 45C, 45D via the mirrors M1, M2, M3 and the light-incoming/outgoing plane 43. Therefore, for the convenience of explanation, as shown in FIG. 6(b), the delay optical system 22 is regarded to be an optical system in which the optical members 45A to 45D are arranged in series.

With reference to FIG. 6(b), the light flux having an angular aperture θ, which originates from the laser beam LB2 incoming into the aperture 44 of the light-incoming/outgoing plane 43 of the delay optical system 22, is radiated from the aperture 44 after passing through the optical path having a length L in the delay optical system 22 once. In FIG. 6(b), the angular aperture θ is large for the purpose of better comprehension. However, actually, as shown in FIG. 6(d) which is obtained by reducing those shown in FIG. 6(b) in the optical axis direction and connecting a plurality of them repeatedly, most of the light fluxes have the angular aperture ranging from 0 to arctan(H/(2L)) (rad) provided that H represents the width of the delay optical system 22. The light flux 52A, which has the angular aperture θ approximate to 0, is radiated as it is from the aperture 44. The light flux 52B, which has the angular aperture θ that is approximately arctan(H/(2L)), is radiated from the aperture 44 after passing through the delay optical system 22 twice. The light fluxes 52C, 52D, . . . , which have the angular apertures θ that are smaller than arctan(H/(2L)), are radiated from the aperture 44 after passing through the delay optical system 22 three times, four times, . . . respectively. That is, the number of times of passage n of the light flux 52A to 52D through the delay optical system 22 is 1 to 4. The number of times of passage (number of times of looping) is the value which can be appropriately set depending on, for example, the width h of the aperture 44, the angular aperture θ, the length L of the optical path, and the width H of the delay optical system 22.

In this embodiment, the length L of the optical path in the delay optical system 22 is set so that the coherence almost disappears between the light fluxes passed through the delay optical system 22 different numbers of times. That is, assuming that ε represents the refractive index of the delay optical system 22 with respect to the laser beam LB2, the optical path length ε·L for making a round trip in the delay optical system 22 is set to be not less than the coherence length CL of the laser beam LB2. In this case, assuming that $\lambda_0$ represents the central wavelength of the laser beam LB2 in vacuum and Δλ represents the half value width of the wavelength, the coherence length CL is approximately represented as follows. The half value width Δλ is a value which is determined depending on the temporal coherence of the laser beam LB2.

$$\epsilon \cdot L \geq CL = \lambda_0^2 / \Delta\lambda \tag{4}$$

However, the longer the length L is, the more difficult the production of the delay optical system 22 is. Therefore, it is desirable that the optical path length ε·L is not more than about twice the coherence length CL. When the laser beam LB2 of this embodiment is the narrow-banded KrF excimer laser beam, the coherence length CL is 153 mm or 410 mm provided that the central wavelength $\lambda_0$ is 248 nm and the half value width Δλ of the wavelength is 0.4 pm or 0.15 pm respectively. Therefore, assuming that the coherence length CL is about 450 mm with a certain margin and the refractive index ε of the delay optical system 22 is about 1.5, it is enough that the length L of the optical path is not less than about 300 mm and not more than about 600 mm in order that the expression (4) is satisfied and the optical path length ε·L is not more than about twice the coherence length CL. Therefore, the delay optical system 22 may have a rectangular frame-shaped configuration in which the width of one side is not less than about 75 mm and not more than about 150 mm. Accordingly, the temporal coherence of the laser beam LB3 outgoing from the delay optical system 22 is greatly lowered as compared with the incoming laser beam LB2. In this embodiment, the light fluxes, which pass through the delay optical system 22 three or more times, are also included. Therefore, even when the expression (4) is not necessarily satisfied, i.e., even when the optical path length $\epsilon \cdot L$ is shorter than the coherence length CL, the effect to lower the temporal coherence is obtained to some extent.

The cross-sectional area of the delay optical system 22 is $H^2$, and the area of the aperture 44 is $h^2$. Therefore, the incoming laser beam LB2 is divided (subjected to wave front division) approximately into $h^2/H^2$ ($=(h/H)\times(h/H)$) when the laser beam LB2 passes through the delay optical system 22 once. When the number of wave front division is larger, then the temporal coherence is lowered, and the uniformity of the illuminance distribution is improved. In this embodiment, for example, the width H of the delay optical system 22 is set to be about 30 to 100 mm, and the width h of the aperture 44 is set to be about 3 to 10 mm. That is, $h^2/H^2$, which is the number of wave front division, is set to be about 1/100. However, it is desirable that the number of wave front division is about 1/50 to 1/200. Accordingly, the delay optical system 22 can also serve as a one-stage optical integrator (uniformizer or homogenizer).

Next, explanation will be made in detail for the relationship among the angular aperture θ of each of the light fluxes for constructing the laser beam LB2 incoming into the delay optical system 22, the length L of the optical path of the delay optical system 22, the width H of the delay optical system 22, the width h of the aperture 44, and the number of times n of passage of the light flux through the delay optical system 22. At first, as having been explained, FIG. 6(d) corresponds to the case in which the width h of the aperture 44 is approximately 0, and the light flux, which passes through the delay optical system 22 a plurality of numbers of times, is expressed by the light flux which passes through the optical system obtained by connecting a plurality of the delay optical systems 22 in series. In this case, the numbers of times n, with which the light fluxes 52A to 52D having the angular apertures θ of the predetermined values respectively pass through the delay optical system 22, are 1 to 4.

Figure 7A:
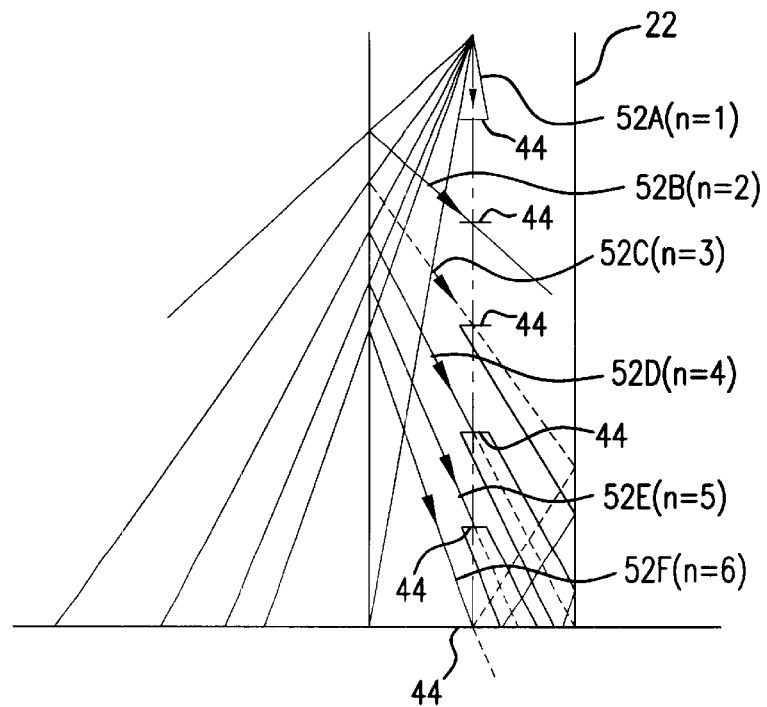
FIG. 7 shows a plurality of light fluxes which pass through the delay optical system 22 shown in FIG. 6 a variety of numbers of times depending on angular apertures.
Figure 7B:
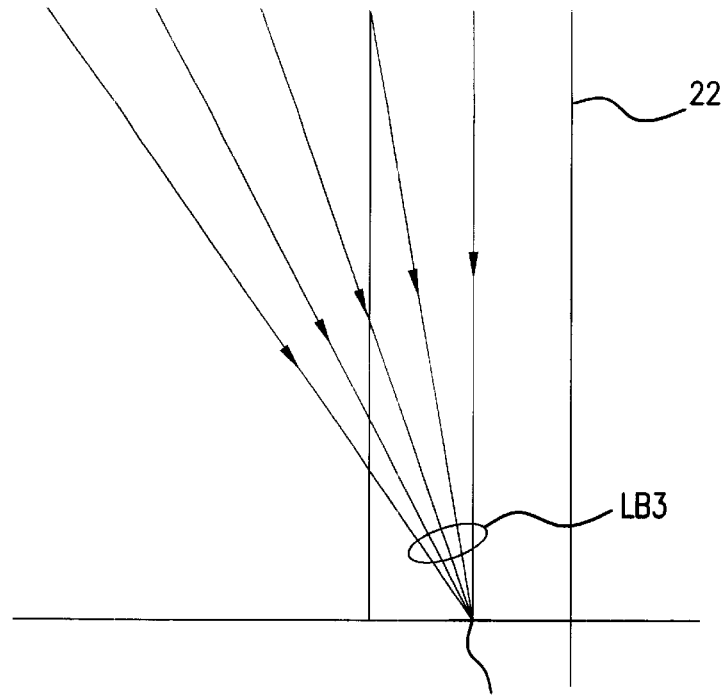

On the other hand, FIG. 7(a) corresponds to a case in which the width h of the aperture 44 has a predetermined width on condition that a plurality of the delay optical systems 22 are connected in series. In this case, the numbers of times n, with which the light fluxes 52A to 52F having the angular apertures θ of the predetermined values within a predetermined range respectively pass through the delay optical system 22, are 1 to 6. FIG. 7(b) shows a situation in which the plurality of light fluxes having the different numbers of times n of passage through the delay optical system 22 as described above are radiated as the laser beam LB3 from the aperture 44. As described above, the light flux having the predetermined angular aperture repeatedly passes through the delay optical system 22 in accordance with the reflection at the outer circumferential surfaces of the delay optical system 22, and thus the wave front division is effected.

In the following description, the computer simulation is used to determine and demonstrate the result of the way of change of the number of times n of passage through the delay optical system 22 depending on the angular aperture θ for a case in which the length L of the optical path of the delay optical system 22 is 300 mm, the width H of the delay optical system 22 is 55 mm, the width h of the aperture 44 is 5 mm, and the maximum value θmax of the angular aperture θ of the incoming laser beam LB2 is an angle to satisfy (L·tanθmax=H), i.e., 10.39°. In this case, the number N (=n−1), which is obtained by subtracting 1 from the number of times n of passage, is called "number of repeating times". Table 1 resides in a case in which the number of repeating times is 0, 1, 2, . . . , 29, 30 to express the angular aperture θ (°) of the light flux, the spacing distance from the optical axis of the position obtained when the light flux passes through the delay optical system 22 once (hereinafter referred to as "beam position")×(mm), and the total length ΣL (mm) of the optical path through which the light flux passes until the light flux is radiated from the delay optical system 22. The beam position x corresponds to the position at which each of the light fluxes makes traverse on the straight line on which the number of times n of passage is 1 as shown in FIG. 6(d). In Table 1, a light flux incoming at an angular aperture θ=0° is radiated at a total length of optical path ΣL=300 mm and N=0, and a light flux incoming at an angular aperture θ≈5.24° is radiated at a total length of optical path ΣL=600 mm and N=1.

TABLE 1

| N | θ | Position X | ΣL |
|---|---|---|---|
| 0 | 0 | 0 | 300 |
| 1 | 5.237477 | 27.5 | 600 |
| 2 | 2.624221 | 13.704167 | 900 |
| 3 | 1.750160 | 9.1361111 | 1200 |
| 4 | 1.312799 | 6.8520833 | 1500 |
| 5 | 1.050305 | 5.4816667 | 1800 |
| 6 | 0.875284 | 4.5880558 | 2100 |
| 7 | 0.750259 | 3.9154762 | 2400 |
| 8 | 0.656486 | 3.4260417 | 2700 |
| 9 | 0.583548 | 3.0453704 | 3000 |
| 10 | 0.525197 | 2.7408333 | 3300 |
| 11 | 0.477454 | 2.4916667 | 3600 |
| 12 | 0.437668 | 2.2840278 | 3900 |
| 13 | 0.404002 | 2.1083333 | 4200 |
| 14 | 0.375146 | 1.9577381 | 4500 |
| 15 | 0.350137 | 1.8272222 | 4800 |
| 16 | 0.328254 | 1.7130208 | 5100 |
| 17 | 0.308945 | 1.6122549 | 5400 |
| 18 | 0.291782 | 1.5226852 | 5700 |
| 19 | 0.276425 | 1.4425439 | 6000 |
| 20 | 0.262604 | 1.3704167 | 6300 |
| 21 | 0.250099 | 1.3051587 | 6600 |
| 22 | 0.238731 | 1.2458333 | 6900 |
| 23 | 0.228352 | 1.1916667 | 7200 |
| 24 | 0.218837 | 1.1420139 | 7500 |
| 25 | 0.210084 | 1.0963333 | 7800 |
| 26 | 0.202004 | 1.0541667 | 8100 |
| 27 | 0.194522 | 1.0151235 | 8400 |
| 28 | 0.187575 | 0.978869 | 8700 |
| 29 | 0.181107 | 0.9451149 | 9000 |
| 30 | 0.175070 | 0.9136111 | 9300 |

With only FIG. 1, it is unclear what is the angular aperture θ at which the light flux is radiated from the aperture 44 having the width h and what is the number of repeating times N (=n−1) the light flux is radiated. Accordingly, Table 2 shows the result of calculation to determine how many times the light flux having the angular aperture θ passes through the delay optical system 22 to be finally radiated from the aperture 44.

In Table 2, the vertical axis represents the combination of the beam position x (mm) of the light flux passed through the delay optical system 22 once and the length y (mm) of the optical path along the optical axis along which the light flux passes until the light flux returns to the optical axis (center) of the delay optical system 22. The horizontal axis represents the number of times n of passage of the light flux through the delay optical system 22. Table 2 shows the result of calculation for the angular aperture θ (°) corresponding to the values (x, y) of the vertical axis and the value n of the horizontal axis. In this case, the length y of the optical path along which the light flux passes is close to an integral multiple of the length L (300 mm in this case) of the optical path of the delay optical system 22. Further, only the light flux, which passes through the area having the width h in the vicinity of the optical axis after being reflected at the outer circumferential surfaces of the delay optical system 22, is radiated from the aperture 44 having the width h. This condition means, in Table 2, the fact that the light flux having the angular aperture θ, which corresponds to the portion in which the beam position x is ±h/2 (±2.5 mm in this case) about the center of the portion in which the length y of the optical path is an integral multiple of 300 mm, is radiated from the aperture 44.

22 is 55 mm, the light flux having the angular aperture θ, which is affixed with the symbol A or B just before, is radiated from the aperture 44. For the purpose of reference, a condition has been also determined, in which the width of the delay optical system 22 is 1.5×H (i.e., 1.5×55=82.5 (mm)). As a result, it has been revealed that the light flux having the angular aperture θ, which is affixed with the symbol A or C, is radiated from the aperture 44 at the corresponding number of times n. That is, the light flux

TABLE 2

| x | y | n = 1 | 2 | 3 | 4 | 5 | 6 | 7 | 8 | 9 | 10 | 11 |
|---|---|---|---|---|---|---|---|---|---|---|---|---|
| 27.5 | 272.7273 | 0.55 | B1.10 | 1.65 | C2.20 | 2.75 | 3.30 | 3.85 | 4.40 | 4.95 | 5.50 | 6.05 |
| 27 | 277.7778 | 0.54 | B1.08 | 1.62 | C2.16 | 2.70 | 3.24 | 3.78 | 4.32 | 4.86 | 5.40 | 5.94 |
| 26.5 | 283.0189 | 0.53 | B1.06 | 1.59 | C2.12 | 2.65 | 3.18 | 3.71 | 4.24 | 4.77 | 5.30 | 5.83 |
| 26 | 288.4615 | 0.52 | B1.04 | 1.56 | C2.08 | 2.60 | 3.12 | 3.64 | 4.16 | 4.68 | 5.20 | 5.72 |
| 25.5 | 294.1176 | 0.51 | B1.02 | 1.53 | C2.04 | 2.55 | 3.06 | 3.57 | 4.08 | 4.59 | 5.10 | 5.61 |
| 25 | 300 | 0.50 | B1.00 | C1.50 | C2.02 | 2.50 | 3.00 | 3.50 | 4.00 | 4.50 | 5.00 | 5.50 |
| 24.5 | 306.1224 | 0.49 | B0.98 | C1.47 | 1.96 | 2.45 | 2.94 | 3.43 | 3.92 | 4.41 | 4.90 | 5.39 |
| 24 | 312.5 | 0.48 | B0.96 | C1.44 | 1.92 | 2.40 | 2.88 | 3.36 | 3.84 | 4.32 | 4.80 | 5.28 |
| 23.5 | 319.1489 | 0.47 | B0.94 | C1.41 | 1.88 | 2.35 | 2.82 | 3.29 | 3.76 | 4.23 | 4.70 | 5.17 |
| 23 | 326.087 | 0.46 | B0.92 | C1.38 | 1.84 | 2.30 | 2.76 | 3.22 | 3.68 | 4.14 | 4.60 | 5.06 |
| 22.5 | 333.3333 | 0.45 | B0.90 | C1.35 | 1.80 | B2.25 | 2.70 | 3.15 | 3.60 | 4.05 | 4.50 | 4.95 |
| 22 | 340.9091 | 0.44 | 0.88 | C1.32 | 1.76 | B2.20 | 2.64 | 3.08 | 3.52 | 3.96 | 4.40 | 4.84 |
| 21.5 | 348.8372 | 0.43 | 0.86 | C1.29 | 1.72 | B2.15 | 2.58 | 3.01 | 3.44 | 3.87 | 4.30 | 4.73 |
| 21 | 357.1429 | 0.42 | 0.84 | C1.26 | 1.68 | B2.10 | 2.52 | 2.94 | 3.36 | 3.78 | 4.20 | 4.62 |
| 20.5 | 365.8537 | 0.42 | 0.82 | C1.23 | 1.64 | B2.05 | 2.46 | 2.87 | 3.28 | 3.69 | 4.10 | 4.51 |
| 20 | 375 | 0.40 | C0.80 | C1.20 | 1.60 | B2.00 | 2.40 | 2.80 | 3.20 | 3.60 | 4.00 | 4.40 |
| 19.5 | 384.6154 | 0.39 | C0.78 | 1.17 | 1.56 | B1.95 | 2.34 | 2.73 | 3.12 | 3.51 | 3.90 | 4.29 |
| 19 | 394.7368 | 0.38 | C0.76 | 1.14 | 1.52 | B1.90 | 2.28 | 2.66 | 3.04 | 3.42 | 3.80 | 4.18 |
| 18.5 | 405.4054 | 0.37 | C0.74 | B1.11 | 1.48 | B1.85 | 2.22 | 2.59 | 2.96 | 3.33 | 3.70 | 4.07 |
| 18 | 416.6667 | 0.36 | C0.72 | B1.08 | 1.44 | 1.80 | 2.16 | 2.52 | 2.88 | 3.24 | 3.60 | 3.96 |
| 17.5 | 428.5714 | 0.35 | C0.70 | B1.05 | 1.40 | 1.75 | 2.10 | 2.45 | 2.80 | 3.15 | 3.50 | 3.85 |
| 17 | 441.1765 | 0.34 | C0.68 | B1.02 | 1.36 | 1.70 | 2.04 | 2.38 | 2.72 | 3.06 | 3.40 | 3.74 |
| 16.5 | 454.5455 | 0.33 | C0.66 | B0.99 | 1.32 | 1.65 | 1.98 | 2.31 | 2.64 | 2.97 | 3.30 | 3.63 |
| 16 | 468.75 | 0.32 | C0.64 | B0.96 | 1.28 | 1.60 | 1.92 | 2.24 | 2.56 | 2.88 | 3.20 | 3.52 |
| 15.5 | 483.871 | 0.31 | C0.62 | B0.93 | 1.24 | 1.55 | 1.86 | 2.17 | 2.48 | 2.79 | 3.10 | 3.41 |
| 15 | 500 | 0.30 | C0.60 | B0.90 | B1.20 | C1.50 | 1.80 | 2.10 | 2.40 | 2.70 | 3.00 | 3.30 |
| 14.5 | 517.2414 | 0.29 | 0.58 | 0.87 | B1.16 | C1.45 | 1.74 | 2.03 | 2.32 | 2.61 | 2.90 | 3.19 |
| 14 | 535.7143 | 0.28 | 0.56 | 0.84 | B1.12 | C1.40 | 1.68 | 1.96 | 2.24 | 2.52 | 2.80 | 2.08 |
| 13.5 | 555.5556 | 0.27 | 0.54 | 0.81 | B1.08 | C1.35 | 1.62 | 1.89 | 2.16 | 2.43 | 2.70 | 2.97 |
| 13 | 576.9231 | 0.26 | 0.52 | C0.78 | B1.04 | C1.30 | 1.56 | 1.82 | 2.08 | 2.34 | 2.60 | 2.86 |
| 12.5 | 600 | 0.25 | 0.50 | C0.75 | B1.00 | 1.25 | 1.50 | 1.75 | 2.00 | 2.25 | 2.50 | 2.75 |
| 12 | 625 | 0.24 | 0.48 | C0.72 | B0.96 | 1.20 | 1.44 | 1.68 | 1.92 | 2.16 | 2.40 | 2.64 |
| 11.5 | 652.1739 | 0.23 | 0.46 | C0.69 | B0.92 | 1.15 | 1.38 | 1.61 | 1.84 | 2.07 | 2.30 | 2.53 |
| 11 | 681.8182 | 0.22 | 0.44 | C0.66 | B0.88 | 1.10 | 1.32 | 1.54 | 1.76 | 1.98 | 2.20 | 2.42 |
| 10.5 | 714.2857 | 0.21 | 0.42 | C0.63 | B0.84 | B1.05 | 1.26 | 1.47 | 1.68 | 1.89 | 2.10 | 2.31 |
| 10 | 750 | 0.20 | 0.40 | C0.60 | 0.80 | B1.00 | 1.20 | 1.40 | 1.60 | 1.80 | 2.00 | 2.20 |
| 9.5 | 789.4737 | 0.19 | 0.38 | C0.57 | 0.76 | B0.95 | 1.14 | 1.33 | 1.52 | 1.71 | 1.90 | 2.09 |
| 9 | 833.3333 | 0.18 | 0.36 | C0.54 | C0.72 | B0.90 | 1.08 | 1.26 | 1.44 | 1.62 | 1.80 | 1.98 |
| 8.5 | 882.3529 | 0.17 | 0.34 | 0.51 | C0.68 | B0.85 | 1.02 | 1.19 | 1.36 | 1.53 | 1.70 | 1.87 |
| 8 | 937.5 | 0.16 | 0.32 | 0.48 | C0.64 | B0.80 | 0.96 | 1.12 | 1.28 | 1.44 | 1.60 | 1.76 |
| 7.5 | 1000 | 0.15 | 0.30 | 0.45 | C0.60 | B0.75 | B0.90 | 1.05 | 1.20 | 1.35 | 1.50 | 1.65 |
| 7 | 1071.429 | 0.14 | 0.28 | 0.42 | C0.56 | 0.70 | B0.84 | 0.98 | 1.12 | 1.26 | 1.40 | 1.54 |
| 6.5 | 1153.846 | 0.13 | 0.26 | 0.39 | C0.52 | 0.65 | B0.78 | 0.91 | 1.04 | 1.17 | 1.30 | 1.43 |
| 6 | 1250 | 0.12 | 0.24 | 0.36 | C0.48 | C0.60 | B0.72 | B0.84 | 0.96 | 1.08 | 1.20 | 1.32 |
| 5.5 | 1363.636 | 0.11 | 0.22 | 0.33 | 0.44 | C0.55 | 0.66 | B0.77 | 0.88 | 0.99 | 1.10 | 1.21 |
| 5 | 1500 | 0.10 | 0.20 | 0.30 | 0.40 | C0.50 | C0.60 | B0.70 | B0.80 | 0.90 | 1.00 | 1.10 |
| 4.5 | 1666.667 | 0.09 | 0.18 | 0.27 | 0.36 | 0.45 | C0.54 | 0.63 | B0.72 | 0.81 | 0.90 | 0.99 |
| 4 | 1875 | 0.08 | 0.16 | 0.24 | 0.32 | 0.40 | C0.48 | C0.56 | B0.64 | B0.72 | 0.80 | 0.88 |
| 3.5 | 2142.857 | 0.07 | 0.14 | 0.21 | 0.28 | 0.35 | C0.42 | C0.49 | 0.56 | B0.63 | 0.70 | 0.77 |
| 3 | 2500 | 0.06 | 0.12 | 0.18 | 0.24 | 0.30 | 0.36 | C0.42 | C0.48 | B0.54 | B0.60 | 0.66 |
| 2.5 | 3000 | A0.05 | 0.10 | 0.15 | 0.20 | 0.25 | 0.30 | 0.35 | C0.40 | 0.45 | B0.50 | 0.55 |
| 2 | 3750 | A0.04 | 0.08 | 0.12 | 0.18 | 0.20 | 0.24 | 0.28 | 0.32 | 0.36 | 0.40 | 0.44 |
| 1.5 | 5000 | A0.03 | 0.06 | 0.09 | 0.12 | 0.15 | 0.18 | 0.21 | 0.24 | 0.27 | 0.30 | 0.33 |
| 1 | 7500 | A0.02 | 0.04 | 0.06 | 0.08 | 0.10 | 0.12 | 0.14 | 0.16 | 0.18 | 0.20 | 0.22 |
| 0.5 | 15000 | A0.01 | 0.02 | 0.03 | 0.04 | 0.05 | 0.06 | 0.07 | 0.08 | 0.09 | 0.10 | 0.11 |
| 0 | 300 | A0.00 | 0.00 | 0.00 | 0.00 | 0.00 | 0.00 | 0.00 | 0.00 | 0.00 | 0.00 | 0.00 |

It is possible to determine what kind of light flux is radiated from the aperture 44 having the width h after passing through the delay optical system 22 how many times, by selecting all of the portions which satisfy the condition described above for each of the angular apertures θ in Table 2. When the width H of the delay optical system θ is having the angular aperture θ, which is affixed with the symbol A, is common to the delay optical systems 22 having the different widths.

Next, Tables 3 to 5 show the results obtained by performing simulation for the number of wave front division on the basis of the result shown in Table 2. The number of wave front division is determined by the length L of the optical path, the distribution of the angular aperture of the incoming laser beam, and the value of the ratio h/H between the width h of the aperture 44 and the width H of the delay optical system 22. The angular aperture distribution successfully corresponds to the distribution of the position at which the laser beam, which has passed through the delay optical system 22 once, passes through in the cross section of the delay optical system 22. Accordingly, it is assumed that the cross-sectional configuration of the delay optical system 22 satisfies 1.5×H (=82.5 mm) in the lateral direction (designated as the X direction) and H (=55 mm) in the vertical direction (designated as the Y direction). Further, it is assumed that the width of the aperture 44 also satisfies 1.5×h (=7.5 mm) in the X direction and h (=5 mm) in the Y direction. The origin of the coordinate (X, Y) is placed at the center of the cross section of the delay optical system 22. The cross section of the delay optical system 22 is divided into eleven individuals in the X direction and the Y direction respectively by using the width of the aperture 44 as unit. Tables 3 and 4 show the results of the division in the first quadrant (0<X<1.5·H/2, 0<Y<H/2) of the cross section of the delay optical system 22.

That is, in Table 3, the area of 0<X<1.5·H/4 in the first quadrant of the cross section of the delay optical system 22 is divided by using the unit of the width of the aperture 44 in the X direction and the Y direction respectively except for the portion of the aperture 44 (portion having the width in the X direction of 1.5·h/2 and the width in the Y direction of h/2). In Table 4, the area of 1.5·H/4<X<1.5·H/2 in the first quadrant is divided in the X direction and the Y direction respectively by using the unit of the width of the aperture 44. In Tables 3 and 4, each of the divided areas is divided into six lattice points in the X direction and the Y direction respectively to show the value of the total number of times n with which the light flux, which has passed through the delay optical system 22 once and which has passed through each of the lattice points described above, passes through the delay optical system 22 until the light flux is radiated from the aperture 44 respectively. For example, an area of 0<X<1.5·h/2, 0<Y<h/2 in Table 3 is an area in the aperture 44. Therefore, the number of times n, with which the laser beam having passed through each of the lattice points in the concerning area passes through the delay optical system 22, is 1 respectively. The number of times n, with which the laser beam having passed through each of the lattice points in an area of 0<X<1.5·h/2, 9h/2<Y<H/2 in Table 3 passes through the delay optical system 22, is 2 respectively.

TABLE 3

| X = 0 | | | | | | | 1.5 · h/2 | | | | | | | | | 1.5 · H/4 | | |
|---|---|---|---|---|---|---|---|---|---|---|---|---|---|---|---|---|---|---|
| H/2 | | | | | | | | | | | | | | | | | | |
| | 2 | 2 | 2 | 2 | 2 | 2 | 8 | 14 | 6 | 10 | 4 | 4 | 4 | 4 | 6 | 6 | 6 | 6 |
| | 2 | 2 | 2 | 2 | 2 | 2 | 8 | 14 | 6 | 10 | 4 | 4 | 4 | 4 | 6 | 6 | 6 | 6 |
| | 2 | 2 | 2 | 2 | 2 | 2 | 8 | 14 | 6 | 10 | 4 | 4 | 4 | 4 | 6 | 6 | 6 | 6 |
| | 2 | 2 | 2 | 2 | 2 | 2 | 8 | 14 | 6 | 10 | 4 | 4 | 4 | 4 | 6 | 6 | 6 | 6 |
| | 2 | 2 | 2 | 2 | 2 | 2 | 8 | 14 | 6 | 10 | 4 | 4 | 4 | 4 | 6 | 6 | 6 | 6 |
| | 2 | 2 | 2 | 2 | 2 | 2 | 8 | 14 | 6 | 10 | 4 | 4 | 4 | 4 | 6 | 6 | 6 | 6 |
| 9h/2 | | | | | | | | | | | | | | | | | | |
| | 5 | 5 | 5 | 5 | 5 | 5 | 40 | 35 | 30 | 5 | 20 | 20 | 20 | 20 | 15 | 15 | 15 | 15 |
| | 5 | 5 | 5 | 5 | 5 | 5 | 40 | 35 | 30 | 5 | 20 | 20 | 20 | 20 | 15 | 15 | 15 | 15 |
| | 5 | 5 | 5 | 5 | 5 | 5 | 40 | 35 | 30 | 5 | 20 | 20 | 20 | 20 | 15 | 15 | 15 | 15 |
| | 5 | 5 | 5 | 5 | 5 | 5 | 40 | 35 | 30 | 5 | 20 | 20 | 20 | 20 | 15 | 15 | 15 | 15 |
| | 3 | 3 | 3 | 3 | 3 | 3 | 24 | 21 | 6 | 15 | 12 | 12 | 12 | 12 | 3 | 3 | 3 | 3 |
| | 3 | 3 | 3 | 3 | 3 | 3 | 24 | 21 | 6 | 15 | 12 | 12 | 12 | 12 | 3 | 3 | 3 | 3 |
| | 3 | 3 | 3 | 3 | 3 | 3 | 24 | 21 | 6 | 15 | 12 | 12 | 12 | 12 | 3 | 3 | 3 | 3 |
| | 3 | 3 | 3 | 3 | 3 | 3 | 24 | 21 | 6 | 15 | 12 | 12 | 12 | 12 | 3 | 3 | 3 | 3 |
| | 3 | 3 | 3 | 3 | 3 | 3 | 24 | 21 | 6 | 15 | 12 | 12 | 12 | 12 | 3 | 3 | 3 | 3 |
| | 4 | 4 | 4 | 4 | 4 | 4 | 8 | 28 | 12 | 20 | 4 | 4 | 4 | 4 | 12 | 12 | 12 | 12 |
| | 4 | 4 | 4 | 4 | 4 | 4 | 8 | 28 | 12 | 20 | 4 | 4 | 4 | 4 | 12 | 12 | 12 | 12 |
| | 4 | 4 | 4 | 4 | 4 | 4 | 8 | 28 | 12 | 20 | 4 | 4 | 4 | 4 | 12 | 12 | 12 | 12 |
| | 4 | 4 | 4 | 4 | 4 | 4 | 8 | 28 | 12 | 20 | 4 | 4 | 4 | 4 | 12 | 12 | 12 | 12 |
| | 4 | 4 | 4 | 4 | 4 | 4 | 8 | 28 | 12 | 20 | 4 | 4 | 4 | 4 | 12 | 12 | 12 | 12 |
| | 4 | 4 | 4 | 4 | 4 | 4 | 8 | 28 | 12 | 20 | 4 | 4 | 4 | 4 | 12 | 12 | 12 | 12 |
| | 5 | 5 | 5 | 5 | 5 | 5 | 40 | 35 | 30 | 5 | 20 | 20 | 20 | 20 | 15 | 15 | 15 | 15 |
| | 5 | 5 | 5 | 5 | 5 | 5 | 40 | 35 | 30 | 5 | 20 | 20 | 20 | 20 | 15 | 15 | 15 | 15 |
| | 5 | 5 | 5 | 5 | 5 | 5 | 40 | 35 | 30 | 5 | 20 | 20 | 20 | 20 | 15 | 15 | 15 | 15 |
| | 5 | 5 | 5 | 5 | 5 | 5 | 40 | 35 | 30 | 5 | 20 | 20 | 20 | 20 | 15 | 15 | 15 | 15 |
| | 6 | 6 | 6 | 6 | 6 | 6 | 24 | 42 | 6 | 30 | 12 | 12 | 12 | 12 | 6 | 6 | 6 | 6 |
| | 7 | 7 | 7 | 7 | 7 | 7 | 56 | 7 | 42 | 35 | 28 | 28 | 28 | 28 | 21 | 21 | 21 | 21 |
| | 8 | 8 | 8 | 8 | 8 | 8 | 8 | 56 | 24 | 40 | 8 | 8 | 8 | 8 | 24 | 24 | 24 | 24 |
| | 9 | 9 | 9 | 9 | 9 | 9 | 72 | 63 | 18 | 45 | 36 | 36 | 36 | 36 | 9 | 9 | 9 | 9 |
| | 10 | 10 | 10 | 10 | 10 | 10 | 40 | 70 | 30 | 10 | 20 | 20 | 20 | 20 | 30 | 30 | 30 | 30 |
| h/2 | | | | | | | | | | | | | | | | | | |
| | 1 | 1 | 1 | 1 | 1 | 1 | 8 | 7 | 6 | 5 | 4 | 4 | 4 | 4 | 3 | 3 | 3 | 3 |
| | 1 | 1 | 1 | 1 | 1 | 1 | 8 | 7 | 6 | 5 | 4 | 4 | 4 | 4 | 3 | 3 | 3 | 3 |
| | 1 | 1 | 1 | 1 | 1 | 1 | 8 | 7 | 6 | 5 | 4 | 4 | 4 | 4 | 3 | 3 | 3 | 3 |
| | 1 | 1 | 1 | 1 | 1 | 1 | 8 | 7 | 6 | 5 | 4 | 4 | 4 | 4 | 3 | 3 | 3 | 3 |
| | 1 | 1 | 1 | 1 | 1 | 1 | 8 | 7 | 6 | 5 | 4 | 4 | 4 | 4 | 3 | 3 | 3 | 3 |
| | 1 | 1 | 1 | 1 | 1 | 1 | 8 | 7 | 6 | 5 | 4 | 4 | 4 | 4 | 3 | 3 | 3 | 3 |
| Y = 0 | | | | | | | | | | | | | | | | | | |

TABLE 4

X = 1.5 · H/4                                                                                                                           1.5 · H/2

H/2

| 10 | 10 | 10 | 2 | 2 | 2 | 2 | 2 | 2 | 6 | 6 | 6 | 6 | 6 | 6 | 4 | 4 | 4 |
|----|----|----|---|---|---|---|---|---|---|---|---|---|---|---|---|---|---|
| 10 | 10 | 10 | 2 | 2 | 2 | 2 | 2 | 2 | 6 | 6 | 6 | 6 | 6 | 6 | 4 | 4 | 4 |
| 10 | 10 | 10 | 2 | 2 | 2 | 2 | 2 | 2 | 6 | 6 | 6 | 6 | 6 | 6 | 4 | 4 | 4 |
| 10 | 10 | 10 | 2 | 2 | 2 | 2 | 2 | 2 | 6 | 6 | 6 | 6 | 6 | 6 | 4 | 4 | 4 |
| 10 | 10 | 10 | 2 | 2 | 2 | 2 | 2 | 2 | 6 | 6 | 6 | 6 | 6 | 6 | 4 | 4 | 4 |
| 10 | 10 | 10 | 2 | 2 | 2 | 2 | 2 | 2 | 6 | 6 | 6 | 6 | 6 | 6 | 4 | 4 | 4 |

9h/2

| 5 | 5 | 5 | 10 | 10 | 10 | 10 | 10 | 10 | 15 | 15 | 15 | 15 | 15 | 15 | 20 | 20 | 20 |
|---|---|---|----|----|----|----|----|----|----|----|----|----|----|----|----|----|----|
| 5 | 5 | 5 | 10 | 10 | 10 | 10 | 10 | 10 | 15 | 15 | 15 | 15 | 15 | 15 | 20 | 20 | 20 |
| 5 | 5 | 5 | 10 | 10 | 10 | 10 | 10 | 10 | 15 | 15 | 15 | 15 | 15 | 15 | 20 | 20 | 20 |
| 5 | 5 | 5 | 10 | 10 | 10 | 10 | 10 | 10 | 15 | 15 | 15 | 15 | 15 | 15 | 20 | 20 | 20 |
| 15 | 15 | 15 | 6 | 6 | 6 | 6 | 6 | 6 | 3 | 3 | 3 | 3 | 3 | 3 | 12 | 12 | 12 |
| 15 | 15 | 15 | 6 | 6 | 6 | 6 | 6 | 6 | 3 | 3 | 3 | 3 | 3 | 3 | 12 | 12 | 12 |
| 15 | 15 | 15 | 6 | 6 | 6 | 6 | 6 | 6 | 3 | 3 | 3 | 3 | 3 | 3 | 12 | 12 | 12 |
| 15 | 15 | 15 | 6 | 6 | 6 | 6 | 6 | 6 | 3 | 3 | 3 | 3 | 3 | 3 | 12 | 12 | 12 |
| 15 | 15 | 15 | 6 | 6 | 6 | 6 | 6 | 6 | 3 | 3 | 3 | 3 | 3 | 3 | 12 | 12 | 12 |
| 20 | 20 | 20 | 4 | 4 | 4 | 4 | 4 | 4 | 12 | 12 | 12 | 12 | 12 | 12 | 4 | 4 | 4 |
| 20 | 20 | 20 | 4 | 4 | 4 | 4 | 4 | 4 | 12 | 12 | 12 | 12 | 12 | 12 | 4 | 4 | 4 |
| 20 | 20 | 20 | 4 | 4 | 4 | 4 | 4 | 4 | 12 | 12 | 12 | 12 | 12 | 12 | 4 | 4 | 4 |
| 20 | 20 | 20 | 4 | 4 | 4 | 4 | 4 | 4 | 12 | 12 | 12 | 12 | 12 | 12 | 4 | 4 | 4 |
| 20 | 20 | 20 | 4 | 4 | 4 | 4 | 4 | 4 | 12 | 12 | 12 | 12 | 12 | 12 | 4 | 4 | 4 |
| 20 | 20 | 20 | 4 | 4 | 4 | 4 | 4 | 4 | 12 | 12 | 12 | 12 | 12 | 12 | 4 | 4 | 4 |
| 5 | 5 | 5 | 10 | 10 | 10 | 10 | 10 | 10 | 15 | 15 | 15 | 15 | 15 | 15 | 20 | 20 | 20 |
| 5 | 5 | 5 | 10 | 10 | 10 | 10 | 10 | 10 | 15 | 15 | 15 | 15 | 15 | 15 | 20 | 20 | 20 |
| 5 | 5 | 5 | 10 | 10 | 10 | 10 | 10 | 10 | 15 | 15 | 15 | 15 | 15 | 15 | 20 | 20 | 20 |
| 5 | 5 | 5 | 10 | 10 | 10 | 10 | 10 | 10 | 15 | 15 | 15 | 15 | 15 | 15 | 20 | 20 | 20 |
| 30 | 30 | 30 | 6 | 6 | 6 | 6 | 6 | 6 | 6 | 6 | 6 | 6 | 6 | 6 | 12 | 12 | 12 |
| 35 | 35 | 35 | 14 | 14 | 14 | 14 | 14 | 14 | 21 | 21 | 21 | 21 | 21 | 21 | 28 | 28 | 28 |
| 40 | 40 | 40 | 8 | 8 | 8 | 8 | 8 | 8 | 24 | 24 | 24 | 24 | 24 | 24 | 8 | 8 | 8 |
| 45 | 45 | 45 | 18 | 18 | 18 | 18 | 18 | 18 | 9 | 9 | 9 | 9 | 9 | 9 | 36 | 36 | 36 |
| 10 | 10 | 10 | 10 | 10 | 10 | 10 | 10 | 10 | 30 | 30 | 30 | 30 | 30 | 30 | 20 | 20 | 20 | h/2

| 5 | 5 | 5 | 2 | 2 | 2 | 2 | 2 | 2 | 3 | 3 | 3 | 3 | 3 | 3 | 4 | 4 | 4 |
|---|---|---|---|---|---|---|---|---|---|---|---|---|---|---|---|---|---|
| 5 | 5 | 5 | 2 | 2 | 2 | 2 | 2 | 2 | 3 | 3 | 3 | 3 | 3 | 3 | 4 | 4 | 4 |
| 5 | 5 | 5 | 2 | 2 | 2 | 2 | 2 | 2 | 3 | 3 | 3 | 3 | 3 | 3 | 4 | 4 | 4 |
| 5 | 5 | 5 | 2 | 2 | 2 | 2 | 2 | 2 | 3 | 3 | 3 | 3 | 3 | 3 | 4 | 4 | 4 |
| 5 | 5 | 5 | 2 | 2 | 2 | 2 | 2 | 2 | 3 | 3 | 3 | 3 | 3 | 3 | 4 | 4 | 4 |
| 5 | 5 | 5 | 2 | 2 | 2 | 2 | 2 | 2 | 3 | 3 | 3 | 3 | 3 | 3 | 4 | 4 | 4 |

Y = 0

In Tables 3 and 4, it can be regarded that the light fluxes of the laser beams passing through the respective lattice points, for which the value of the number of times n of passage through the delay optical system 22 differs, scarcely cause interference with each other, because the optical path length differs by not less than the coherence distance. That is, the light fluxes, which have different numbers of times n of passage, are substantially incoherent with each other. Accordingly, the number of light fluxes which are substantially incoherent with each other is summarized in Table 5, on the basis of Tables 3 and 4.

In Table 5, n represents the entire number of times of passage through the delay optical system 22 of the light flux passing through each of the lattice points, NA represents the number of light fluxes (lattice points) having the number of times of passage of n, and NB represents the ratio of the number of light fluxes NA with respect to the total number of light fluxes. According to Table 5, it is understood that there are twenty-two sets of the light fluxes which are substantially incoherent with each other. This means the fact that the temporal coherence of the laser beam LB2 coming into the delay optical system 22 is sufficiently reduced.

TABLE 5

| n | NA | NB (%) |
|---|----|--------|
| 1 | 36 | 3 |
| 2 | 108 | 8 |
| 3 | 140 | 11 |
| 4 | 198 | 15 |
| 5 | 104 | 8 |
| 6 | 130 | 10 |
| 7 | 13 | 1 |
| 8 | 38 | 3 |
| 9 | 16 | 1 |
| 10 | 88 | 1 |
| 11 | 0 | 0 |
| 12 | 108 | 8 |
| 13 | 0 | 0 |
| 14 | 12 | 1 |
| 15 | 100 | 8 |
| 16 | 0 | 0 |
| 17 | 0 | 0 |
| 18 | 7 | 1 |
| 19 | 0 | 0 |
| 20 | 87 | 7 |
| 21 | 15 | 1 |
| 22 | 0 | 0 |
| 23 | 0 | 0 |
| 24 | 17 | 1 |
| 25 | 0 | 0 |
| 26 | 0 | 0 |
| 27 | 0 | 0 |
| 28 | 13 | 1 |

TABLE 5-continued

| n | NA | NB (%) |
|---|----|----|
| 29 | 0 | 0 |
| 30 | 23 | 2 |
| 31 | 0 | 0 |
| 32 | 0 | 0 |
| 33 | 0 | 0 |
| 34 | 0 | 0 |
| 35 | 12 | 1 |
| 36 | 7 | 1 |
| 37 | 0 | 0 |
| 38 | 0 | 0 |
| 39 | 0 | 0 |
| 40 | 13 | 1 |
| 41 | 0 | 0 |
| 42 | 2 | 0 |
| 43 | 0 | 0 |
| 44 | 0 | 0 |
| 45 | 4 | 0 |
| 46 | 0 | 0 |
| 47 | 0 | 0 |
| 48 | 0 | 0 |
| 49 | 0 | 0 |
| 50 | 0 | 0 |
| 51 | 0 | 0 |
| 52 | 0 | 0 |
| 53 | 0 | 0 |
| 54 | 0 | 0 |
| 55 | 0 | 0 |
| 56 | 2 | 0 |
| 57 | 0 | 0 |
| 58 | 0 | 0 |
| 59 | 0 | 0 |
| 60 | 0 | 0 |
| 61 | 0 | 0 |
| 62 | 0 | 0 |
| 63 | 1 | 0 |
| 64 | 0 | 0 |
| 65 | 0 | 0 |
| 66 | 0 | 0 |
| 67 | 0 | 0 |
| 68 | 0 | 0 |
| 69 | 0 | 0 |
| 70 | 1 | 0 |
| 71 | 0 | 0 |
| 72 | 1 | 0 |
| 73 | 0 | 0 |
| 74 | 0 | 0 |
| 75 | 0 | 0 |
| 76 | 0 | 0 |
| 77 | 0 | 0 |
| 78 | 0 | 0 |
| 79 | 0 | 0 |
| 80 | 0 | 0 |
| 81 | 0 | 0 |
| 82 | 0 | 0 |
| 83 | 0 | 0 |
| 84 | 0 | 0 |
| 85 | 0 | a |
| 86 | 0 | 0 |
| 87 | 0 | 0 |
| 88 | 0 | 0 |
| 89 | 0 | 0 |
| 90 | 0 | 0 |
| 91 | 0 | 0 |
| 92 | 0 | 0 |
| 93 | 0 | 0 |
| 94 | 0 | 0 |
| 95 | 0 | 0 |
| 96 | 0 | 0 |
| 97 | 0 | 0 |
| 98 | 0 | 0 |
| 99 | 0 | 0 |
| 100 | 0 | 0 |

On the other hand, in the delay optical system 26 shown in FIG. 2 (FIG. 6), the aperture 44, which is formed on the light-incoming/outgoing plane 43, is the window. However, in this arrangement, it is feared to cause any light amount loss of the incoming laser beam LB2 and the outgoing laser beam LB3 due to the total reflection or the reflection at the light-incoming/outgoing plane 43. In view of the above, explanation will be made with reference to FIG. 8 for embodiments to lower the light amount loss of the incoming laser beam and the outgoing laser beam.

Figure 8A:
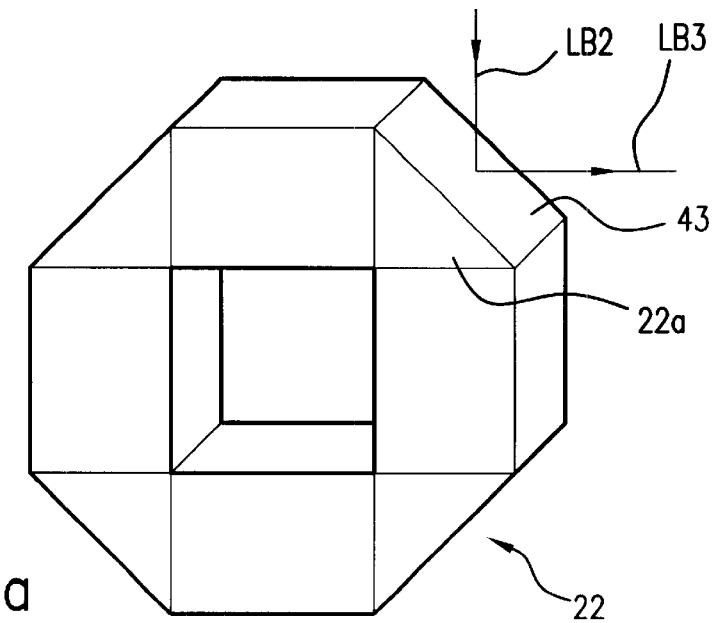
FIG. 8(a) shows a perspective view illustrating the delay optical system 22 shown in FIG. 2.
Figure 8B:
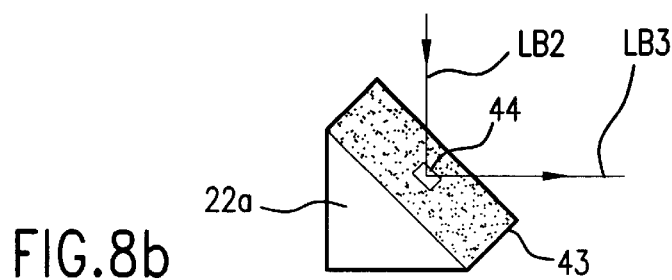
FIG. 8(b) shows a perspective view illustrating an aperture 44 disposed at a light-incoming/outgoing plane 43 of the delay optical system 22 shown in FIG. 2.

At first, FIG. 8(a) shows a perspective view illustrating the appearance of the delay optical system 22 shown in FIG. 2. With reference to FIG. 8(a), the laser beam LB2 comes into the light-incoming/outgoing plane 43 which is the inclined surface of the rectangular prism 22a as a part of the delay optical system 22. The laser beam LB3 is radiated from the light-incoming/outgoing plane 43. On this assumption, in the system shown in FIG. 2, the light-incoming/outgoing plane 43 is used as the reflecting surface, and the rectangular aperture 44 is provided for a part thereof as shown in FIG. 8(b). In this system, the aperture 44, which is inclined by 45° with respect to the optical axis, is used for both of the light-incoming window and the light-outgoing window. The outgoing laser beam LB3 is inclined with respect to the optical axis. Accordingly, in the example shown in FIG. 2, the wave front of the laser beam LB3 is adjusted to be substantially perpendicular to the optical axis by using the aberration-correcting prism 23. In the case of the scanning exposure type as in this embodiment, it is desirable that the pitch direction of the interference fringe (speckle) having the highest contrast formed in the illumination area of the reticle R is allowed to make intersection by about 45° with respect to the scanning direction for the reticle R, for the following reason. That is, by doing so, the influence of the uneven illuminance is mitigated owing to the averaging effect in the scanning direction. In order to allow the pitch direction of the interference fringe on the reticle R to make intersection by about 45° with respect to the scanning direction as described above, the delay optical system 22 may be rotated by a predetermined angle about the axis of the normal line of the aperture 44, and the aberration-correcting prism 23 may be also rotated, if necessary, with reference to FIG. 2.

Figure 8C:
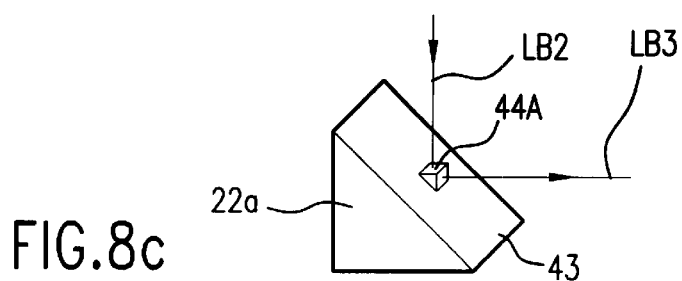
FIG. 8(c) shows a perspective view illustrating a first modified embodiment of a window provided on the light-incoming/outgoing plane 43.
Figure 8D:
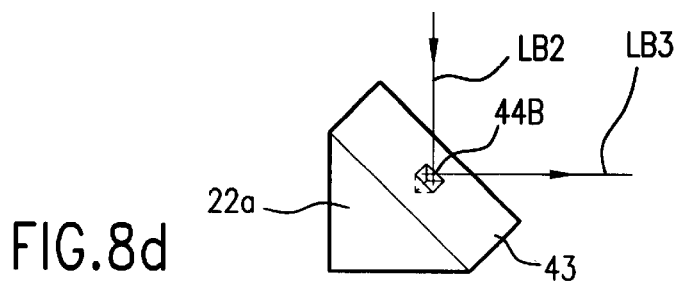
FIG. 8(d) shows a perspective view illustrating a second modified embodiment of the window provided on the light-incoming/outgoing plane 43.

On the other hand, in an example shown in FIG. 8(c), a small-sized rectangular prism 44A is fixed on the light-incoming/outgoing plane 43 of the rectangular prism 22a. One of the two orthogonal surfaces of the rectangular prism 44A is used as a light-incoming window for the laser beam LB2, and the other is used as a light-outgoing window for the laser beam LB3. This system is advantageous in that the light amount loss is small for the incoming laser beam LB2 and the outgoing laser beam LB3. In an example shown in FIG. 8(d), a rectangular prism type recess 44B having a small size is formed on the light-incoming/outgoing plane 43 of the rectangular prism 22a. One of the two orthogonal surfaces of the recess 44B is used as a light-incoming window for the laser beam LB2, and the other is used as a light-outgoing window for the laser beam LB3. This system is also advantageous in that the light amount loss is small for the laser beams LB2, LB3. In the examples shown in FIGS. 8(c) and 8(d), it is possible to further decrease the light amount loss of the laser beam repeatedly passing through the delay optical system 22 by utilizing the light-incoming/outgoing plane 43 as a total reflection plane.

Next, modified embodiments of the delay optical system 22 shown in FIG. 2 will be explained with reference to FIG. 9.

Figure 9A:
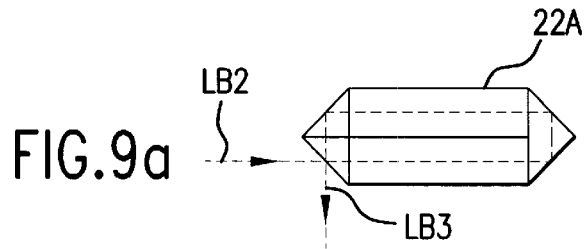
FIG. 9 shows a variety of modified embodiments of the delay optical system 22 shown in FIG. 2.
Figure 9B:
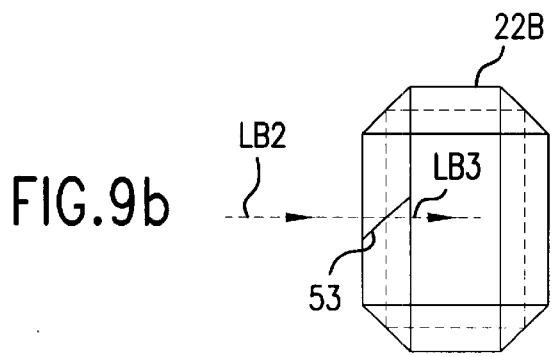
Figure 9C:
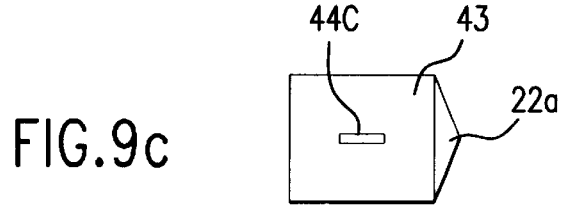

A delay optical system 22A shown in FIG. 9(a) is constructed such that two rectangular prisms and two prism-shaped (or probably columnar) rod members are arranged to make tight contact in a ring-shaped configuration. The delay optical system 22A is advantageous to consequently decrease the required space. In FIG. 9(b), a joined plane 53 is provided obliquely at a central portion of a prism-shaped member of a ring-shaped delay optical system 22B. A reflecting section is formed beforehand at a central portion of the joined plane 53 as the light-incoming/outgoing plane. The reflecting section is used as a light-incoming window for the laser beam LB2, and the back surface of the reflecting section is used as a light-outgoing window for the laser beam LB3. This exemplary arrangement is effective when there is no space for bending the laser beams LB2, LB3.

Figure 9D:
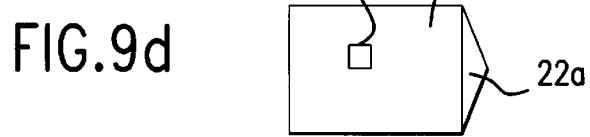

FIG. 9(d) shows an example in which an oblong aperture 44C, which serves as the window, is formed at a central portion of a light-incoming/outgoing plane 43 of a rectangular prism 22a for constructing a delay optical system 22. FIG. 9(d) shows an example in which a substantially square aperture 44D is formed as the window at a position that is deviated (eccentric) from the center of a light-incoming/outgoing plane 43 of a rectangular prism 22a. In the examples shown in FIGS. 9(c) and 9(d), the reflection condition for the incoming laser beam differs between the vertical direction and the horizontal direction. Therefore, it is possible to increase the number of incoherent light fluxes, and it is possible to further reduce the temporal coherence. Especially, in the example shown in FIG. 9(d), the reflection condition for the incoming laser beam differs for the four surfaces in total of the upper and lower two surfaces and the right and left two surfaces. Therefore, the effect to reduce the temporal coherence is further enhanced.

Figure 9E:
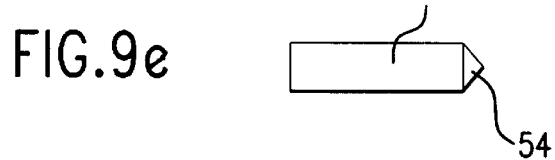
Figure 9F:
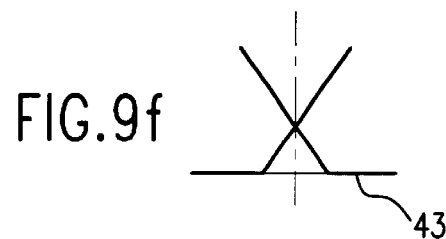
Figure 9G:
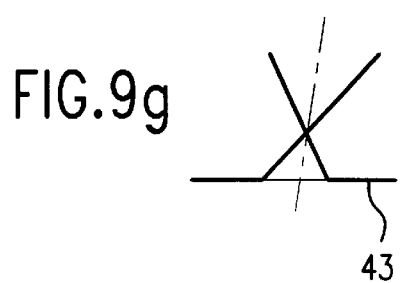

FIG. 9(e) shows an example in which the entire surface of an inclined surface 43A of a rectangular prism 54 as a part for constructing a delay optical system is a half mirror. The inclined surface 43A is used as the light-incoming window and the light-outgoing window as a whole. In this example, most of the incoming laser beam is radiated after passing through the delay optical system three times. Therefore, the number of incoherent light fluxes is small. However, an advantage is obtained such that the temporal coherence can be reduced with the simple arrangement. FIG. 9(f) shows an example in which the laser beam is allowed to come into the light-incoming/outgoing plane 43 of the delay optical system so that there is no inclination of telecentricity. On the other hand, FIG. 9(g) shows an example in which the laser beam is allowed to come into the light-incoming/outgoing plane 43 with a predetermined inclination of telecentricity. When the laser beam, which has a predetermined inclination of telecentricity, is allowed to come into the delay optical system as described above, it is possible to provide mutually different reflection conditions in the delay optical system for the four surfaces, in the same manner as in the case in which the position of the aperture 44 is eccentric as in the example shown in FIG. 9(d). Thus, it is possible to greatly reduce the temporal coherence.

As described above, in this embodiment, the exposure method based on the use of the KrF excimer laser has been explained. However, the delay optical system 22 (or 22A, 22B or the like) will be also effective when the laser beam having coherence and having a shorter wavelength will be used as the exposure light beam in future, including, for example, the ArF excimer laser (193 nm), the $F_2$ laser (157 nm), the $Ar_2$ laser beam (wavelength: 126 nm), the high harmonic wave of the YAG laser, and the high harmonic wave of the semiconductor laser. However, when the laser beam having such a short wavelength is used, it is feared that the delay optical system 22 is damaged due to any concentration of energy, or any cloudy substance, which is formed by the chemical reaction between the laser beam and any minute organic substance or the like with which the atmosphere is contaminated, adheres to the light-incoming/outgoing plane 43 of the delay optical system 22. Accordingly, the rectangular prism 22a (light-incoming/outgoing plane 43) of the delay optical system 22 may be exchangeable. Alternatively, a transparent cover may be provided so that the aperture 44 of the light-incoming/outgoing plane 43 is covered therewith in order to avoid any adhesion of the cloudy substance. The interior of the cover may be purged with a gas which is clear and which has a high transmittance with respect to the laser beam. In order to avoid any generation of organic matter or the like, it is desirable that the plurality of optical members (for example, rod members) for constructing the delay optical system 22 are held in an integrated manner with a press ring or the like, without using, for example, the adhesive or the filler.

There is such a possibility that the internal reflection effect is decreased and a part of the light flux is lost at the connecting portion (bent portion) of the rod member for constructing the delay optical system 22. The light amount loss is increased as the maximum angle of the angular aperture of the incoming laser beam LB2 becomes large. Therefore, it is also an important factor for enhancing the efficiency of the use of the laser beam to design the delay optical system 22 so that there is no bent portion at the position at which the light flux having a large angular aperture is reflected at the inner surface of the rod member.

When the interference fringes slightly remain on the reticle even when the delay optical system 22 of the embodiment described above is introduced, the angle of inclination of the laser beam LB2 coming into the delay optical system 22 with respect to the optical axis may be periodically vibrated.

In the embodiment described above, the fly's eye lens 25 is used as the optical integrator disposed on the light-outgoing side. However, a rod integrator may be used in place of the fly's eye lens 25.

In the exemplary arrangement shown in FIG. 2, the delay optical system 22 is arranged after the modified illumination mechanism 19. However, the delay optical system 22 may be arranged before the modified illumination mechanism 19. Further, when the intensity distribution of the laser beam LB is relatively flat, the modified illumination mechanism 19 may be simplified.

Figure 10:
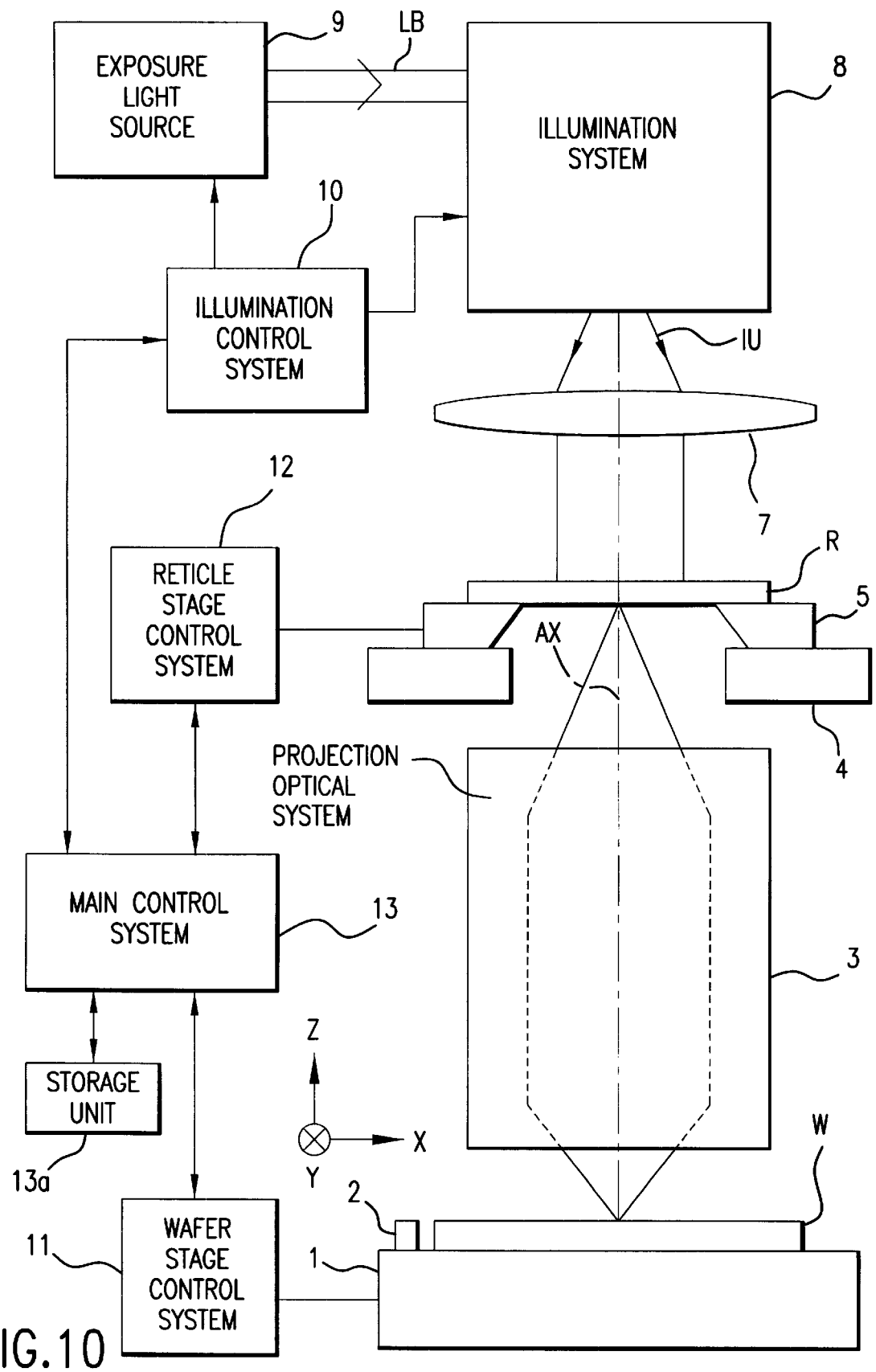
FIG. 10 shows a schematic arrangement illustrating a projection exposure apparatus according to a second embodiment of the present invention.
Figure 11:
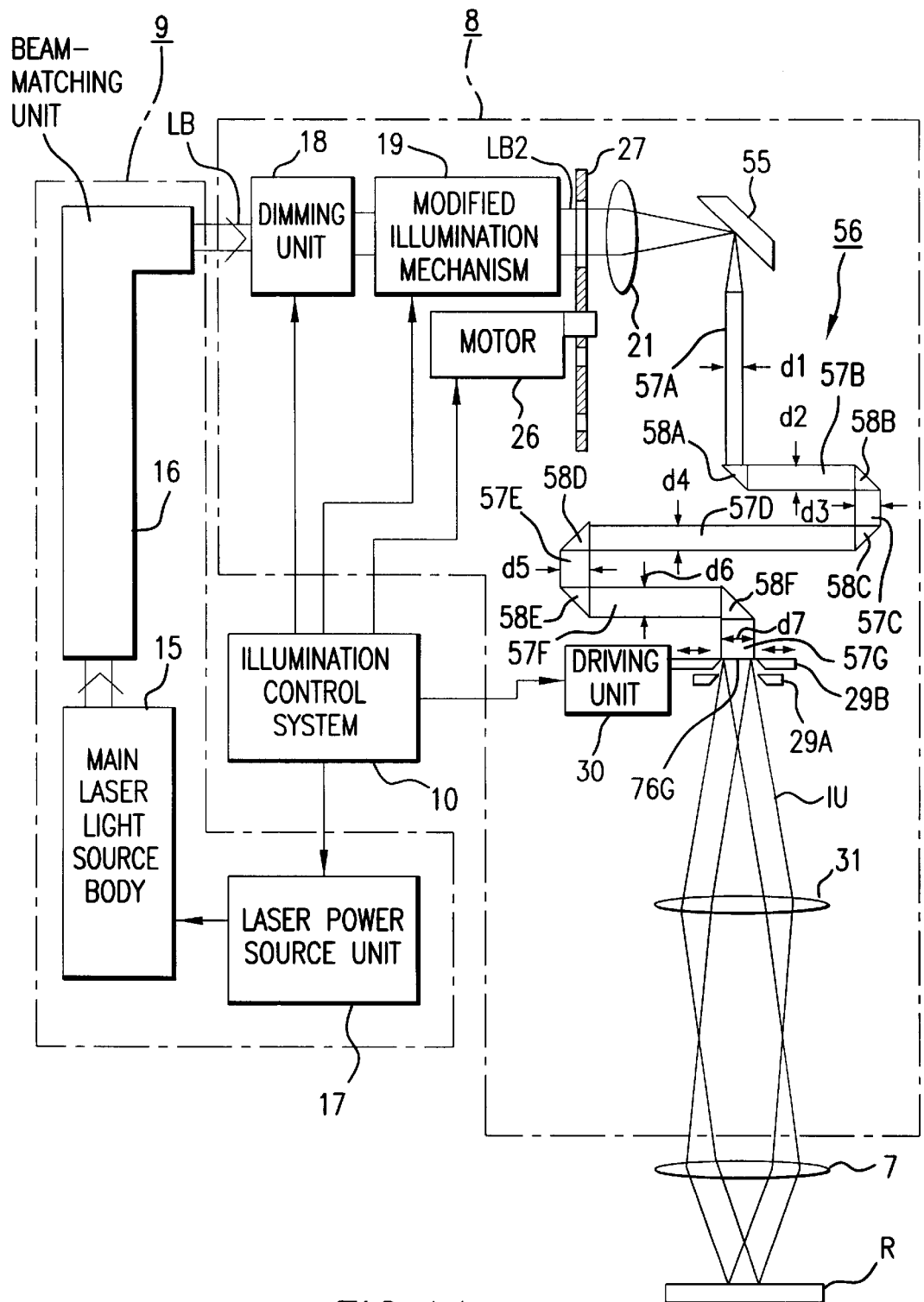
FIG. 11 shows, with partial cutaway, an arrangement illustrating, for example, an illumination system 8 shown in FIG. 10.

Next, a second embodiment of the present invention will be explained with reference to FIGS. 10 to 16. Also in this embodiment, the present invention is applied to a case in which the exposure is performed with a projection exposure apparatus based on the step-and-scan system. In FIGS. 10 and 11, components or parts corresponding to those shown in FIGS. 1 to 5 are designated by the same reference numerals, detailed explanation of which will be omitted.

FIG. 10 shows a schematic arrangement of the projection exposure apparatus of this embodiment. With reference to FIG. 10, a laser beam LB, which has a narrow-banded wavelength as an illumination light beam (exposure light beam) for exposure and which is pulse-emitted from an exposure light source 9, comes into an illumination system 8. A KrF excimer laser light source (oscillation wavelength: 248 nm), in which the oscillation wavelength width is narrow-banded, for example, into about 0.1 to 1 pm, is used as the exposure light source 9 of this embodiment in the same manner as in the embodiment shown in FIG. 1. Other than the above, the present invention is also applicable to a case to use an exposure light source for generating, for example, a laser beam having high coherence such as ArF excimer laser (wavelength: 193 nm) and $F_2$ laser (wavelength: 157 nm) as well as a high harmonic wave generator for YAG laser. Further, for example, an X-ray source can be also used for the exposure light source 9. The light sources as described above are pulse light sources.

The illumination system 8 is provided with an optical system for converting the cross-sectional configuration of the incoming light flux into a desired shape in the same manner as in the embodiment shown in FIG. 1, a bent type rod-shaped optical member to serve as a multiple light source-forming optical system or an optical integrator (uniformizer or homogenizer), a relay lens system, and a field diaphragm (reticle blind). The incoming laser beam LB is converted by the illumination system 8 into an illumination light beam IU which has a predetermined numerical aperture and which has a uniformized illuminance distribution. The illumination light beam IU passes through a condenser lens system 7, and a pattern plane of a reticle R is illuminated with a slender illumination area having a rectangular configuration.

A storage unit 13a, which is composed of, for example, a magnetic disk unit for storing, for example, the exposure condition, is connected to a main control system 13 of this embodiment. An uneven illuminance sensor 2, which is composed of a photoelectric detector, is fixed in the vicinity of a wafer W on a wafer stage 1. As shown in FIG. 16(b), a pin hole-shaped light-receiving section 2a is formed on the upper surface of the uneven illuminance sensor 2. A photoelectrically converted signal, which is obtained from the illumination light beam IU coming into the light-receiving section 2a, is supplied to the main control system 13 shown in FIG. 10. The arrangement of the projection exposure apparatus shown in FIG. 10 other than the above is substantially the same as the arrangement of the embodiment shown in FIG. 1, detailed explanation of which will be omitted.

Next, explanation will be made in detail for the arrangement of the exposure light source 9 and the illumination system 8 of this embodiment.

FIG. 11 shows the arrangement of the exposure light source 9 and the illumination system 8 shown in FIG. 10.

With reference to FIG. 11, the linearly polarized laser beam LB, which is radiated from the exposure light source 9 constructed in the same manner as the embodiment shown in FIG. 2, comes into the illumination system 8.

In the illumination system 8, the laser beam LB is dimmed to have a predetermined illuminance (=average pulse energy per unit area x oscillation frequency) by the aid of a dimming unit 18. When the pulse emission type laser beam LB (illumination light beam IU) is used as the exposure light beam or the illumination light beam as in this embodiment, it is necessary that the number of exposure pulses N (N is an integer) for each point on the wafer is not less than a predetermined minimum number of pulses $N_{min}$ which is determined depending on the dispersion of the pulse energy, in order to allow the totalized exposure amount at each point on the wafer to be included within an allowable range with respect to a proper value.

Further, the proportional constant is previously determined between the illuminance of the laser beam LB on the light-incoming plane of the dimming unit 18 and the illuminance of the illumination light beam IU on the wafer W for a case in which a standard aperture diaphragm is used for the illumination optical system. The proportional constant is stored in a storage unit in the illumination control system 10 shown in FIG. 11. The illumination control system 10 sets the dimming ratio (transmittance) for the dimming unit 18 so that the postulated number of exposure pulses N at each point on the wafer is not less than the minimum number of pulses $N_{min}$, from the proportional constant, the present state of the aperture diaphragm, and the average pulse energy of the laser beam LB on the light-incoming plane.

With reference to FIG. 11, the laser beam LB, which has passed through the dimming unit 18, is radiated after being shaped by a modified illumination mechanism 19 so that the illuminance distribution in cross section is in a predetermined state (for example, circular, annular, and eccentric plural light sources) and the illuminance distribution is a substantially uniform distribution. A diaphragm-switching member 27, which is formed with a variety of aperture diaphragms (σ diaphragms) for determining the illumination condition (for example, ordinary illumination, modified illumination, and illumination with small coherence factor (small σ value)) and the σ value, is rotatably arranged in the vicinity of the light-outgoing plane of the modified illumination mechanism 19, i.e., at the optical Fourier transformation plane (pupil plane) with respect to the pattern plane of the reticle R or in the vicinity thereof in this embodiment. The illumination control system 10 rotates the diaphragm-switching member 27 by the aid of a driving motor 26 to arrange a predetermined aperture diaphragm at the light-outgoing plane of the modified illumination mechanism 19. Thus, the illumination condition and the angular aperture of the laser beam (σ value) are set.

A laser beam LB2, which is radiated from the modified illumination mechanism 19 to pass through the predetermined aperture diaphragm, is collected by a light-collecting lens 21 and reflected by a mirror 55 to once form a light source image (secondary light source). After that, the laser beam LB2 behaves as a light flux having a predetermined angular aperture (σ value), and it comes into a bent type rod-shaped optical member 56 which serves as a multiple light source-forming optical system of the present invention. The bent type rod-shaped optical member 56 is constructed such that seven quadratic prism-shaped rod members 57A to 57G, which have outer surfaces to serve as reflecting surfaces respectively, are successively connected in a bent manner with intervening rectangular prism type mirror members 58A to 58F for bending the optical path by 90°. Each of the rod members 57A to 57G and the mirror members 58A to 58F is formed of an optical material which is transmissive with respect to the laser beam LB2.

The laser beam LB2 is reflected by the mirror 55, and it comes into the first stage rod member 57A. The laser beam LB2 successively passes through the mirror member 58A, the rod member 57B, the mirror member 58B, the rod member 57C, the mirror member 58C, the rod member 57D, the mirror member 58D, the rod member 57E, the mirror member 58E, the rod member 57F, the mirror member 58F, and the final stage rod member 57G in accordance with the reflection (or total reflection) at the outer surfaces. The laser beam LB2 is radiated from a light-outgoing plane 76G of the rod member 57G (as described in detail later on). The optical path, which ranges from the interior of the rod member 57A to the interior of the rod member 57G, corresponds to the light-feeding optical path of the present invention. The light-outgoing plane 76G is set to be substantially conjugate with the pattern plane of the reticle R as an illumination objective.

A movable blind 29B is arranged at a position which is close to the light-outgoing plane 76G. A fixed blind 29A is arranged at a position which is defocused by a predetermined amount from the movable blind 29B. In this arrangement, the slit-shaped illumination area on the reticle R is defined by an aperture of the fixed blind 29A. The movable blind 29B plays a role to shield the aperture of the fixed blind 29A in order that any unnecessary pattern is transferred onto the wafer upon the start and the end of the scanning exposure for each of the shot areas on the wafer. The illumination control system 10 controls the operation of the movable blind 29B by the aid of a driving unit 30 in accordance with the synchronization information supplied from the main control system 13.

The illumination light beam IU, which has passed through the movable blind 29B and the aperture of the fixed blind 29A, illuminates the pattern plane of the reticle R via a relay lens system 31 and a condenser lens system 7. Although not shown, for example, a beam splitter is arranged between the fixed blind 29A and the relay lens system 31. An integrator sensor is provided, which photoelectrically converts the illumination light beam incorporated by the aid of the beam splitter. A detection signal obtained by the integrator sensor is supplied to the illumination control system 10. The relationship between the detection signal of the integrator sensor and the illuminance of the illumination light beam IU on the wafer W is previously measured, and it is stored in the storage unit in the illumination control system 10. The illumination control system 10 controls, for example, the laser power source 17 and the dimming unit 18 so that the illuminance of the illumination light beam IU on the wafer W has a target value set by the main control system 13.

Next, the arrangement of the modified illumination mechanism 19 of this embodiment is the same as that of the modified illumination mechanism of the first embodiment having been explained with reference to FIGS. 3 and 4. It is possible to perform the ordinary illumination and the modified illumination (including the annular illumination) while the light amount loss is extremely minute. Further, it is possible to continuously and arbitrarily change the condition of the annular illumination (for example, the outer diameter, the inner diameter, and the annular ratio of the secondary light source). Further, it is possible to switch the σ value of the illumination optical system in a state in which the light amount loss is substantially absent, by switching the magnification of the laser beam LB2 by the aid of the beam expander 42A, 42B.

The modified illumination mechanism 19A based on the diffracting optical element (DOE) system or the modified embodiment thereof may be used in place of the modified illumination mechanism 19 of this embodiment, as having been explained with reference to FIG. 5. Accordingly, it is possible to switch the ordinary illumination and the modified illumination without causing any substantial loss of the light amount of the incoming laser beam LB. In this arrangement, the light-outgoing plane 49 shown in FIG. 5 corresponds to the arrangement plane of the diaphragm-switching member 27 shown in FIG. 11.

With reference to FIG. 11 again, a laser beam LB1, which has passed through the modified illumination mechanism 19, comes into the bent type rod-shaped optical member 56 via the diaphragm-switching member 27, the light-collecting lens 21, and the mirror 55. Explanation will be made in detail below for the arrangement and the function of the bent type rod-shaped optical member 56. At first, a reflective film of a metal film such as chromium or a multilayered reflective film may be formed beforehand on the outer surfaces (reflecting surfaces) of the rod members 57A to 57G and the mirror members 58A to 58F which constitute the bent type rod-shaped optical member 56. Other than the above, the total reflection may be utilized, for example, for the side surfaces of the prism-shaped rod members 57A to 57G and the reflecting surfaces of the mirror members 58A to 58F.

It is necessary that the optical members, which constitute the rod members 57A to 57G and the mirror members 58A to 58G, have good transmittance with respect to the laser beam LB2 (exposure light beam). Such an optical member is exemplified as follows. That is, when the laser beam LB2 is the KrF excimer laser (wavelength: 248 nm), it is possible to use, for example, fused quartz glass or synthetic quartz glass. When the laser beam LB2 is the ArF excimer laser (wavelength: 193 nm), it is possible to use, for example, synthetic quartz glass or fluorite ($CaF_2$). When the laser beam LB2 is the $F_2$ laser (wavelength: 157 nm), it is possible to use, for example, synthetic quartz glass doped with an impurity such as fluorine and fluorite or magnesium fluoride ($MgF_2$). When the laser beam LB2 has a wavelength of not more than about 150 nm, for example, as in the case of the $Kr_2$ laser (wavelength: 146 nm), it is possible to use, for example, fluorite or magnesium fluoride. Even when the material having a high transmittance as described above is used for the bent type rod-shaped optical member 56, it is feared that the heat is generated when the laser beam LB2 repeatedly passes through the inside of the material. Accordingly, it is desirable that a cooling mechanism for circulating a cooling medium, a heat-absorbing mechanism such as a Peltier element, or a heat-discharging mechanism such as a heat pipe is provided to vertically interpose the bent type rod-shaped optical member 56 thereby so that the temperature of the bent type rod-shaped optical member 56 is controlled. Accordingly, it is possible to avoid the heat generation of the bent type rod-shaped optical member 56.

Figure 12A:
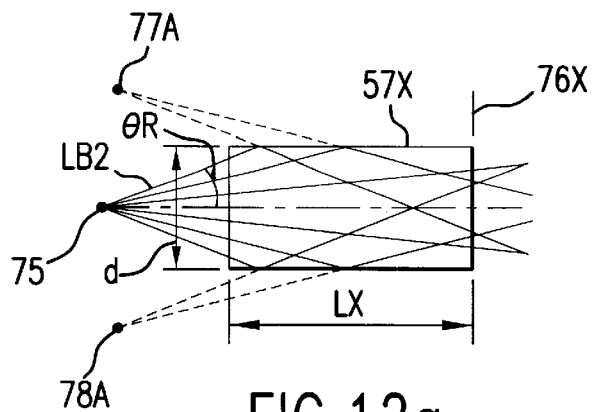
FIG. 12 illustrates an arrangement and function of a bent type rod-shaped optical member 56 shown in FIG. 11.

On the other hand, FIG. 12(*a*) shows a rod member 57X having a length LX with an oblong cross-sectional configuration in which the width of one side is d. FIG. 12(*b*) shows a rod member 57Y having a length LY (LY is fairly longer than LX) with an oblong cross-sectional configuration in which the width of one side is d. The former rod member 57X corresponds to the conventional rod integrator. It is assumed that the laser beam LB2 having an angular aperture θR (aperture half angle) comes from a light-collecting point 75 respectively into substantially entire surfaces of the light-incoming planes of the rod members 57X, 57Y. Further, it is assumed that the length LX is shorter than d/tanθR, and the length LY is longer than d/tanθR and shorter than 2·d/tanθR as follows.

$$0 < LX < d/\tan\theta R \quad (11A)$$

$$d/\tan\theta R < LY < 2 \cdot d/\tan\theta R \quad (11B)$$

In this case, as shown in FIG. 12(*a*), two light source images (secondary light sources) 77A, 78A are formed as virtual images over and under the light-collecting point 75 in accordance with the reflection effected by the rod member 57X. The light-outgoing plane 76X of the rod member 57X, i.e., the plane conjugate with the reticle is illuminated in a superimposed manner with laser beams coming from the three light source images. On the other hand, as shown in FIG. 12(*b*), four light source images 77A, 77B, 78A, 78B are formed as virtual images over and under the light-collecting point 76 in accordance with the reflection effected by the rod member 57Y. The light-outgoing plane 76Y of the rod member 57Y is illuminated in a superimposed manner with laser beams coming from the five light source images. As a result, if the length LY of the rod member 57Y is set as follows with an integer m of not less than 2, the light-outgoing plane 76Y is illuminated in a superimposed manner with (2·m+1) individuals of light source images. It is appreciated that the number of individuals of superimposed light source images is increased as the length LY is lengthened, and thus the uniformity of the illuminance distribution is improved owing to the integration effect.

$$(m-1)d/\tan\theta R < LY < m \cdot d/\tan\theta R \qquad (12)$$

Figure 12B:
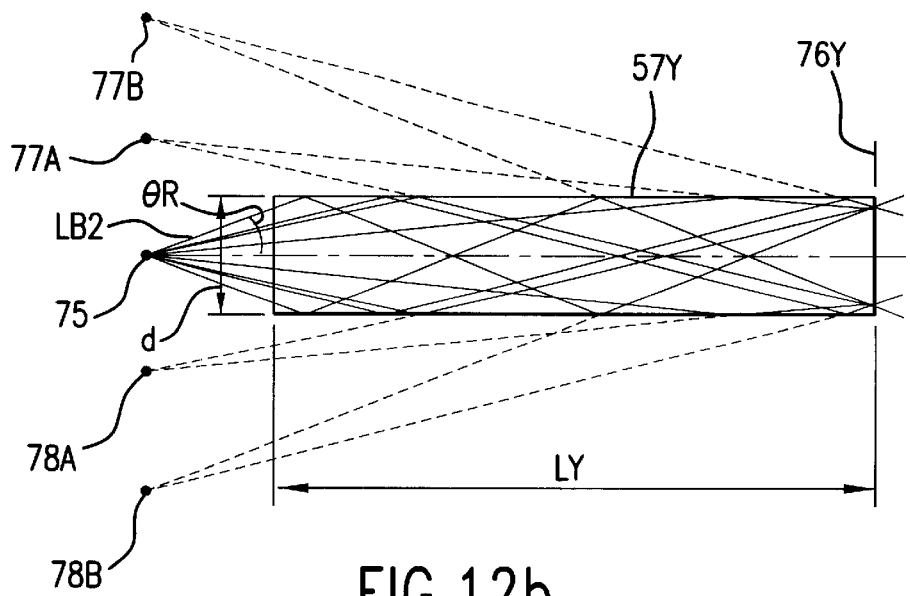
Figure 12C:
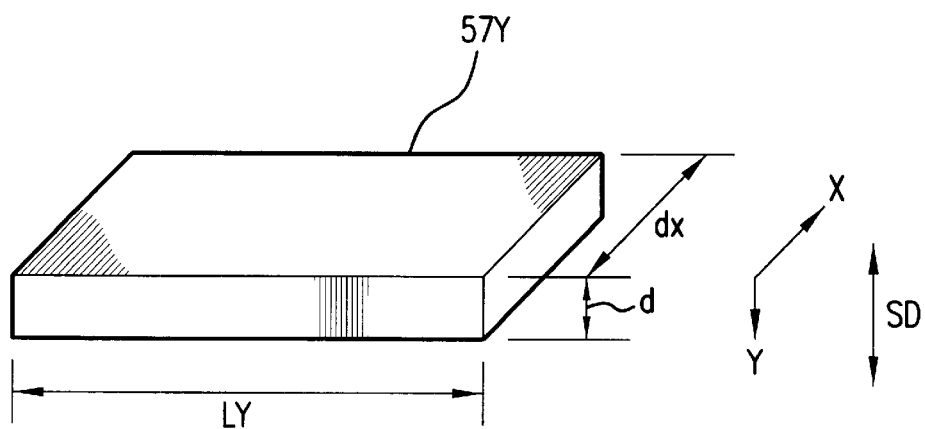

The formation of the (2·m+1) individuals of light source images can be also regarded to be equivalent to the fact that the number of wave front division is (2·m+1). The sum of the lengths of the rod members 57A to 57G of the bent type rod-shaped optical member 56 of this embodiment shown in FIG. 11 corresponds to one obtained in a case in which the length LY of the rod member 57Y shown in FIG. 12(b) is allowed to have such a length that the value of the integer m in the expression (12) is set, for example, to be about 10 to 50, and the number of wave front division is set to be about 20 to 100. However, the reticle in this embodiment is illuminated with the oblong illumination area. Therefore, as shown in FIG. 12(c), the cross-sectional configuration of the rod member 57Y is an oblong configuration in which the length in the direction (Y direction) corresponding to the scanning direction SD is d, and the length dX in the direction (non-scanning direction: X direction) perpendicular to the scanning direction is, for example, several times the length d. This relationship also holds for the rod members 57A to 57G shown in FIG. 11 in the same manner as described above. As a result, the number of wave front division in the non-scanning direction is lowered to a fraction of that in the scanning direction. In order to avoid such a situation, for example, the angular aperture of the incoming laser beam LB2 in the non-scanning direction may be increased according to the expression (2).

As described above, if the number of wave front division is merely increased, then the length of the rod member is long, and the illumination optical system is large-sized. Accordingly, the bent type rod-shaped optical member 56 shown in FIG. 11 adopts the arrangement in which one long rod member is bent by 90° at six positions respectively. As a result, the illumination optical system of this embodiment can be miniaturized. Further, it is possible to increase the number of wave front division, and it is possible to improve the uniformity of the illuminance distribution when the reticle R is illuminated.

Further, the widths d1 to d7 in the bending directions of the rod members 57A to 57G of the bent type rod-shaped optical member 56 shown in FIG. 11 are set to be gradually widened from the light-incoming side to the light-outgoing side as follows.

$$d1 < d2 < d3 < d4 < d5 < d6 < d7 \qquad (13)$$

Figure 13A:
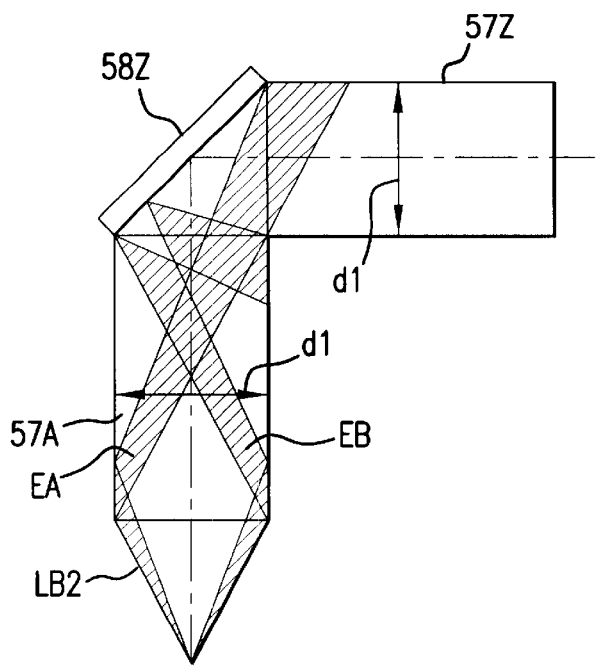
FIG. 13 illustrates an effect obtained by gradually widening the widths in the bending direction of two adjacent rod members of the bent type rod-shaped optical member 56 shown in FIG. 11.
Figure 13B:
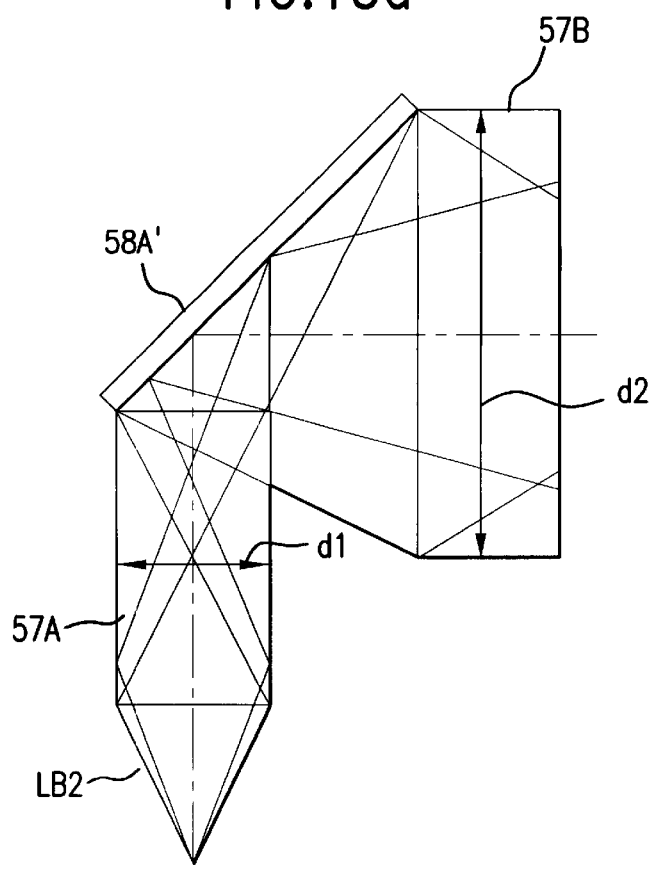

The reason of this arrangement will be explained. At first, as shown in FIG. 13(a), if it is assumed that a rod member 57Z having the same width d1 is arranged for the first stage rod member 57A having the width d1 with a mirror 58Z intervening therebetween, hatched portions EA, EB of the laser beam LB2 coming into the rod member 57A fail to arrive at the rod member 57Z due to the shading or eclipse in some cases. In other cases, the hatched portions EA, EB are transmitted to the outside when the total reflection is utilized, because the angle of incidence into the side surface is small. As a result, the light amount loss is increased. On the contrary, as shown in FIG. 13(b), when the rod member 57B having the width d2 (>d1) is arranged for the first stage rod member 57A with a large mirror 58A' intervening therebetween, most of the laser beam LB2 coming into the rod member 57A is transmitted to the rod member 57B as it is. Therefore, an advantage is obtained such that the light amount loss is decreased. Further, in the case of the bent type rod-shaped optical member 56 shown in FIG. 11, the prism type mirror member 58A, which is adjusted to the size of the next stage rod member 57B, is used in place of the mirror 58A' shown in FIG. 13(b). Therefore, the adjoining rod members 57A, 57B can be stably fixed, and the light amount loss is further decreased. The other mirror members 58B to 58F are also arranged in this way in the same manner as described above. In this arrangement, for example, the mirror member 58A and the rod member 57B may be integrated into one unit, and the following mirror members and the rod members may be also successively integrated into one unit in the same manner as described above. Accordingly, it is easy to assemble and adjust the bent type rod-shaped optical member 56.

The number of individuals of the rod members 57A to 57G for constructing the bent type rod-shaped optical member 56 is arbitrary provided that the number of individuals is not less than two. Alternatively, the bent type rod-shaped optical member 56 may be constructed by combining a plurality of mirrors so that the optical path of the laser beam is covered therewith, without using any refracting member. In this case, a high transmittance is obtained by purging the interior with a so-called inert gas having a high transmittance with respect to the laser beam in the ultraviolet region such as nitrogen gas or rare gas (for example, helium gas), or by allowing the interior to be in vacuum. This arrangement is especially effective when the laser beam has a short wavelength as in the $Ar_2$ laser (wavelength: 126 nm). When the wavelength (exposure wavelength) of the laser beam is not less than about 200 nm, for example, the interior may be purged with dry air. When the interior is allowed to be in vacuum, the extreme ultraviolet light beam (EUV light beam) such as soft X-ray can be also used as the exposure light beam.

Next, explanation will be made for an example of the operation for controlling the exposure amount of the projection exposure apparatus of this embodiment. With reference to FIG. 10, in this embodiment, the uneven illuminance sensor 2 is moved to the front side in the scanning direction (Y direction) with respect to the slit-shaped exposure area of the projection optical system 3 in a state in which a see-through test reticle formed with no transfer pattern is arranged beforehand in place of the reticle R before the exposure. Test light emission is performed by the exposure light source 9, and the light-receiving section 2a of the uneven illuminance sensor 2 is moved at a predetermined pitch to traverse the exposure area in the scanning direction as shown in FIG. 16(b). During this process, for example, the uneven illuminance sensor 2 receives the illumination light beam IU of several tens pulses every time when the uneven illuminance sensor 2 is moved at the predetermined pitch to supply a photoelectrically converted signal to the main control system 13. The main control system 13 allots an average value of the photoelectrically converted signals as the illuminance Pi (i=1, 2, 3, . . . ) for a series of measuring points at the predetermined pitch.

Figure 15A:
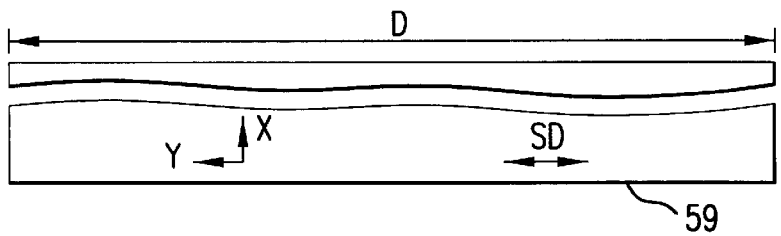
FIG. 15 illustrates the relationship between the pitch Q1 of the illuminance distribution in an exposure area on a wafer and the distance of movement of the wafer obtained every time when an exposure light beam is subjected to pulse light emission.
Figure 15B:
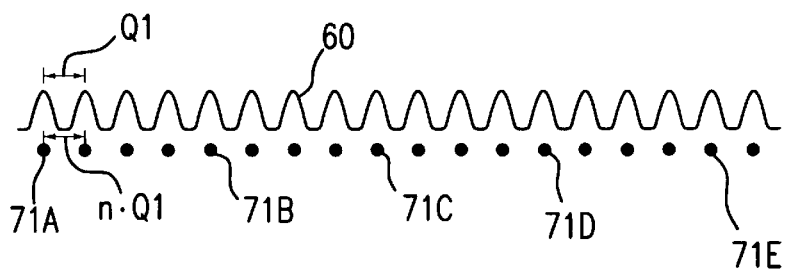
Figure 15C:
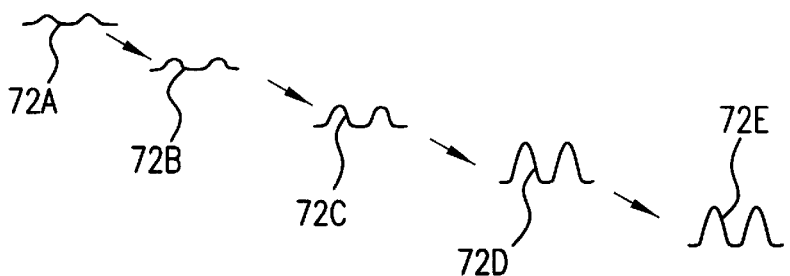
Figure 16A:
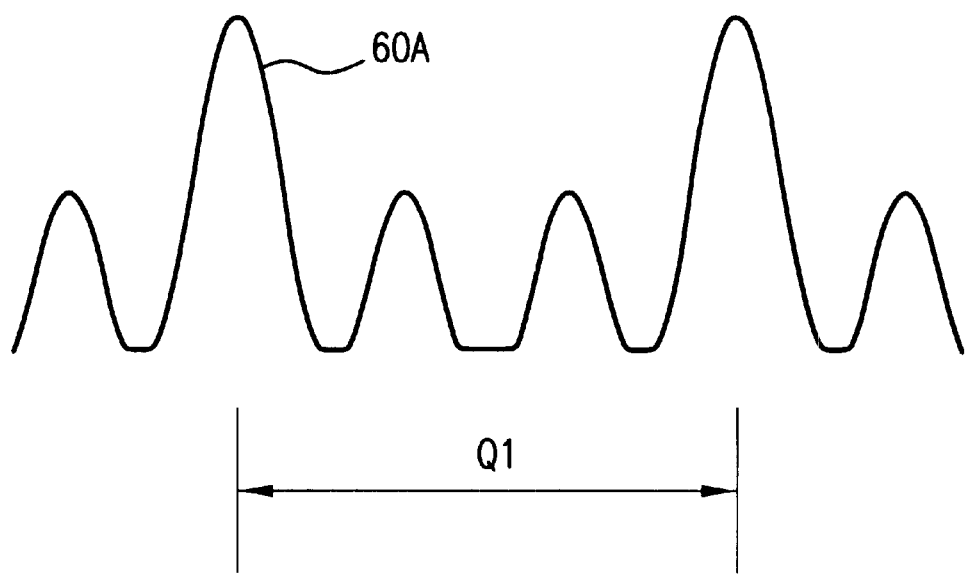
FIG. 16 illustrates the operation effected to measure the pitch Q1 of the illuminance distribution of the exposure area by using an uneven illuminance sensor 2.
Figure 16B:
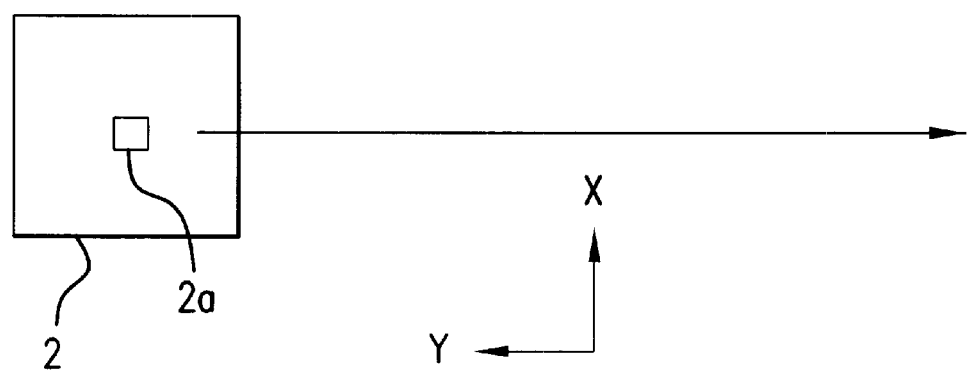

A curve 60A shown in FIG. 16(a) illustrates an example of the illuminance distribution in the scanning direction of the exposure area obtained as described above. In FIG. 16(a), the curve 60A is actually an aggregate of digital data of the predetermined pitch. After that, the main control system 13 effects Fourier transformation (for example, FFT) for the curve 60A to determine a pitch Q1 in the scanning direction (Y direction) of the spatial frequency component having the largest amplitude. The pitch Q1 is stored in the storage unit 13a. In this embodiment, the uniformity of the illuminance distribution is considerably improved on the reticle R and the wafer W, owing to the use of the bent type rod-shaped optical member 56 and the modified illumination mechanism 19 shown in FIG. 11. Therefore, the pitch Q1 can be also regarded as the pitch of the remaining interference fringes (speckles). That is, assuming that the slit-shaped exposure area on the wafer W shown in FIG. 10 is the exposure area 59 having the width (slit width) D in the scanning direction SD (Y direction) as shown in FIG. 15(a), the illuminance distribution in the scanning direction of the illumination light beam (exposure light beam) on the exposure area 59 is periodically fluctuated at the pitch Q in average as shown by a curve 60 in FIG. 15(b), even when the transmittance distribution of the reticle is uniform. It is assumed that the pulse light emission of the illumination light beam IU is performed every time when the wafer W is moved by an integral multiple n·Q1 (n=1 in FIG. 15(a)) of the pitch Q1 in the Y direction as indicated by light emission positions 71A, . . . , 71B, . . . in FIG. 15(b) during the scanning exposure in this state. On this assumption, the totalized exposure amount on the wafer W is gradually changed to a periodic distribution having intense contrast as indicated by exposure amount distribution curves 72A, 72B, . . . , 72E in FIG. 15(c). As a result, the unevenness of the exposure amount is generated.

Figure 15D:
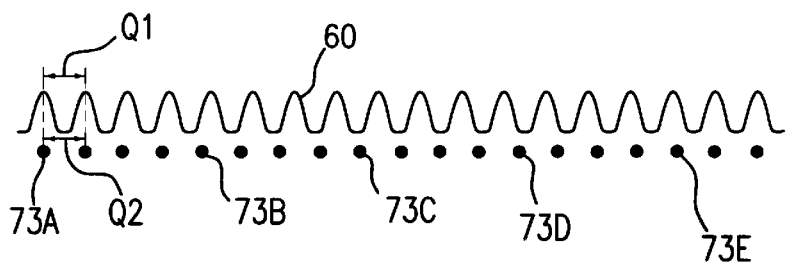

Accordingly, in this embodiment, the distance Q2, by which the wafer W is moved in the Y direction every time when the pulse light emission of the illumination light beam IU is performed, is set to be in a relationship of non-integral multiple as indicated by light emission positions 73A, . . . , 73B, . . . with respect to the pitch Q1 of the illuminance distribution represented by a curve 60 during the scanning exposure as shown in FIG. 15(d). This means the fact that n·Q1 is not coincident with Q2 even when an arbitrary integer n is used as in the following expression.

$$Q2 \neq n \cdot Q1 \quad (14)$$

Figure 15E:
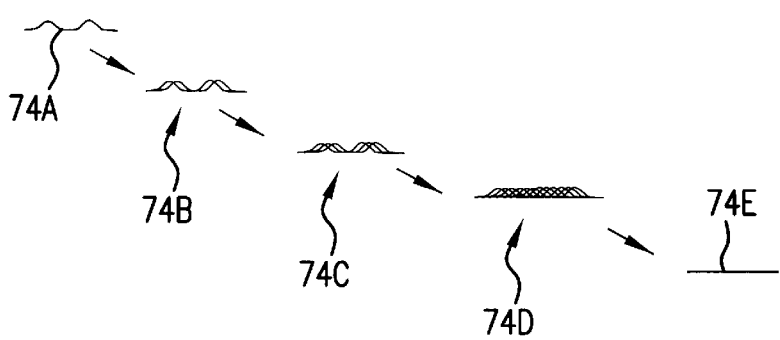

As a result, the totalized exposure amount on the wafer W is gradually changed to a flat distribution as indicated by exposure amount distribution curves 74A, 74B, . . . , 74E in FIG. 15(e). The unevenness of the illuminance distribution of the illumination light beam IU itself is not converted into the unevenness of the totalized exposure amount. Therefore, it is possible to improve the uniformity of the totalized exposure amount distribution in each of the shot areas on the wafer W after the scanning exposure.

In order to specifically explain the method for setting respective parameters during the scanning exposure, it is assumed that E [j/mm²] represents the resist sensitivity (proper exposure amount) on the wafer W shown in FIG. 10, and p [j/mm²] represents the average pulse energy on the wafer W. On this assumption, it is necessary that the following relationship holds within a predetermined allowable range by using the number of exposure pulses N ($\geq N_{min}$).

$$E = N \cdot P \quad (15)$$

It is assumed that D [mm] represents the slit width of the exposure area on the wafer W, V [mm/s] represents the scanning velocity of the wafer stage 1, $V_{max}$ represents the upper limit of the scanning velocity V, f [/s] represents the oscillation frequency of the laser beam LB at the exposure light source 9, and $f_{max}$ represents the upper limit of the oscillation frequency f. On this assumption, the distance Q2 [mm] by which the wafer W is moved every time when the pulse light emission is performed as shown in FIG. 15(d), and the number of exposure pulses N are represented by the following expressions.

$$Q2 = V/f \neq n \cdot Q1 \quad (16)$$

$$N = f \cdot (D/V) \geq N_{min} \quad (17)$$

If the expression (15) is substituted with the expression (17), the following expression is obtained.

$$E \cdot V = f \cdot P \cdot D \quad (18)$$

Assuming that the slit width D is fixed, the main control system 13 sets the scanning velocity V to the upper limit value $V_{max}$ in order to enhance the throughput, and it calculates the oscillation frequency f in accordance with the expression (18) as follows.

$$V = V_{max}, f = E \cdot V/(P \cdot D) \quad (19)$$

The main control system 13 compares the resultant oscillation frequency f with the upper limit value $f_{max}$. Further, the main control system 13 compares the distance Q2 (=V/f) in the expression (16) with the pitch Q1 stored in the storage unit 13a. If the oscillation frequency f exceeds the upper limit value $f_{max}$, or if Q2 in the expression (16) equals to n·Q1 within a predetermined allowable range, then the main control system 13 sets the scanning velocity V, for example, to a value which is smaller than the upper limit value $V_{max}$ by predetermined ΔV to calculate the oscillation frequency f again from the second expression of the expression (19). The oscillation frequency f is calculated again by gradually decreasing the scanning velocity V by ΔV until the oscillation frequency f obtained as described above is not more than the upper limit value $f_{max}$, and Q2≠n·Q1 in the expression (16) holds while exceeding the predetermined allowable range. Accordingly, the expression (16) finally holds, and the values of the oscillation frequency f and the scanning velocity V are determined as values within the upper limit values. The oscillation frequency f is set in the illumination control system 10.

Corresponding thereto, the illumination control system 10 sets the oscillation frequency f of the laser beam LB for the laser power source 17 shown in FIG. 11. The main control system 13 sets the scanning velocity V of the wafer W (scanning velocity of the reticle is V/β) for the wafer stage control system 11 and the reticle stage control system 12 to start the scanning exposure. Accordingly, the respective shot areas on the wafer W are exposed by transfer with the image of the pattern on the reticle R respectively. During the scanning exposure, the totalized exposure amount for each of the shot areas on the wafer W is indirectly measured by the aid of an unillustrated integrator sensor. The output of the pulse light from the exposure light source 9 is finely adjusted on the basis of the measured value.

As described above, in this embodiment, the bent type rod-shaped optical member 56 is arranged in the illumination system 8. Therefore, even when the coherence (spatial coherence) of the laser beam LB2 as the exposure light beam is high, the uniformity of the illuminance distribution is improved in the illumination area on the reticle R and consequently on the exposure area on the wafer W. Further, even when the interference fringes (for example, speckles) remain in the illumination area, the unevenness of the totalized exposure amount after the scanning exposure is extremely decreased by satisfying the condition represented by the expression (16). It is possible to obtain high line width uniformity. Further, the influence of interference fringes can be reduced. Accordingly, it is possible to decrease the number of pulse light emission necessary to perform the exposure once. It is also possible to expect the improvement in throughput brought about by the reduction of the exposure time.

Further, it is possible to realize, for example, the ordinary illumination, the annular illumination, and the small a value illumination with the small space while the light amount loss scarcely occurs. Therefore, it is also possible to improve the throughput for the layer in which the resist sensitivity is low. On the other hand, when it is enough to use the same degree of exposure time as that of the exemplary conventional technique, the upper limit (rating) of the output of the exposure light source 9 can be set to be low. Accordingly, it is also possible to realize the decrease in cost of the projection exposure apparatus and the long service life of the exposure light source 9 itself.

Next, explanation will be made with reference to FIG. 14 for other illustrative arrangements of the bent type rod-shaped optical member 56 of the embodiment described above.

Figure 14A:
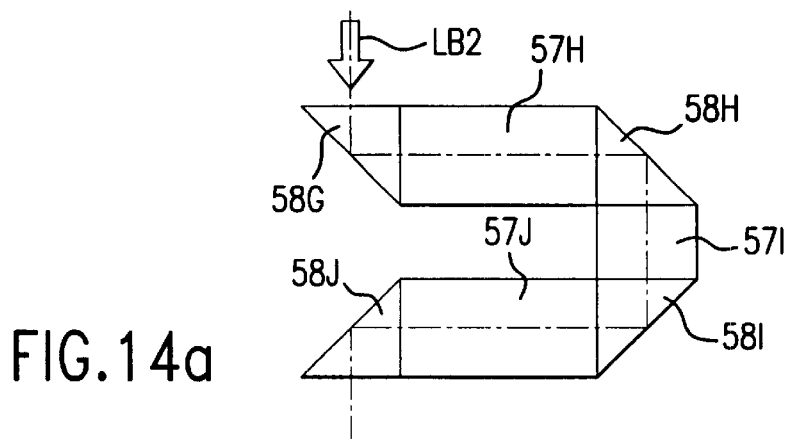
FIG. 14 shows another illustrative arrangement of the bent type rod-shaped optical member 56.

An illustrative arrangement shown in FIG. 14(a) comprises four mirror members and three rod members. A mirror member 58G for bending the optical path by 90° in shaped (like a shape of staple) configuration, a rod member 57H, a mirror member 58H, a rod member 57I, a mirror member 58I, a rod member 57J, and a mirror member 58J are arranged in this order from the light-incoming side of the laser beam LB2.

Figure 14B:
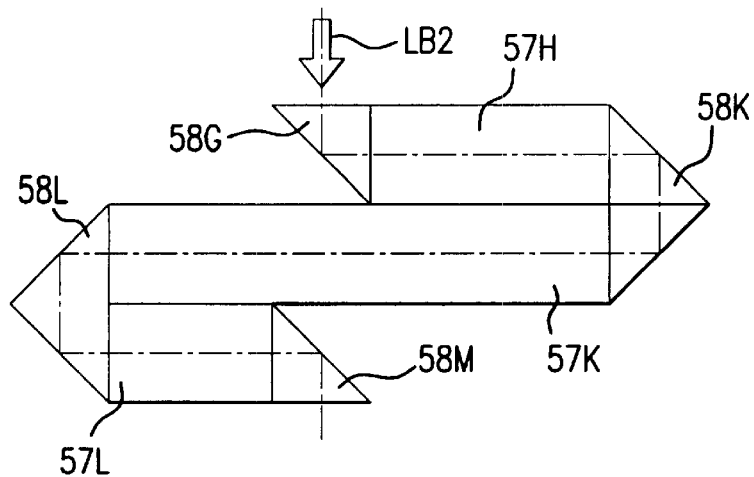

An illustrative arrangement shown in FIG. 14(b) also comprises four mirror members and three rod members. A mirror member 58G, a rod member 57H, a mirror member 58K for bending the optical path by 180°, a rod member 57K, a mirror member 58L for bending the optical path by 180°, a rod member 57L, and a mirror member 58M are arranged in a substantially "S-shaped" configuration in this order from the light-incoming side of the laser beam LB2.

Figure 14C:
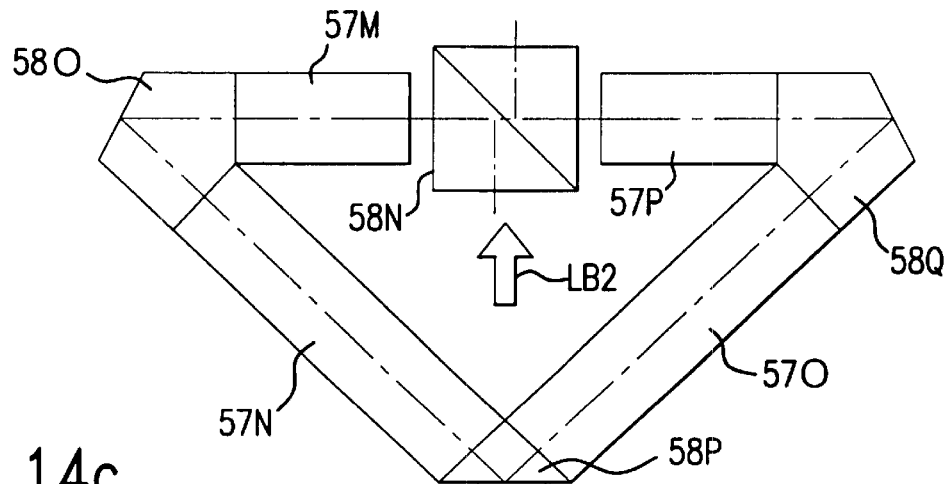

In an illustrative arrangement shown in FIG. 14(c), the laser beam LB2 (linearly polarized light beam in this case) is introduced into a loop-shaped optical path by the aid of a polarizing beam splitter 58N. The laser beam LB2, which has passed through the loop-shaped optical path, is extracted by the aid of a polarizing beam splitter 85N. Actually, the polarizing beam splitter 58N is arranged in a state of being rotated by 90° about the optical axis. In this case, the laser beam LB2 is radiated and extracted in the direction perpendicular to the plane of paper of FIG. 14(c), without being affected by the loop-shaped optical path. The loop-shaped optical path comprises a rod member 57M, a mirror member 58O for bending the optical path by substantially 60°, a rod member 57N, a mirror member 58P for bending the optical path by substantially 120°, a rod member 57O, a mirror member 58Q, and a rod member 57P which are arranged in this order from the light-incoming side.

Also in the respective illustrative embodiments shown in FIG. 14, it is possible to decrease the light amount loss by gradually widening the widths of the series of rod members in the bending direction. When the bent type rod-shaped optical member 56 is constructed by bending and arranging three or more rod members (by bending the optical member 56 at three or more positions) as in the respective illustrative embodiments shown in FIG. 14, it is possible to especially miniaturize the illumination optical system on condition that the necessary uniformity of the illuminance distribution is obtained.

As described above, in this embodiment, the exposure method based on the use of the KrF excimer laser has been explained. However, the bent type rod-shaped optical member 56 will be also effective when the laser beam having coherence and having a shorter wavelength will be used as the exposure light beam in future, including, for example, the ArF excimer laser (193 nm), the $F_2$ laser (157 nm), the $Ar_2$ laser beam (wavelength: 126 nm), the high harmonic wave of the YAG laser, and the high harmonic wave of the semiconductor laser. However, when the laser beam in the vacuum ultraviolet region is used as described above, it is feared that the bent type rod-shaped optical member 56 is damaged due to any concentration of energy, or any cloudy substance, which is formed by the chemical reaction between the laser beam and any minute organic substance or the like with which the atmosphere is contaminated, adheres to the light-incoming/outgoing plane of the bent type rod-shaped optical member 56.

Accordingly, the rod member 57A on the light-incoming side and the rod member 57G on the light-outgoing side of the bent type rod-shaped optical member 56 shown in FIG. 11 may be exchangeable. Alternatively, a transparent cover may be provided so that the light-incoming/outgoing plane is covered therewith in order to avoid any adhesion of the cloudy substance. The interior of the cover may be purged with a gas (for example, an inert gas as described above) which is clear and which has a high transmittance with respect to the laser beam. In order to avoid any generation of organic matter or the like, it is desirable that the plurality of optical members (for example, rod members) for constructing the bent type rod-shaped optical member 56 are held in an integrated manner with a holding tool the like, without using the adhesive or the filler. Further, the generation of organic matter or the like can be avoided by coating, for example, the inside of the cover, for example, with Teflon.

In the illustrative arrangement shown in FIG. 11, the diaphragm-switching member 27, which serves as the aperture diaphragm (a diaphragm) of the illumination system, is arranged on the light-outgoing plane of the modified illumination mechanism 19. However, the diaphragm-switching member 27 may be arranged, for example, on the pupil plane (Fourier transformation plane with respect to the pattern plane of the reticle R) between the relay lens system 31 and the condenser lens system 7.

In order to further reduce the interference fringes, in the illustrative arrangement shown in FIG. 11, for example, the mirror 55 may be vibrated to slightly periodically vary the angle of incidence of the laser beam LB2 coming into the bent type rod-shaped optical member 56.

Further, the direction, in which the coherence of the laser beam LB2 is high, may be allowed to make intersection with the non-scanning direction which is perpendicular to the scanning direction for the reticle R. For example, the direction, in which the coherence is high, may be made substantially coincident with the scanning direction. By doing so, the influence of the speckle may be reduced by means of the averaging effect brought about by the scanning exposure. In this arrangement, as for the non-scanning direction, if necessary, the mirror 55 may be vibrated (or a vibrating mirror may be used) as described above in relation to the non-scanning direction to uniformize the uneven illuminance (uneven exposure amount). Besides this method, the direction, in which the coherence of the laser beam LB2 is high, may be made coincident with the non-scanning direction to uniformize the uneven illuminance (uneven exposure amount) in relation to the non-scanning direction by using an illuminance-uniformizing means such as the vibrating mirror or a dispersing plate or the like.

Next, the exposure apparatus according to the first embodiment can be produced such that the projection optical system and the illumination optical system constructed by the optical members such as the delay optical system 22 shown in FIG. 2 are assembled to a main exposure apparatus body to perform optical adjustment, the reticle stage and the wafer stage composed of a large number of mechanical parts are attached to the main exposure apparatus body to connect wirings and pipings, and overall adjustment (for example, electric adjustment and confirmation of operation) is performed. It is desirable that the exposure apparatus is produced in a clean room in which, for example, the temperature and the cleanness are managed. The exposure apparatus according to the second embodiment can be produced in the same manner as described above.

A semiconductor device is produced, for example, by performing a step of designing the function and the performance of the device, a step of producing a reticle based on the foregoing step, a step of producing a wafer from a silicon material, a step of exposing a wafer with a pattern on a reticle by using each of the projection exposure apparatuses of the embodiments described above, a step of assembling the device (including a dicing step, a bonding step, and a packaging step), and an inspection step.

In the embodiments described above, the present invention is applied to the scanning exposure type projection exposure apparatus based on the use of the pulse light beam. However, it is clear that the present invention is also applicable to a scanning exposure type projection exposure apparatus which uses a continuous light beam as an exposure light beam, and a full field exposure type projection exposure apparatus such as a stepper which uses a continuous light beam or a pulse light beam, and the present invention is also applicable to an illumination optical system, for example, for an exposure apparatus of the proximity system in which no projection optical system is used. Further, an illumination optical system is constructed by only a reflecting optical element in some cases depending on the wavelength of the exposure light beam. However, the present invention is also applicable to such an illumination optical system.

Further, the exposure apparatus of the present invention is not limited to the exposure apparatus for producing semiconductors, which is also widely applicable, for example, to an exposure apparatus for producing a liquid crystal in which an angular type glass plate is exposed with a liquid crystal display element pattern, an exposure apparatus for producing a plasma display element, an exposure apparatus for producing, for example, a micromachine, a thin film magnetic head, and an image pickup element (CCD or the like), and an exposure apparatus for producing a mask itself on which a device pattern is drawn in accordance with the transfer system.

In place of the excimer laser or the like, it is also preferable to use, as an exposure light beam, a high harmonic wave which is obtained such that a single wavelength laser in the infrared region or the visible region, which is oscillated from a DFB (Distributed feedback) semiconductor laser or a fiber laser, is amplified with a fiber amplifier doped with, for example, erbium (Er) (or both of erbium and ytterbium (Yb)), followed by performing wavelength conversion into an ultraviolet light beam by using a nonlinear optical crystal. For example, assuming that the oscillation wavelength of the single wavelength laser is within a range of 1.544 to 1.553 µm, an 8-fold high harmonic wave within a range of 193 to 194 nm, i.e., an ultraviolet light beam having approximately the same wavelength as that of the ArF excimer laser is obtained. Assuming that the oscillation wavelength is within a range of 1.57 to 1.58 µm, a 10-fold high harmonic wave within a range of 157 to 158 nm, i.e., an ultraviolet light beam having approximately the same wavelength as that of the $F_2$ laser is obtained.

Accordingly, the present invention is not limited to the embodiments described above, which may be embodied in other various forms within a range without deviating from the gist or essential characteristics of the present invention. All of the contents of disclosure of Japanese Patent Application No. 11-137840 filed on May 18, 1999, Japanese Patent Application No. 11-324748 filed on Nov. 15, 1999, and Japanese Patent Application No. 11-358204 filed on Dec. 16, 1999 including specifications, claims, drawings, and abstracts are quoted as they are and incorporated into this application.

INDUSTRIAL APPLICABILITY

According to the first exposure method and the first illuminating apparatus of the present invention, the light fluxes are allowed to pass through the substantially closed loop-shaped optical path, and the plurality of light fluxes, which have passed through the loop-shaped optical path a variety of numbers of times depending on the angular apertures respectively, are superimposed. Accordingly, the temporal coherence of the light flux is greatly lowered. Therefore, even when the illumination light beam (exposure light beam) having high coherence is used, it is possible to obtain a substantially uniform illuminance distribution on a pattern of a transfer objective, without complicating and large-sizing the illumination optical system so much and without prolonging the illumination time (exposure time).

According to the first and second exposure apparatuses of the present invention, the unevenness of the exposure amount scarcely occurs even when the illuminance of the exposure light beam is increased. Therefore, it is possible to mass-produce a device having a high function with a high throughput.

Even when the illumination system is switched into the ordinary illumination, the illumination with the small σ value, or the modified illumination (annular illumination) in a state in which the light amount loss of the exposure light beam is decreased, the interference fringes are scarcely generated. Therefore, it is possible to perform the exposure at a high throughput even for a layer having low resist sensitivity. Further, when it is enough that the illuminance is at the same degree as that used in the conventional technique, it is possible to set the low output specification for the laser light source as the exposure light source. Therefore, it is possible to realize the low cost and the long service life of the laser light source.

On the other hand, according to the second exposure method of the present invention, the optical path for the exposure light beam (illumination light beam) is bent. Therefore, even when the exposure light beam having high coherence is used, it is possible to improve the uniformity of the illuminance distribution on a pattern of a transfer objective without large-sizing the illumination optical system so much and without prolonging the illumination time (exposure time).

According to the third exposure method of the present invention, when the scanning exposure is performed with the pulse light beam, the timing for the pulse light emission is controlled to be in a predetermined state. Therefore, even when the exposure light beam having high coherence is used, it is possible to improve the uniformity of the totalized exposure amount distribution after the exposure without large-sizing the illumination optical system so much and without prolonging the illumination time (exposure time).

According to the second illuminating apparatus, the third and fourth exposure apparatus, and the fifth exposure apparatus of the present invention, it is possible to carry out the corresponding exposure methods of the present invention respectively. Further, the unevenness of the exposure amount is decreased, even when the illuminance of the exposure light beam (illumination light beam) is increased. Therefore, it is possible to mass-produce a device having a high function at a high throughput. Further, when it is enough that the illuminance is at the same degree as that used in the conventional technique, it is possible to set the low output specification for the laser light source as the exposure light source. Therefore, it is possible to realize the low cost and the long service life of the laser light source.

What is claimed is:

1. An exposure method for illuminating a first object with an exposure light beam to transfer a pattern on the first object onto a second object, the exposure method comprising:

adjusting the exposure light beam into light fluxes having a predetermined angular aperture distribution, and allowing the adjusted light fluxes to pass through a substantially closed loop-shaped optical path so that a plurality of light fluxes, which have passed through the loop-shaped optical path a variety of numbers of times depending on angular apertures respectively, are superimposed and guided to the first object.

2. A method for producing a device, comprising the step of transferring a device pattern onto an object by using the exposure method as defined in claim 1.

3. The exposure method according to claim 1, wherein the adjusted light fluxes are collected so that a light-collecting point of the adjusted light fluxes is positioned on a plane which is different from a light-incoming plane of an optical member which defines the loop-shaped optical path.

4. The exposure method according to claim 3, wherein the plurality of light fluxes are radiated from the optical member through a window which is smaller than a cross-sectional area of the transmitting section of the optical member in which the adjusted light fluxes are internally reflected.

5. An illuminating apparatus for illuminating a pattern on an illumination objective with an illumination light beam from a light source, the illuminating apparatus comprising:

an optical member including a window which receives the illumination light beam from the light source, wherein a plurality of light fluxes, which are obtained by allowing light fluxes incoming from the window to pass through the optical member a variety of numbers of times depending on angular apertures respectively, are superimposed and radiated toward the illumination objective.

6. The illuminating apparatus according to claim 5, wherein:

an angular aperture-adjusting optical system which adjusts the illumination light beam from the light source into light fluxes having a predetermined angular aperture distribution is arranged between the light source and the optical member; and a multiple light source-forming optical system which forms a plurality of light source images from the illumination light beam from the optical member, and a condenser optical system which radiates light fluxes from the plurality of light source images onto the illumination objective in a superimposed manner are arranged between the optical member and the illumination objective.

7. The illuminating apparatus according to claim 5, wherein the window is arranged at a position which is eccentric from a central axis of the optical member.

8. The illuminating apparatus according to claim 5, wherein the optical member includes one or a plurality of outer surface reflection type member or members arranged in a ring-shaped configuration, the outer surface reflection type member having an outer circumferential surface which serves as a reflecting surface for allowing the illumination light beam to pass through an interior thereof.

9. The illuminating apparatus according to claim 5, wherein the optical member includes a plurality of prism-shaped transmitting members successively arranged in a ring-shaped configuration together with intervening reflecting surfaces, the transmitting members having respective outer circumferential surfaces which serve as reflecting surfaces for allowing the illumination light beam to pass through an interior thereof.

10. The illuminating apparatus according to claim 9, wherein:

the window of the optical member is an aperture which is formed at a part of the reflecting surface at a boundary of the transmitting member; and the illumination light beam, which has passed through the optical member, is radiated through the aperture.

11. The illuminating apparatus according to claim 9, wherein:

the window of the optical member is one surface of a prism member formed at a part of the reflecting surface at a boundary of the transmitting member; and the illumination light beam, which has passed through the optical member, is radiated through another surface of the prism member.

12. The illuminating apparatus according to claim 9, wherein the window of the optical member is a reflecting section which is formed at the inside of the transmitting member.

13. An exposure apparatus which transfers a pattern on a first object onto a second object, wherein the pattern on the first object is illuminated with an illumination light beam from the illuminating apparatus as defined in claim 5.

14. The exposure apparatus according to claim 13, wherein the illuminating apparatus includes an optical unit which branches the illumination light beam from the light source into a plurality of individuals to generate a plurality of light fluxes having mutually different intensity distributions and which combines the plurality of light fluxes to effect radiation, the optical unit being arranged between the light source and the optical member in order to change an illumination condition for the first object.

15. The exposure apparatus according to claim 13, wherein the illuminating apparatus comprises a light-collecting optical element which collects the illumination light beam incoming to the optical member so that a light-collecting point of the illumination light beam is positioned on a plane which is different from a light-incoming plane of the optical member.

16. The exposure apparatus according to claim 15, wherein the optical member has a window which is smaller than a cross-sectional area of the transmitting section in which the light fluxes incoming from the window are internally reflected, and the plurality of light fluxes are radiated from the optical member through the window.

17. An exposure apparatus provided with an illumination system which illuminates a first object with an exposure light beam in which a second object is exposed with the exposure light beam via the first object, the exposure apparatus comprising:

an optical member which includes a transmitting section which internally reflects the exposure light beam in the illumination system and changes a traveling direction thereof, wherein:

the optical member is formed with an aperture which is smaller than a cross-sectional area of the transmitting section in order to radiate the exposure light beam.

18. The exposure apparatus according to claim 17, wherein the illumination system includes an optical unit which is arranged between a light source which generates the exposure light beam and the optical member in order to change an illumination condition for the first object.

19. The exposure apparatus according to claim 18, wherein the optical unit branches the exposure light beam into a plurality of individuals to generate a plurality of beams having mutually different intensity distributions, and the optical unit combines the beams to effect radiation.

20. The exposure apparatus according to claim 18, wherein the optical unit exchanges a diffracting optical element which introduces the exposure light beam thereinto to generate a diffracted beam, with another diffracting optical element.

21. The exposure apparatus according to claim 17, wherein the optical member converts the exposure light beam into a plurality of light fluxes which pass through different apertures of the transmitting section, respectively.

22. The exposure apparatus according to claim 21, wherein the illumination system comprises a light-collecting optical element which collects the exposure light beam so that a light-collecting point of the exposure light beam is positioned on a plane which is different from a light-incoming plane of the optical member.

23. An exposure method for illuminating a first object with an exposure light beam to expose a second object with the exposure light beam having passed through a pattern on the first object, the exposure method comprising:
  introducing the exposure light beam into a plane which is substantially conjugate with a pattern plane of the first object via an open light-feeding optical path which is surrounded by reflecting surfaces and which has at least one bent section, and introducing, into the first object, the exposure light beam having passed through the plane.

24. The exposure method according to claim 23, wherein a width of the light-feeding optical path on a light-outgoing side is wider than a width of the light-feeding optical path on a light-incoming side in a bending direction brought about by the bent section.

25. The exposure method according to claim 24, wherein the exposure light beam is pulse emitted, and the second object is scanning-exposed with the exposure light beam having passed through the first object while synchronous movement of the first object and the second object, and a distance of movement of the second object in the scanning direction during one cycle of pulse light emission of the exposure light beam is set to be a non-integral multiple of a repeating pitch of an intensity distribution of the exposure light beam on the second object in the scanning direction.

26. A method for producing a device, comprising a step of transferring a device pattern onto an object by using the exposure method as defined in claim 23.

27. An exposure method for illuminating a first object with a pulse-emitted exposure light beam and synchronously moving the first object and a second object to perform scanning exposure for the second object with the exposure light beam having passed through a pattern on the first object, the exposure method comprising:
  previously measuring a repeating pitch of an intensity distribution of the exposure light beam on the second object in a scanning direction for the second object; and
  setting a distance of movement of the second object in the scanning direction during one cycle of pulse light emission of the exposure light beam to be a non-integral multiple of the measured pitch.

28. The exposure method according to claim 27, wherein the repeating pitch of the intensity distribution of the exposure light beam on the second object is a pitch of a spatial frequency component having a largest amplitude in the intensity distribution.

29. A method for producing a device, comprising a step of transferring a device pattern onto an object by using the exposure method as defined in claim 23.

30. An illuminating apparatus which illuminates a pattern on an illumination objective with an illumination light beam from a light source, the illuminating apparatus comprising:
  a multiple light source-forming optical system which includes a plurality of transmitting sections surrounded by reflecting surfaces respectively for allowing the illumination light beam to pass through an interior thereof, and one or a plurality of reflecting section or sections which bends an optical path for the illumination light beam at a boundary between the plurality of transmitting sections, in which the illumination light beam is incorporated at one transmitting section of the plurality of transmitting sections, and the illumination light beam is radiated from another transmitting section onto a plane that is substantially conjugate with a pattern plane of the first object; and
  a condenser optical system which collects, onto the pattern, the illumination light beam having passed through the substantially conjugate plane.

31. The illuminating apparatus according to claim 30, wherein an illuminance distribution-switching optical system, which switches an illuminance distribution of the illumination light beam from the light source into a first distribution that is enlarged in an area including an optical axis and a second distribution that is enlarged in an area apart from the optical axis, is arranged between the light source and the multiple light source-forming optical system.

32. An exposure apparatus comprising an illumination apparatus as defined in claim 31, which illuminates a first object as an illumination objective with an illumination light beam from the illuminatin apparatus, wherein:
  a second object is exposed with the illumination light beam having passed through a pattern on the first object.

33. An exposure apparatus comprising an illuminating apparatus as defined in claim 30 which illuminates a first object as an illumination objective with an illumination light beam from the illuminating apparatus, wherein:
  a second object is exposed with the illumination light beam having passed through a pattern on the first object.

34. The exposure apparatus according to claim 33, wherein the plurality of the transmitting sections comprises a first transmitting section and a second transmitting section into which the illumination light beam is income from the first transmitting section and a width of which is larger than that of the first transmitting section.

35. An exposure apparatus having an illumination system which illuminates a first object with an exposure light beam, for exposing a second object with the exposure light beam via the first object, the exposure apparatus comprising:

an optical member which includes a transmitting section which internally reflects the exposure light beam in the illumination system, wherein:

the transmitting section of the optical member is bent at least at one position, and a width of the transmitting section after being bent is larger than a width of the transmitting section before being bent.

36. The exposure apparatus according to claim 35, wherein the illumination system includes an optical unit which is arranged between a light source which generates the exposure light beam and the optical member in order to change an illumination condition for the first object.

37. An exposure apparatus which illuminates a first object with an exposure light beam from a pulse light source and synchronously moving the first object and a second object by a stage system to perform scanning exposure for the second object with the exposure light beam having passed through a pattern on the first object, the exposure apparatus comprising:

a storage unit which stores a repeating pitch of an intensity distribution of the exposure light beam on the second object in a scanning direction for the second object; and a control system which controls a light emission frequency of the pulse light source and a scanning velocity of the second object effected by the stage system depending on the stored pitch.

38. The exposure apparatus according to claim 37, further comprising an optical member which has a transmitting section which internally reflects the exposure light beam in an illumination system which illuminates the first object with the exposure light beam, and wherein the transmitting section of the optical member is bent at least at one position, and a width of the transmitting section after being bent is larger than a width of the transmitting section before being bent.

* * * * *